(12) United States Patent
Yang et al.

(10) Patent No.: US 10,804,289 B2
(45) Date of Patent: Oct. 13, 2020

(54) THREE-DIMENSIONAL SEMICONDUCTOR DEVICE

(71) Applicant: Samsung Electronics Co., Ltd., Suwon-si (KR)

(72) Inventors: Han Vit Yang, Suwon-si (KR); Yong Hoon Son, Yongin-si (KR); Moon Jong Kang, Yongin-si (KR); Hyuk Ho Kwon, Hwaseong-si (KR); Sung Soo Ahn, Hwaseong-si (KR); So Yoon Lee, Yongin-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 16/237,844

(22) Filed: Jan. 2, 2019

(65) Prior Publication Data

US 2020/0027893 A1     Jan. 23, 2020

(30) Foreign Application Priority Data

Jul. 17, 2018  (KR) .................. 10-2018-0082973

(51) Int. Cl.
*H01L 27/11582* (2017.01)
*H01L 27/11565* (2017.01)
(Continued)

(52) U.S. Cl.
CPC .. *H01L 27/11582* (2013.01); *H01L 21/76802* (2013.01); *H01L 21/76831* (2013.01);
(Continued)

(58) Field of Classification Search
CPC ......... H01L 27/11582; H01L 27/11565; H01L 27/11573; H01L 27/11575; H01L 27/11548; H01L 27/11556; H01L 27/11519; H01L 27/11578; H01L 21/76802; H01L 21/76831; H01L 23/5226; H01L 23/481
(Continued)

(56) References Cited

U.S. PATENT DOCUMENTS 8,980,731 B2   3/2015  Kim et al.
9,524,975 B2   12/2016 Eom
(Continued)

*Primary Examiner* — Dao H Nguyen
(74) *Attorney, Agent, or Firm* — Muir Patent Law, PLLC

(57) ABSTRACT

A three-dimensional semiconductor device includes: a peripheral circuit structure disposed on a lower substrate, and including an internal peripheral pad portion; an upper substrate disposed on the peripheral circuit structure; a stack structure disposed on the upper substrate, and including gate horizontal patterns; a vertical channel structure passing through the stack structure in a first region on the upper substrate; a first vertical support structure passing through the stack structure in a second region on the upper substrate; and an internal peripheral contact structure passing through the stack structure and the upper substrate, and electrically connected to the internal peripheral pad portion, wherein an upper surface of the first vertical support structure is disposed on a different level from an upper surface of the vertical channel structure, and is coplanar with an upper surface of the internal peripheral contact structure.

20 Claims, 44 Drawing Sheets

(51) Int. Cl.
*H01L 21/768* (2006.01)
*H01L 23/522* (2006.01)
*H01L 27/11573* (2017.01)
*H01L 27/11575* (2017.01)
*H01L 23/48* (2006.01)

(52) U.S. Cl.
CPC ...... *H01L 27/11565* (2013.01); *H01L 23/481* (2013.01); *H01L 23/5226* (2013.01); *H01L 27/11573* (2013.01); *H01L 27/11575* (2013.01)

(58) Field of Classification Search
USPC ............... 257/314, 329; 365/185.05, 185.12, 365/185.18
See application file for complete search history.

(56) References Cited

U.S. PATENT DOCUMENTS

| | | |
|---|---|---|
| 9,536,897 B2 | 1/2017 | Yoo et al. |
| 9,633,945 B1 | 4/2017 | Mizutani |
| 9,741,733 B2* | 8/2017 | Lim .................. H01L 27/11582 |
| 9,799,671 B2 | 10/2017 | Pachamuthu et al. |
| 9,818,759 B2 | 11/2017 | Kai et al. |
| 10,115,632 B1* | 10/2018 | Masamori ......... H01L 27/11582 |
| 2015/0325588 A1* | 11/2015 | Lee .................. H01L 27/11573 257/329 |
| 2017/0263613 A1 | 9/2017 | Murakoshi et al. |
| 2017/0352678 A1* | 12/2017 | Lu ....................... H01L 21/4846 |
| 2018/0047744 A1 | 2/2018 | Utsumi |
| 2018/0053768 A1 | 2/2018 | Kim et al. |
| 2019/0333929 A1* | 10/2019 | Lee .................. H01L 27/11529 |

* cited by examiner

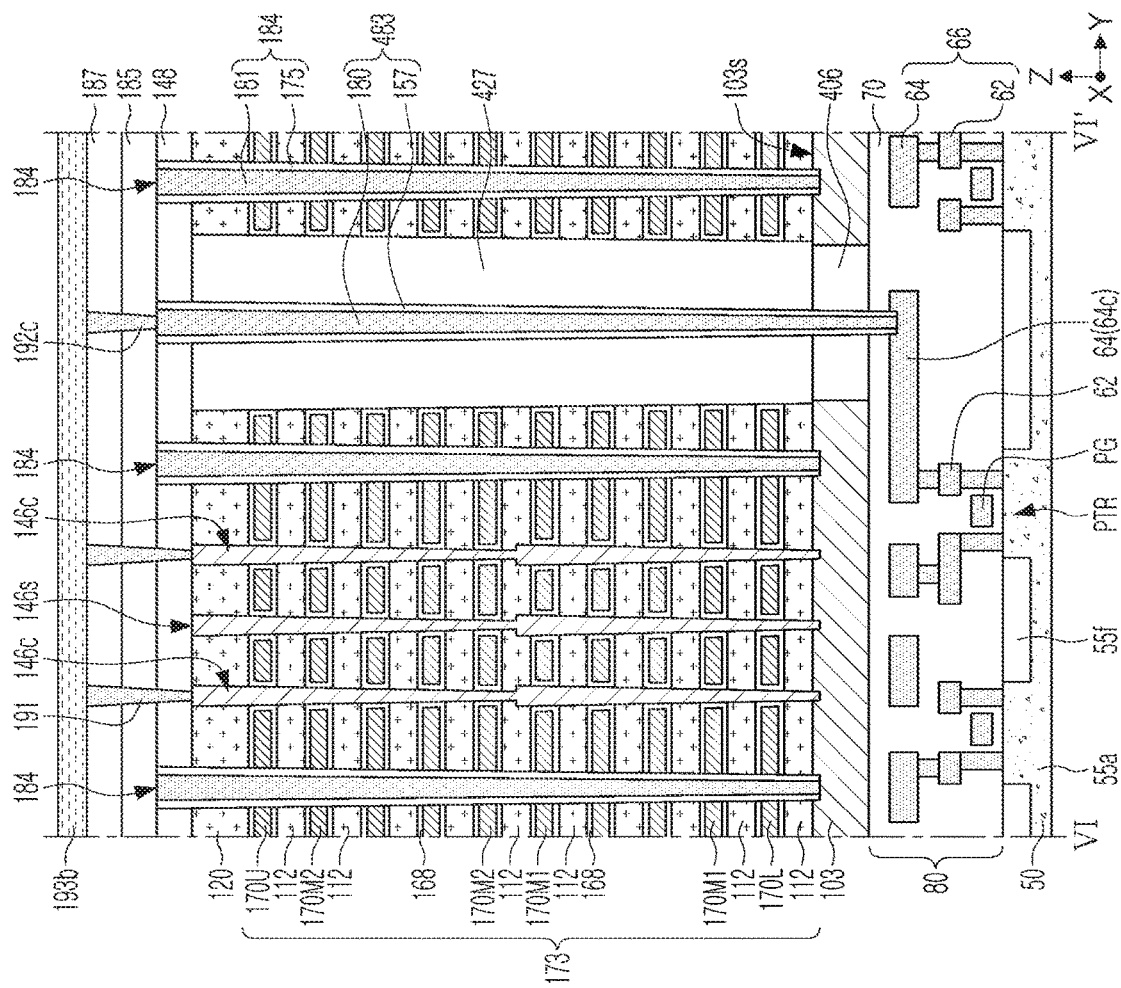

THREE-DIMENSIONAL SEMICONDUCTOR DEVICE

CROSS-REFERENCE TO RELATED APPLICATION

This application claims benefit of priority under 35 U.S.C. § 119 to Korean Patent Application No. 10-2018-0082973, filed Jul. 17, 2018, in the Korean Intellectual Property Office, the disclosure of which is incorporated herein by reference in its entirety.

BACKGROUND

1. Field

The present disclosure relates to a semiconductor device, and more particularly, to a three-dimensional semiconductor device including a vertical channel structure and a vertical support structure.

2. Description of Related Art

In order to increase the price competitiveness of products, there is growing demand for improvements in the degree of integration of semiconductor devices. In order to improve the degree of integration of semiconductor devices, there has been developed a three-dimensional semiconductor device, in which gates are stacked in a direction perpendicular to a substrate. However, unexpected problems may occur as the number of stacked gates increases.

SUMMARY

An aspect of the present inventive concept is to provide a three-dimensional semiconductor device capable of improving a degree of integration.

According to some aspects, the disclosure is directed to a three-dimensional semiconductor device comprising: a peripheral circuit structure disposed on a lower substrate, and including an internal peripheral pad portion; an upper substrate disposed on the peripheral circuit structure; a stack structure disposed on the upper substrate, and including gate horizontal patterns; a vertical channel structure passing through the stack structure in a first region on the upper substrate; a first vertical support structure passing through the stack structure in a second region on the upper substrate; and an internal peripheral contact structure passing through the stack structure and the upper substrate, and electrically connected to the internal peripheral pad portion, wherein an upper surface of the first vertical support structure is disposed on a different vertical level from an upper surface of the vertical channel structure, and is coplanar with an upper surface of the internal peripheral contact structure.

According to some aspects, the disclosure is directed to a three-dimensional semiconductor device comprising: a peripheral circuit structure disposed on a lower substrate, and including an internal peripheral pad portion; an upper substrate disposed on the peripheral circuit structure; a stack structure disposed on the upper substrate, and including gate horizontal patterns; separation structures disposed on the upper substrate, and passing through the stack structure; a vertical channel structure disposed on the upper substrate, and passing through the stack structure; a vertical support structure disposed on the upper substrate, and passing through the stack structure; and a peripheral contact structure passing through and extending downwardly from the stack structure and the upper substrate in sequence, and contacting the internal peripheral pad portion, wherein the vertical channel structure comprises material layers different from a material layer constituting the vertical support structure, and wherein an upper surface of the peripheral contact structure and an upper surface of the vertical support structure are located on a level higher than an upper surface of the vertical channel structure.

According to some aspects, the disclosure is directed to a three-dimensional semiconductor device comprising: a peripheral circuit structure disposed on a lower substrate, and including an internal peripheral pad portion; an upper substrate disposed on the peripheral circuit structure; a stack structure disposed on the upper substrate, and including gate horizontal patterns, wherein the gate horizontal patterns are stacked in a vertical direction, perpendicular to an upper surface of the upper substrate while being spaced apart from each other in a first region on the upper substrate, extend lengthwise from the first region in a horizontal direction parallel to the upper surface of the upper substrate, and comprise pad regions arranged in a stepped manner in a second region on the upper substrate; separation structures disposed on the upper substrate, traversing the first region and the second region, and passing through the stack structure; a vertical channel structure disposed in the first region on the upper substrate, and passing through the stack structure, between the separation structures; a vertical support structure disposed in the second region on the upper substrate, and passing through the stack structure, between the separation structures; and a peripheral contact structure contacting the internal peripheral pad portion, extending upwardly, and sequentially passing through the upper substrate and the stack structure, wherein upper surfaces of the separation structures, the peripheral contact structure, and the vertical support structure are located on a level higher than an upper surface of the vertical channel structure.

BRIEF DESCRIPTION OF DRAWINGS

The above and other aspects, features, and advantages of the disclosed embodiments will be more clearly understood from the following detailed description, taken in conjunction with the accompanying drawings, in which:

FIGS. 8, and 9A to 9B are views illustrating a modified embodiment of a three-dimensional semiconductor device, according to an exemplary embodiment;

DETAILED DESCRIPTION

Hereinafter, example embodiments will be described with reference to the accompanying drawings.

Figure 1A:
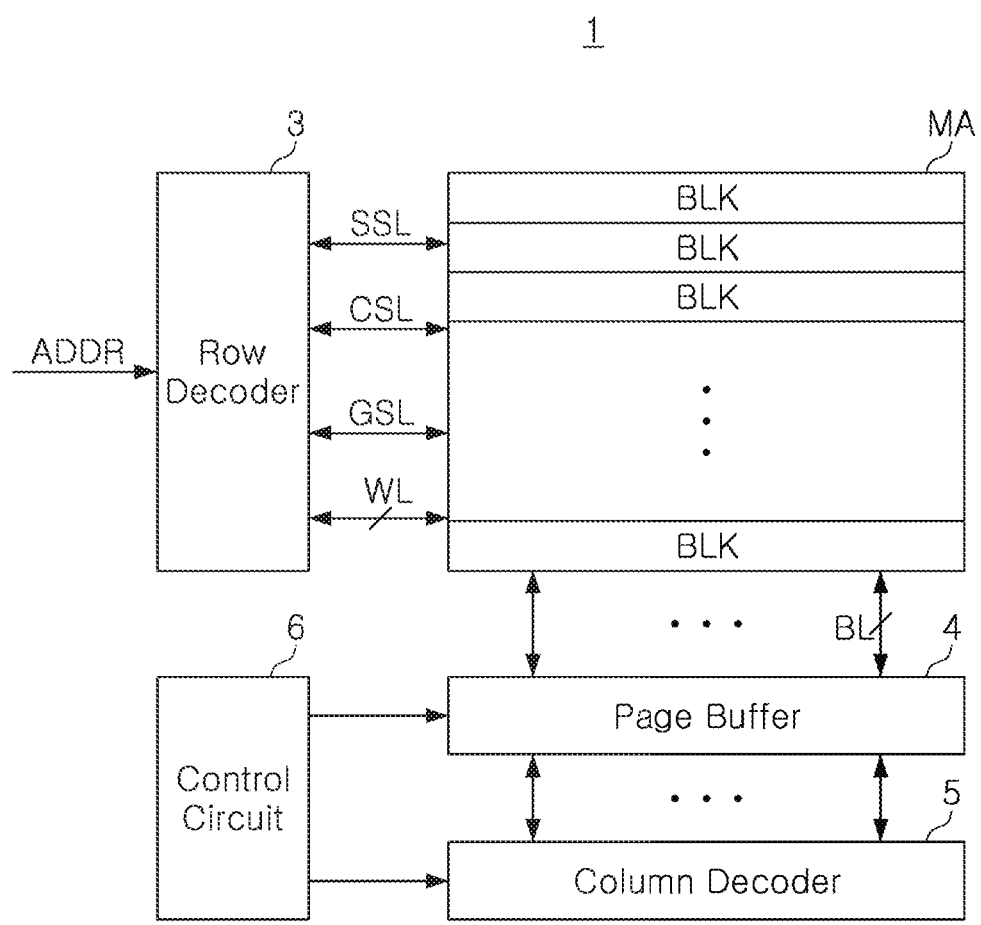
FIG. 1A is a schematic block diagram of a semiconductor device, according to an exemplary embodiment.

An exemplary embodiment of a semiconductor device according to an embodiment will be described with reference to FIG. 1A. FIG. 1A is a schematic block diagram of a semiconductor device according to an embodiment.

Referring to FIG. 1A, a semiconductor device 1 according to an embodiment may include a memory array region MA, a row decoder 3, a page buffer 4, a column decoder 5, and a control circuit 6. The memory array region MA may include memory blocks BLK.

The memory array region MA may include memory cells arranged in a plurality of rows and columns. The memory cells included in the memory array region MA may include word lines WL, at least one common source line CSL, string selection lines SSL, at least one ground selection line GSL, and the like, and may be electrically connected to the page buffer 4 and the column decoder 5 through the bit lines BL.

In one embodiment, among the memory cells, the memory cells arranged along the same row may be connected to the same word line WL, and the memory cells arranged along the same column may be connected to the same bit line BL.

The row decoder 3 may be commonly connected to the memory blocks BLK, and may provide a driving signal to the word lines WL of the memory blocks BLK selected according to a block selection signal. For example, the row decoder 3 may receive address information ADDR from an external source and decode the received address information ADDR to determine a voltage to be supplied to at least a portion of the word lines WL, the common source line CSL, the string selection lines SSL, and the ground selection line GSL, which are electrically connected to the memory blocks BLK.

The page buffer 4 may be electrically connected to the memory array region MA through the bit lines BL. The page buffer 4 may be connected to a bit line BL selected according to an address decoded from the column decoder 5. The page buffer 4 may temporarily store data to be stored in the memory cells, or sense data stored in the memory cells, according to an operation mode. For example, the page buffer 4 may operate as a writing driver circuit in a program operation mode, and as a sense amplifier circuit in a read operation mode. The page buffer 4 may receive power (e.g., voltage or current) from the control logic, and may provide the same to a selected bit line BL.

The column decoder 5 may provide a data transmission path between the page buffer 4 and an external device (for example, a memory controller). The column decoder 5 may decode an externally input address to select one of the bit lines BL.

The column decoder 5 may be commonly connected to the memory blocks BLK, and may provide data information to the bit lines BL of the selected memory block BLK according to a block selection signal.

The control circuit 6 may control the overall operation of the semiconductor device 1. The control circuit 6 may receive a control signal and an external voltage, and may operate according to the received control signal. The control circuit 6 may include a voltage generator that generates voltages necessary for internal operation (e.g., program voltage, read voltage, erase voltage, etc.) using an external voltage. The control circuit 6 may control read, write, and/or erase operations in response to control signals.

Figure 1B:
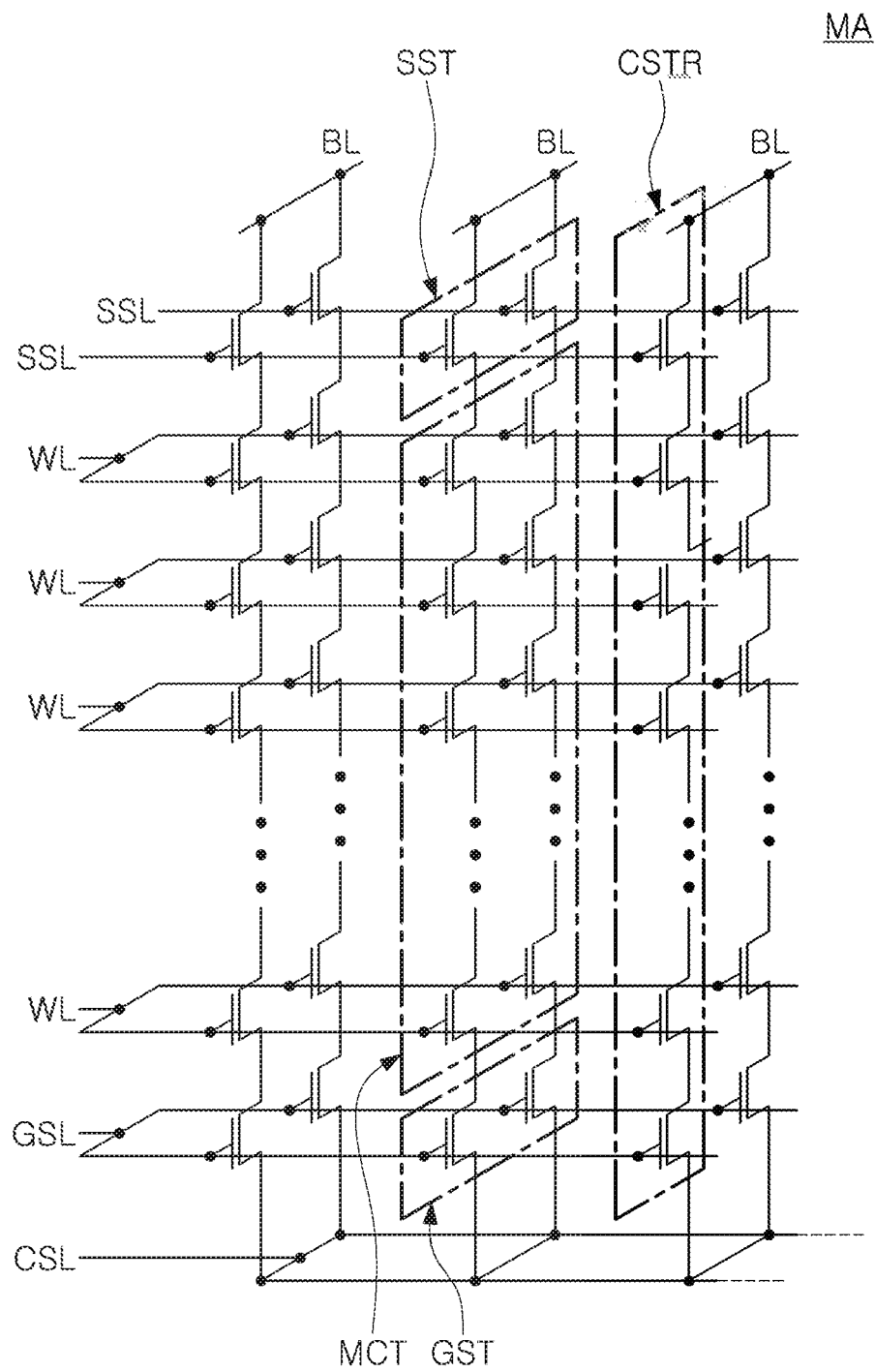
FIG. 1B is a circuit diagram conceptually illustrating a memory array region of a semiconductor device, according to an embodiment.

An exemplary embodiment of a circuit arranged in the memory array region (e.g., memory array region MA in FIG. 1A) of the semiconductor device 1 described in FIG. 1A will be described with reference to FIG. 1B. FIG. 1B is a circuit diagram conceptually illustrating a memory array region (e.g., memory array region MA in FIG. 1A) of a semiconductor device according to an embodiment.

Referring to FIGS. 1A and 1B, a semiconductor device according to an exemplary embodiment may include a common source line CSL, bit lines BL, and a plurality of cell strings CSTR arranged between the common source line CSL and the bit lines BL. The common source line CSL, the bit lines BL, and the plurality of cell strings CSTR may be arranged in a memory array region MA.

The plurality of cell strings CSTR may be connected to each of the bit lines BL in parallel. The plurality of cell strings CSTR may be connected to the common source line CSL in common. Each of the plurality of cell strings CSTR may include a lower selection transistor GST, memory cells MCT, and an upper selection transistor SST, which may be connected in series.

The memory cells MCT may be connected between the lower selection transistor GST and the upper selection transistor SST in series. Each of the memory cells MCT may include data storage regions, which may store information.

The upper selection transistor SST may be electrically connected to the bit lines BL, and the lower selection transistor GST may be electrically connected to the common source line CSL.

The upper selection transistors (SST) may be arranged in plural, and may be controlled by string selection lines SSL. The memory cells MCT may be controlled by a plurality of word lines WL.

The lower selection transistor GST may be controlled by a ground selection line GSL. The common source line CSL may be connected to a source of the lower selection transistor GST in common.

In an exemplary embodiment, the upper selection transistor SST may be a string selection transistor, and the lower selection transistor GST may be a ground selection transistor.

Figure 2A:
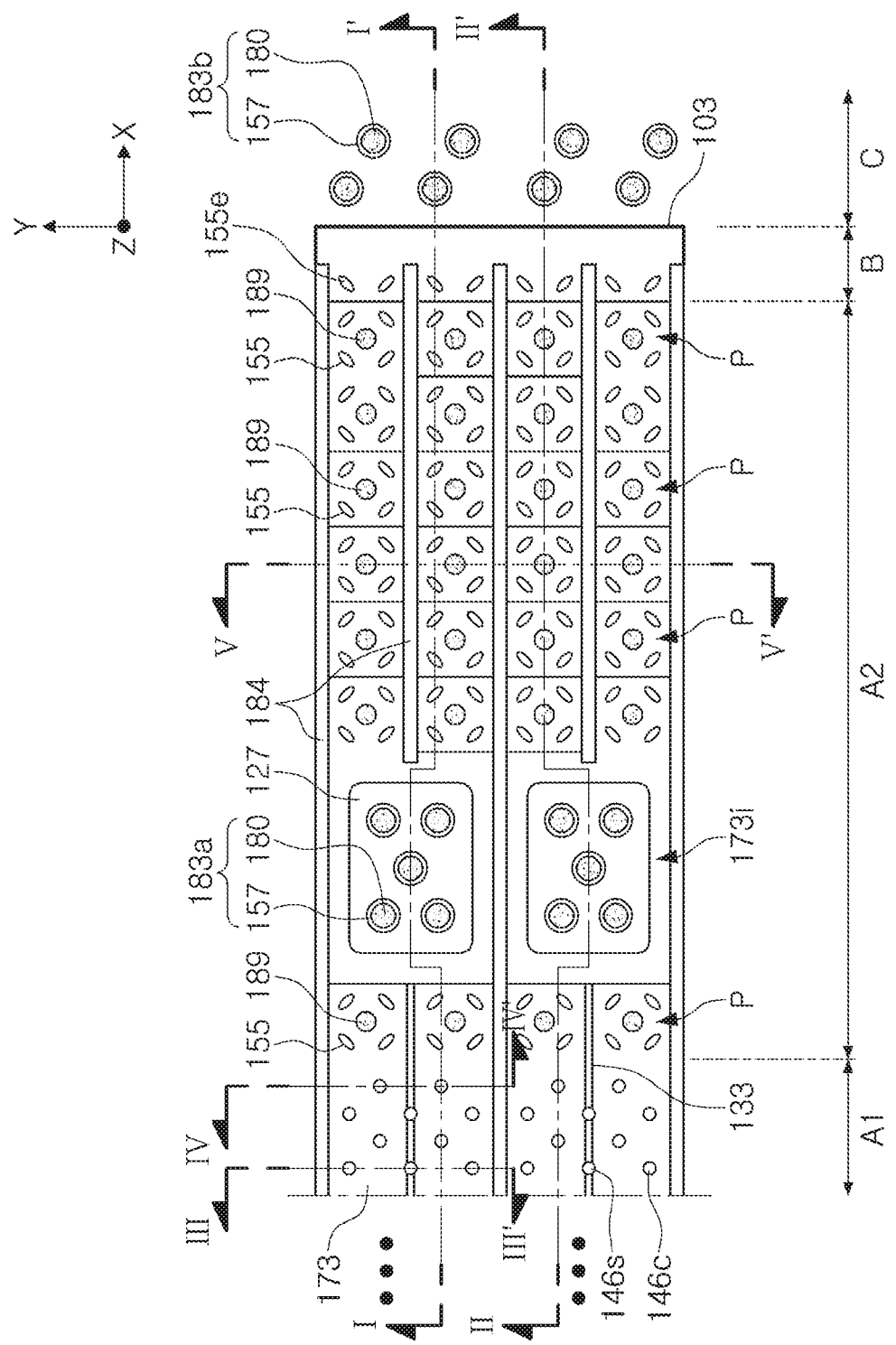
FIGS. 2A to 2B, and 3A to 3D are views illustrating a three-dimensional semiconductor device, according to an exemplary embodiment.
Figure 2B:
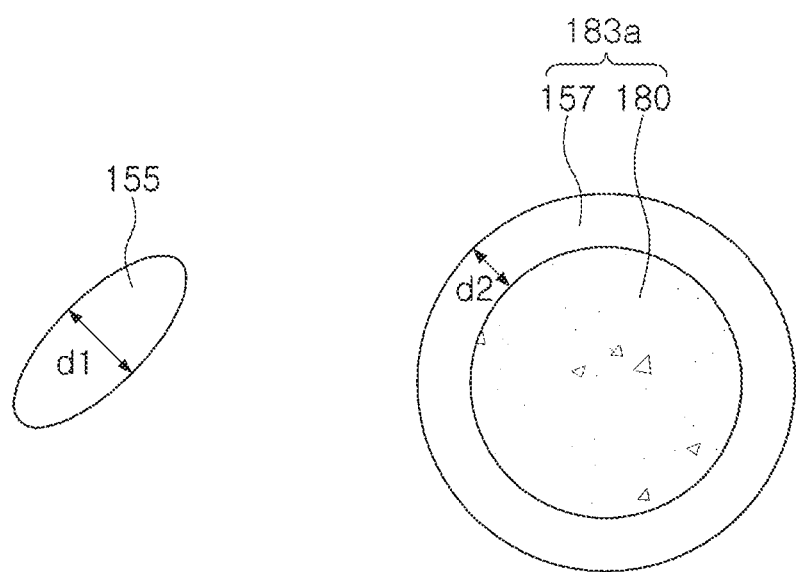
Figure 3A:
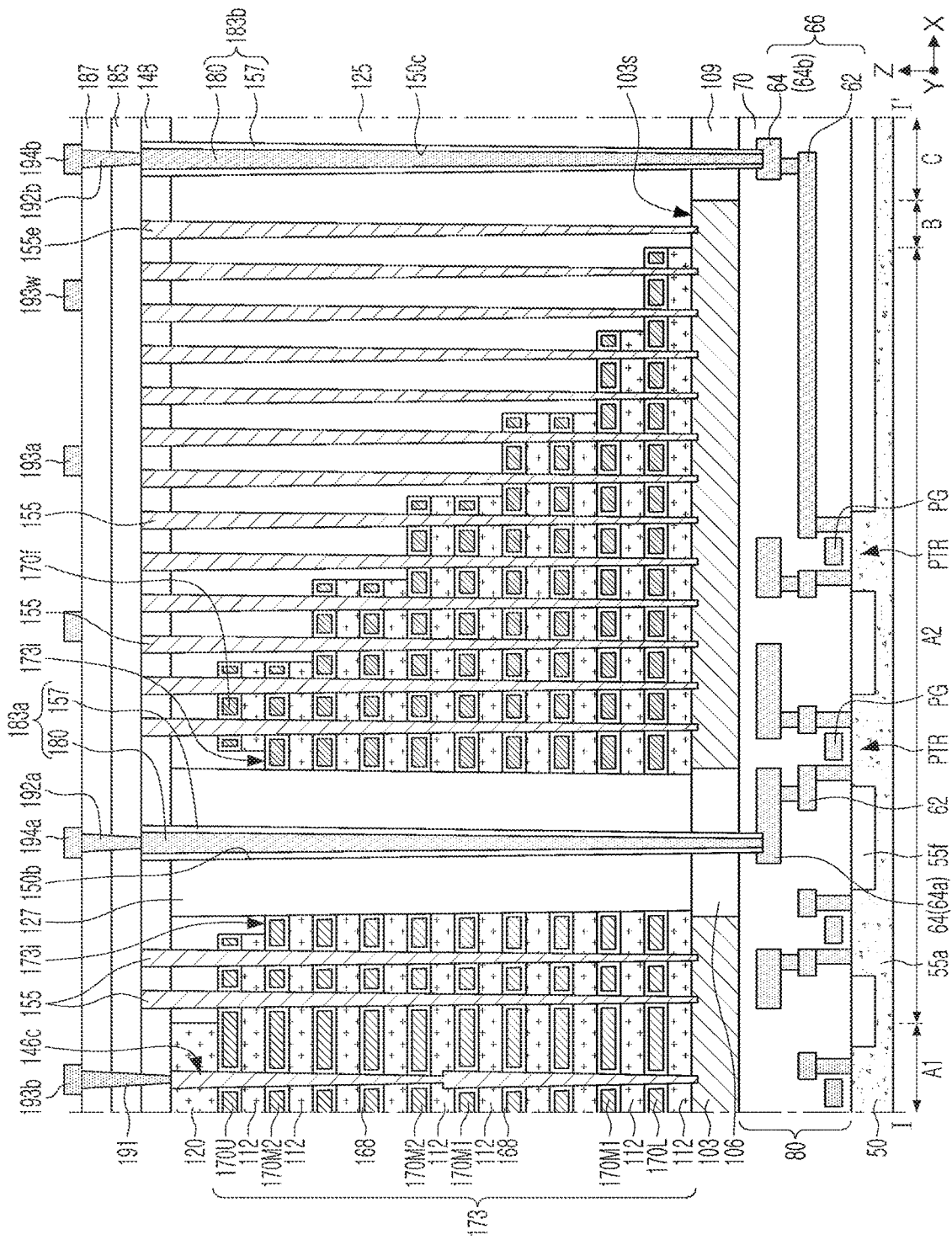
Figure 3B:
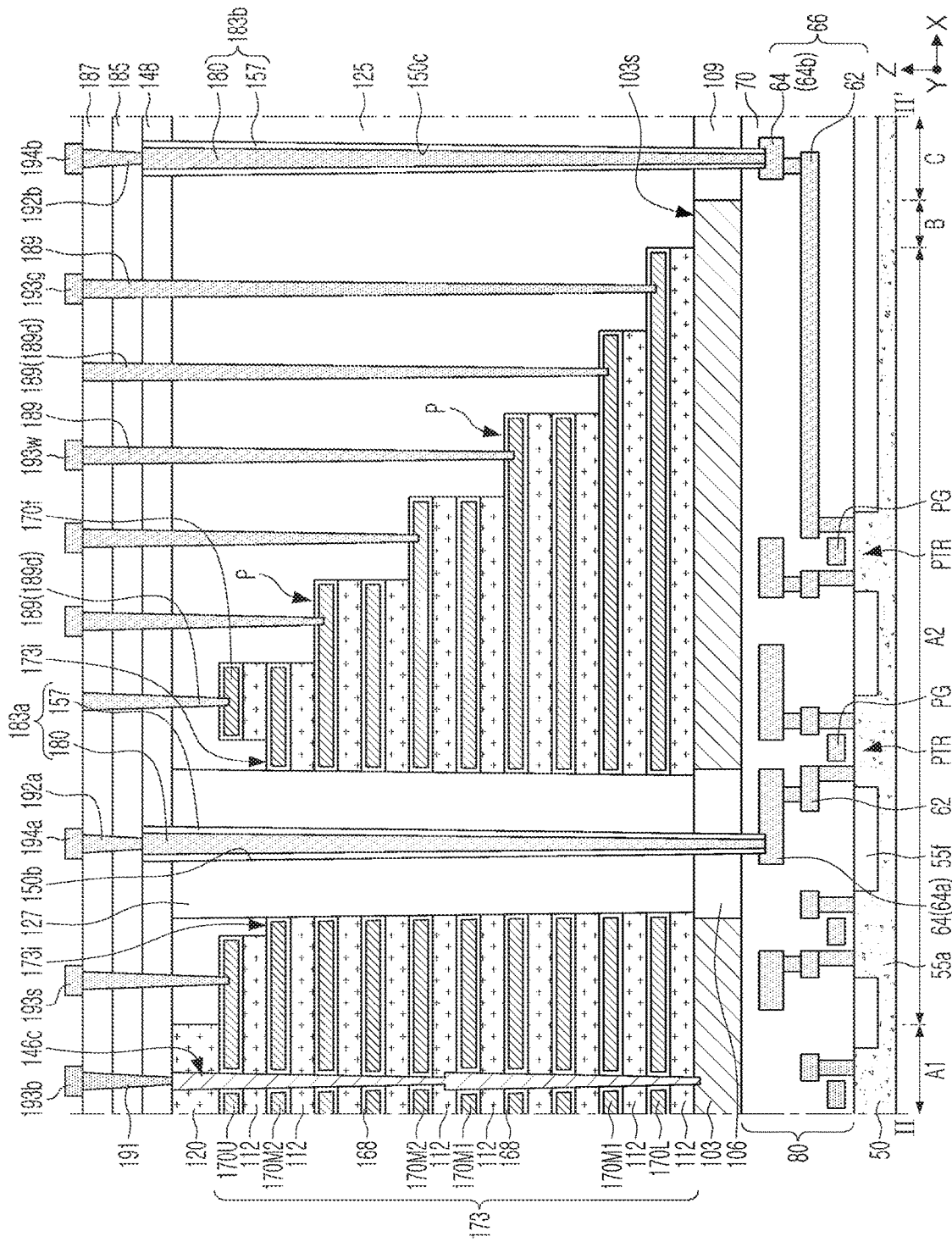
Figure 3C:
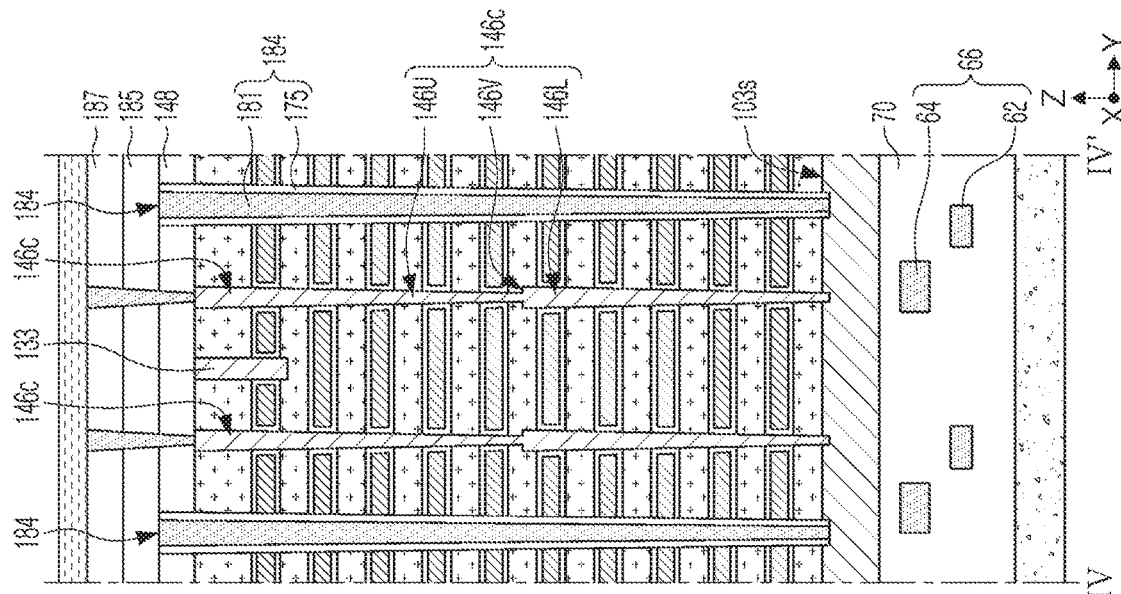
Figure 3C:
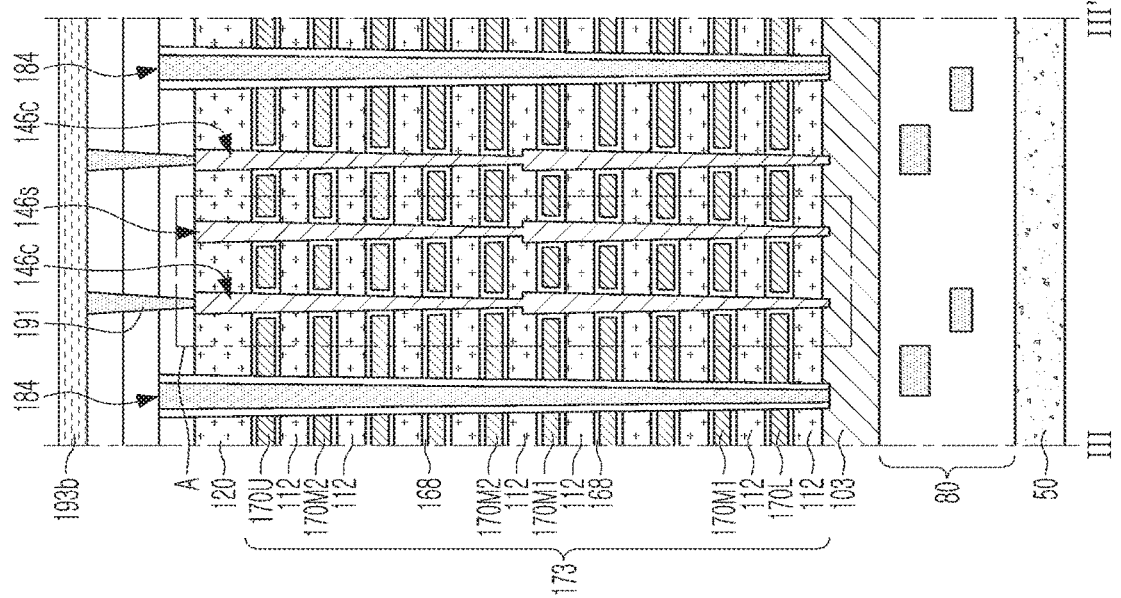
Figure 3D:
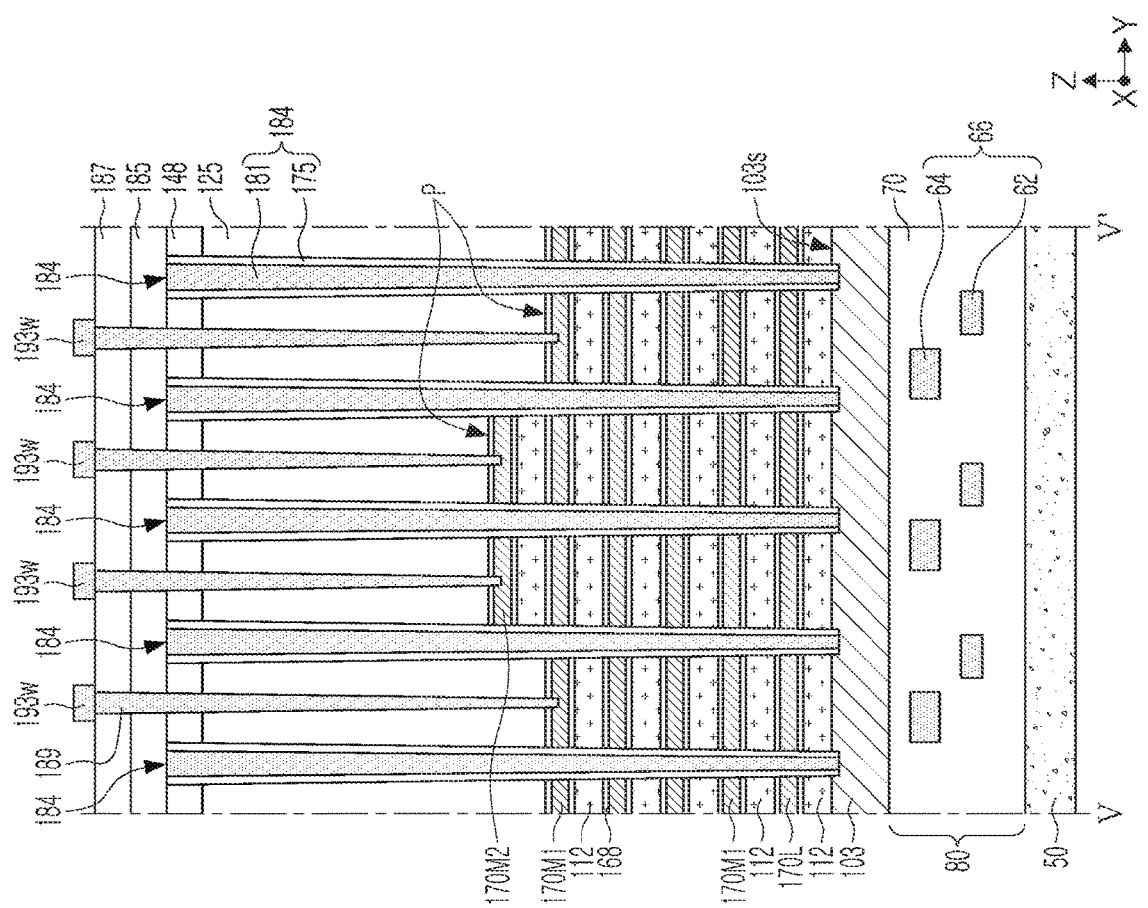

Next, an exemplary embodiment of a three-dimensional semiconductor device according to an embodiment will be described with reference to FIGS. 2A, 2B, and 3A to 3D. In FIGS. 2A to 3D, FIG. 2A is a conceptual plan view illustrating a three-dimensional semiconductor device according to an embodiment, FIG. 2B is a plan view conceptually illustrating a portion of components in FIG. 2A, for example, a first vertical support structure 155 and an internal peripheral contact structure 183a, FIG. 3A is a conceptual cross-sectional view illustrating a region taken along line I-I' in FIG. 2A, FIG. 3B is a conceptual cross-sectional view illustrating a region taken along line II-IF in FIG. 2A, FIG. 3C is a conceptual cross-sectional view illustrating regions taken along line and line IV-IV' in FIG. 2A, and FIG. 3D is a cross-sectional view illustrating a region taken along line V-V' in FIG. 2A.

Referring to FIGS. 2A to 3D, a peripheral circuit structure 80 may be disposed on a lower substrate 50. The lower substrate 50 may be a semiconductor substrate that may be formed of a semiconductor material such as silicon, or the like. For example, the lower substrate 50 may be a single crystal silicon substrate. The peripheral circuit structure 80 may include at least one of the row decoder 3, the page buffer 4, and/or the column decoder 5 described in FIG. 1A.

The peripheral circuit structure 80 may include peripheral transistors PTR, a peripheral wiring structure 66 that may be electrically connected to the peripheral transistors PTR, and a lower insulating layer 70 covering the peripheral transistors PTR and the peripheral wiring structure 66.

The peripheral transistors PTR may include peripheral gates PG formed on active regions 55a that may be defined by field regions 55f in the lower substrate 50.

The peripheral wiring structure 66 may include lower peripheral wiring lines 62, and upper peripheral wiring lines 64 on the lower peripheral wiring lines 62. The upper peripheral wiring lines 64 may be electrically connected to the lower peripheral wiring lines 62. The upper peripheral wiring lines 64 and the lower peripheral wiring lines 62 may be formed of a metallic material such as tungsten, copper, or the like. Each of the upper peripheral wiring lines 64 may have a thickness t2 greater than a thickness t1 of each of the lower peripheral wiring lines 62.

An upper substrate 103 may be disposed on the peripheral circuit structure 80. In an exemplary embodiment, the upper substrate 103 may be formed of a semiconductor material such as silicon, or the like. For example, the upper substrate 103 may be formed of a polysilicon substrate.

A first through region 106 passing through the upper substrate 103 may be disposed. The first through region 106 may be formed of an insulating material such as silicon oxide, or the like.

An intermediate insulating layer 109 surrounding a lateral portion of the upper substrate 103 may be disposed. The intermediate insulating layer 109 may be formed of the same material as the first through region 106. Each of the first through region 106 and the intermediate insulating layer 109 may have a thickness the same as that of the upper substrate 103. For example, upper surfaces of the first through region 106 and the intermediate insulating layer 109 may be coplanar with each other and with an upper surface 103s of the upper substrate 103, and lower surfaces of the first through region 106 and the intermediate insulating layer 109 may be coplanar with each other and with a lower surface of the upper substrate 103.

A stack structure 173 may be disposed on the upper substrate 103. The stack structure 173 may include gate horizontal patterns 170L, 170M1, 170M2, and 170U.

The gate horizontal patterns 170L, 170M1, 170M2, and 170U may be stacked in a vertical direction Z in a first region A1 while being spaced apart from each other, and may include pad regions P extending from the first region A1 to a second region A2 in a first horizontal direction X and arranged in a stepped manner. The pad regions P are not limited to the stepped shapes illustrated in the drawings, and may be modified into various shapes. The vertical direction Z may be perpendicular to an upper surface 103s of the upper substrate 103, and the first horizontal direction X may be parallel to the upper surface 103s of the upper substrate 103. The vertical direction Z may be orthogonal to both the first horizontal direction X and the second horizontal direction Y.

In the embodiments, the first region A1 may be the memory array region (e.g., memory array region MA in FIGS. 1A and 1B) described in FIGS. 1A and 1B, or a region in which the memory array region (e.g., memory array region MA in FIGS. 1A and 1B) may be arranged. Therefore, the first region A1 may be also referred to as a 'memory array region MA.'

In the embodiments, the second region A2 may be located on either side or both side surfaces of the first region A1. The second region A2 may be a region in which the gate horizontal patterns 170L, 170M1, 170M2, and 170U extend from the first region A1 to form the pad regions P. Therefore, the second region A2 may be referred to as an 'extended region.'

In the embodiments, a region on the upper substrate 103 in which the gate horizontal patterns 170L, 170M1, 170M2, and 170U are not formed in the stack structure 173 will be referred to as an edge region B, and a region on the intermediate insulating layer 109 located outside the upper substrate 103 may be referred to as an outer region C.

The gate horizontal patterns 170L, 170M1, 170M2, and 170U may include a lower gate horizontal pattern 170L, an upper gate horizontal pattern 170U on the lower gate horizontal pattern 170L, and intermediate gate horizontal patterns 170M1 and 170M2 between the lower gate horizontal pattern 170L and the upper gate horizontal pattern 170U.

The gate horizontal patterns 170L, 170M1, 170M2, and 170U may be arranged in the first region A1, and may extend from the first region A1 into the second region A2. A floating horizontal pattern 170f spaced from the first region A1 and located in the second region A2 may be disposed on a portion of the gate horizontal patterns among the gate horizontal patterns 170L, 170M1, 170M2, and 170U.

The pad regions P may be defined as regions of a horizontal pattern that do not interfere with horizontal patterns located at relatively upper portions in the gate horizontal patterns 170L, 170M1, 170M2, and 170U and the floating horizontal patterns 170f. A pad region located on the highest vertical level may be defined as a region of the upper gate horizontal pattern 170U located in the second region A2.

In an exemplary embodiment, as illustrated in FIGS. 3A and 3B, the stepped shape in which the pad regions P illustrated in the figure are arranged may be a shape in which a first step lowered in a first drop, a second step facing the first step and heightened in the first drop, a third step lowered from the second step in a second drop greater than the first drop, and a fourth step lowered in a first drop are arranged in sequence while being spaced further away from the first region A1, when viewed in the first horizontal direction X. As illustrated in FIG. 3D, when viewed in a second horizontal direction Y, a step lowered in the first drop in width direction of any one of separation structures 184, may be included. The second horizontal direction Y may be parallel to the upper surface 103s of the upper substrate 103, and may be perpendicular to the first horizontal direction X. The pad regions P may be modified and arranged in various stepped shapes, as well as the stepped shapes illustrated in FIGS. 2A, 3A, 3B, and 3D.

The intermediate gate horizontal patterns 170M1 and 170M2 may include first intermediate gate horizontal patterns 170M1, and second intermediate gate horizontal patterns 170M2 on the first intermediate gate horizontal patterns 170M1.

In an exemplary embodiment, the gate horizontal patterns 170L, 170M1, 170M2, and 170U may be gate electrodes.

In an exemplary embodiment, the lower gate horizontal pattern 170L may be the ground selection line GSL described in FIGS. 1A and 1B.

In an illustrative example, the upper gate horizontal pattern 170U may be the string selection line SSL described in FIGS. 1A and 1B.

In an exemplary embodiment, the upper gate horizontal pattern 170U may be composed of a plurality (e.g., two) of upper gate horizontal patterns stacked in the vertical direction Z.

In an exemplary embodiment, a portion of or all the intermediate gate horizontal patterns 170M1 and 170M2 may be the word lines WL described in FIGS. 1A and 1B. For example, a portion of the intermediate gate horizontal patterns 170M1 and 170M2 may be dummy word lines or dummy gates. For example, in the intermediate gate horizontal patterns 170M1 and 170M2, an intermediate gate horizontal pattern closest to the lower gate horizontal pattern 170L and an intermediate gate horizontal pattern closest to the upper gate horizontal pattern 170U may be a dummy gate to which no electrical signal is applied. In some examples, the dummy gates may have voltages applied for the purpose of reading data from memory cells of the cell string of which they form a part. However, the dummy gate may be part of a dummy memory cell that is not operative to communicate data to an external source of the memory device.

The stack structure 173 may include interlayer insulating layers 112. The interlayer insulating layers 112 may be repeatedly stacked alternately with the gate horizontal patterns 170L, 170M1, 170M2, and 170U. For example, the interlayer insulating layers 112 may be disposed on a lower portion of each of the gate horizontal patterns 170L, 170M1, 170M2, and 170U. The interlayer insulating layers 112 may be formed of silicon oxide.

A first upper insulating layer 120 and a second upper insulating layer 125 may be arranged. The upper surface of each of the first and second upper insulating layers 120 and 125 may be coplanar with one another.

The first upper insulating layer 120 may be disposed in the first region A1, and the second upper insulating layer 125 may be disposed in regions other than the first region A1, i.e., in the second region A2, the edge region B, and the outer region C. The stack structure 173 in the first region A1 may be covered by the first upper insulating layer 120, and the stack structure 173 in the second region A2 may be covered by the second upper insulating layer 125. The boundary between the first and second upper insulating layers 120 and 125 may be substantially vertical, and may be located near the boundary between the first region A1 and the second region A2.

In the second region A2, a second through region 127 passing through the stack structure 173 may be provided. The second through region 127 may pass through the stack structure 173, and may extend in the vertical direction Z to pass through the second upper insulating layer 125. The second through region 127 may include silicon oxide. The second through region 127 may overlap the first through region 106.

A plurality of capping insulating layers may be disposed on the first and second upper insulating layers 120 and 125 and the second through region 127. The plurality of capping insulating layers may include a first capping insulating layer 148, a second capping insulating layer 185 stacked on the first capping insulating layer 148, and a third capping insulating layer 187 stacked on the second capping insulating layer 185. Each of the first to third capping insulating layers 148, 185, and 187 may include an oxide-based insulating material, for example, silicon oxide.

In the first region A1, vertical channel structures 146c passing through the stack structure 173 may be disposed. The vertical channel structures 146c may pass through the stack structure 173, and may extend lengthwise in the vertical direction Z to pass through the first upper insulating layer 120. Upper surfaces of the vertical channel structures 146c may be coplanar with the upper surface of the first upper insulating layer 120.

In the second region A2, first vertical support structures 155 passing through the stack structure 173 may be disposed. The first vertical support structures 155 may extend lengthwise in the vertical direction Z to pass through the second upper insulating layer 125 and the first capping insulating layer 148. An uppermost surface of the first vertical support structures 155 may be coplanar with the upper surface of the first capping insulating layer 148. In some embodiments, a bottom portion of the first vertical support structures 155 may extend into a recessed area of the upper substrate 103, and a bottom surface of the first vertical support structures 155 may be lower than the upper surface 103s of the upper substrate 103. Lateral vertical structures 155e may be disposed on the upper substrate 103, and may be disposed to be spaced apart from the stack structure 173. Since the lateral vertical structures 155e may be formed of the same material and the same structure as those of the first vertical support structures 155, the first vertical support structures 155 will be mainly described below, but the detailed description of the vertical structures 155e will be omitted.

A first internal peripheral contact structure 183a may be disposed on a first internal pad portion 64a of the upper peripheral wiring line 64. The first internal contact structure 183a may contact the first peripheral pad portion 64a of the upper peripheral wiring line 64, and may extend lengthwise in the vertical direction Z to pass through at least a portion of the lower insulating layer 70, the first through region 106, the second through region 127, and the first capping insulating layer 148 in sequence. An upper surface of the first internal peripheral contact structure 183a may be coplanar with the upper surface of the first capping insulating layer 148. The term "contact," as used herein refers to a connection contact (i.e., touching) unless the context indicates otherwise.

An external peripheral contact structure 183b may be disposed on an external pad portion 64b of the upper peripheral wiring line 64. The external peripheral contact structure 183b may contact the external pad portion 64b of the upper peripheral wiring line 64, and may extend lengthwise in the vertical direction Z to pass through at least a portion of the lower insulating layer 70, the intermediate insulating layer 109, the second upper insulating layer 125, and the first capping insulating layer 148 in sequence. An upper surface of the external peripheral contact structure 183b may be coplanar with the upper surface of the first capping insulating layer 148.

The first internal peripheral contact structure 183a and the external peripheral contact structures 183b may have the same cross-sectional structure and the same planar shape as each other. For example, each of the first internal peripheral contact structure 183a and the external peripheral contact structure 183b may include a conductive pillar 180, and a contact spacer 157 surrounding a side surface of the conductive pillar 180. The conductive pillar 180 may be formed of a metal nitride such as titanium nitride (TiN) or the like and/or a metal such as tungsten (W).

First vertical support structures 155 spaced apart from each other may be disposed on the upper substrate 103. The first vertical support structures 155 may pass through the stack structure 173 in the second region A2.

In an exemplary embodiment, each of the first vertical support structures 155 may be shaped to have a length greater than a width, when viewed in a plan view. For example, each of the first vertical support structures 155 may have an elongated shape with a short axis d1, when viewed in a plan view as in FIG. 2B. The contact spacer 157 of the first internal peripheral contact structure 183a may have a ring shape surrounding the conductive pillar 180 with a constant thickness d2. The contact spacer 157 may have a constant thickness d2 at all points (e.g., around the perimeter and along the vertical height of the first internal peripheral contact structure 183a).

The contact spacer 157 and the first vertical support structures 155 may include an insulating material formed at the same time. The contact spacer 157 and the first vertical support structures 155 may include an insulating material formed at the same time by performing the same semiconductor process, for example, an atomic layer deposition (ALD) process. For example, the contact spacer 157 and the first vertical support structures 155 may be formed of silicon oxide formed at the same time by an atomic layer deposition (ALD) process.

The contact spacer 157 and the first vertical support structures 155 may include an insulating material formed at the same time. Therefore, the contact spacer 157 and the first vertical support structures 155 may include an insulating material, e.g., silicon oxide, having the same compositions and properties of a material. In this case, the properties of the material may include density or hardness of the materials constituting the contact spacer 157 and the first vertical support structures 155.

The first vertical support structures 155, the first internal peripheral contact structures 183a, and the external peripheral contact structures 183b may have upper surfaces which are coplanar with each other. Therefore, vertical heights of upper surfaces of the first vertical support structures 155, the first internal peripheral contact structure 183a and the external peripheral contact structures 183b from the upper surface 103s of the upper substrate 103 may be equal to each other.

In an exemplary embodiment, upper surfaces of the vertical channel structures 146c may be arranged on different levels than upper surfaces of the first vertical support structures 155. For example, the upper surfaces of the vertical channel structures 146c may be arranged on a level lower than the upper surfaces of the first vertical support structures 155. For example, a vertical distance between the upper surfaces of the vertical channel structures 146c and the upper surface 103s of the upper substrate 103 may be shorter than a vertical distance between the upper surfaces of the first vertical support structures 155 and the upper surface 103s of the upper substrate 103.

In the first region A1, second vertical support structures 146s passing through the stack structure 173 may be disposed. The upper surfaces of the second vertical support structures 146s may be arranged on a different level from the upper surface of the first vertical support structures 155. The upper surfaces of the second vertical support structures 146s may be arranged on a level lower than the upper surface of the first vertical support structures 155. The upper surfaces of the second vertical support structures 146s may be coplanar with the upper surface of the first upper insulating layer 120.

When viewed in a plan view, each of the second vertical support structures 146s and each of the vertical channel structures 146c may have the same width as each other. For example, when viewed in a plan view, diameters of the second vertical support structures 146s may be the same as diameters of the vertical channel structures 146c.

When viewed in a plan view, a planar shape of each of the first vertical support structures 155 may be different from a planar shape of each of the second vertical support structures 146s. For example, when viewed in a plan view, a planar shape of each of the first vertical support structures 155 may be an elongated shape or a shape having a length greater than a width, and each of the second vertical support structures 146s may be circular.

The second vertical support structures 146s may be formed of the same size, the same cross-sectional structure, and the same material layers as the vertical channel structures 146c. Therefore, since the cross-sectional structure and material layers of the second vertical support structures 146s can be understood from the description of the vertical channel structures 146c, the detailed description thereof will be omitted.

Separation structures 184 may be disposed on the upper substrate 103. In an exemplary embodiment, the separation structures 184 may pass through the stack structure 173. The separation structures 184 may pass through the stack structure 173 in the first region A1, and may extend in the vertical direction Z to pass through the first upper insulating layer 120 and the first capping insulating layer 148. A portion of the separation structures 184 may intersect the first region A1 and the second region A2, and the remainder may be located in the second region A2. The separation structures 184 may pass through the stack structure 173, and may extend lengthwise in the first horizontal direction X to separate or space the stack structure 173 in the second horizontal direction Y. Upper surfaces of the separation structures 184 may be coplanar with the upper surface of the first capping insulating layer 148.

Between the separating structures 184 intersecting the first regions A1 and the second region A2, the stack structure 173 may be not disconnected by the second through regions 127 in the second region A2, and may be continuously connected through a connection region 173i around the second through region 127. For example, gate horizontal patterns having pad regions in the second region A2 (e.g., the first and second intermediate gate horizontal patterns 170M1 and 170M2 and the lower gate horizontal pattern 170L) may continuously extend from the pad regions P to the first region A1 through a peripheral portion of the second through region 127, i.e., through the connecting region 173i.

Each of the separation structures 184 may include a separation core pattern 181 and a separation spacer 175 on a side surface of the separation core pattern 181. The separation core pattern 181 may be formed of a conductive material. In an exemplary embodiment, the separation core pattern 181 may be a common source line. The separation spacer 175 may be formed of an insulating material. For example, the separation spacer 175 may be formed of silicon oxide.

The stack structure 173 may further include an additional dielectric layer 168 that may cover upper and lower surfaces of the gate horizontal patterns 170L, 170M1, 170M2, and 170U, and extend partially in a lateral direction. For example, the additional dielectric layer 168 may be interposed between the gate horizontal patterns 170L, 170M1, 170M2, and 170U and the vertical channel structures 146c, between the gate horizontal patterns 170L, 170M1, 170M2, and 170U and the second vertical support structures 146s, between the gate horizontal patterns 170L, 170M1, 170M2, and 170U and the insulation pattern 133, between the gate horizontal patterns 170L, 170M1, 170M2, and 170U and the second through region 127, between the gate horizontal patterns 170L, 170M1, 170M2, and 170U and the second upper insulating layer 125, and between the gate horizontal patterns 170L, 170M1, 170M2, and 170U and the first vertical support structures 155. The additional dielectric layer 168 may be formed of a high-k dielectric such as aluminum oxide, or the like.

Bit line contact plugs 191 may be disposed on the vertical channel structures 146c, gate contact plugs 189 may be disposed on the pad regions P of the gate horizontal patterns 170L, 170M1, 170M2, and 170U, a first peripheral contact plug 192a may be disposed on the first internal peripheral contact structure 183a, and a second peripheral contact plug 192b may be disposed on the external peripheral contact structure 183b.

Bit lines 193b, a string selection gate connection wiring line 193s, a word line connection wiring line 193w, a ground selection gate connection wiring line 193g, a first internal peripheral connection wiring line 194a, and an external peripheral connection wiring line 194b may be arranged on the third capping insulating layer 187.

The bit lines 193b may be electrically connected to the vertical channel structures 146c through the bit line contact plugs 191. The string selection gate connection wiring line 193s may be electrically connected to the upper gate horizontal pattern 170U through the gate contact plug 189 on the pad region P of the upper gate horizontal pattern 170U. The word line connection wiring lines 193w may be electrically connected to the first and second intermediate gate horizontal patterns 170M1 and 170M2 through the gate contact plugs 189 on the first and second intermediate gate horizontal patterns 170M1 and 170M2, which may be word lines. The ground selection gate connection wiring line 193g may be electrically connected to the lower gate horizontal pattern 170L through a gate contact plug 189 on a pad region of the lower gate horizontal pattern 170L.

The first internal peripheral connection wiring line 194a may be connected to at least a portion of the string selection line connection wiring line 193s and the word line connection wiring line 193w. The external peripheral connection wiring line 194b may be connected to at least a portion of the ground selection line connection wiring line 193g and the word line connection wiring line 193w. Therefore, the word line connection wiring line 193w may be connected to peripheral circuits in the peripheral circuit structure 80 through the first internal peripheral connection wiring line 194a and the external peripheral connection wiring line 194b.

In an exemplary embodiment, gate contact plugs 189 located on the intermediate gate horizontal patterns, which may be dummy word lines or dummy gates in the intermediate gate horizontal patterns 170M1 and 170M2, may be referred to as dummy gate contact plugs 189d. Such dummy gate contact plugs 189d may be spaced apart from the word line connection wiring lines 193w. For example, dummy gate contact plugs 189d may not contact or be electrically connected to the word line connection wiring lines 193w.

In embodiments, the vertical channel structures 146c may be disposed between the separation structures 184 in the first region A1, and the first vertical support structures 155 may be disposed between the separation structures 184 in the second region A2.

Figure 4A:
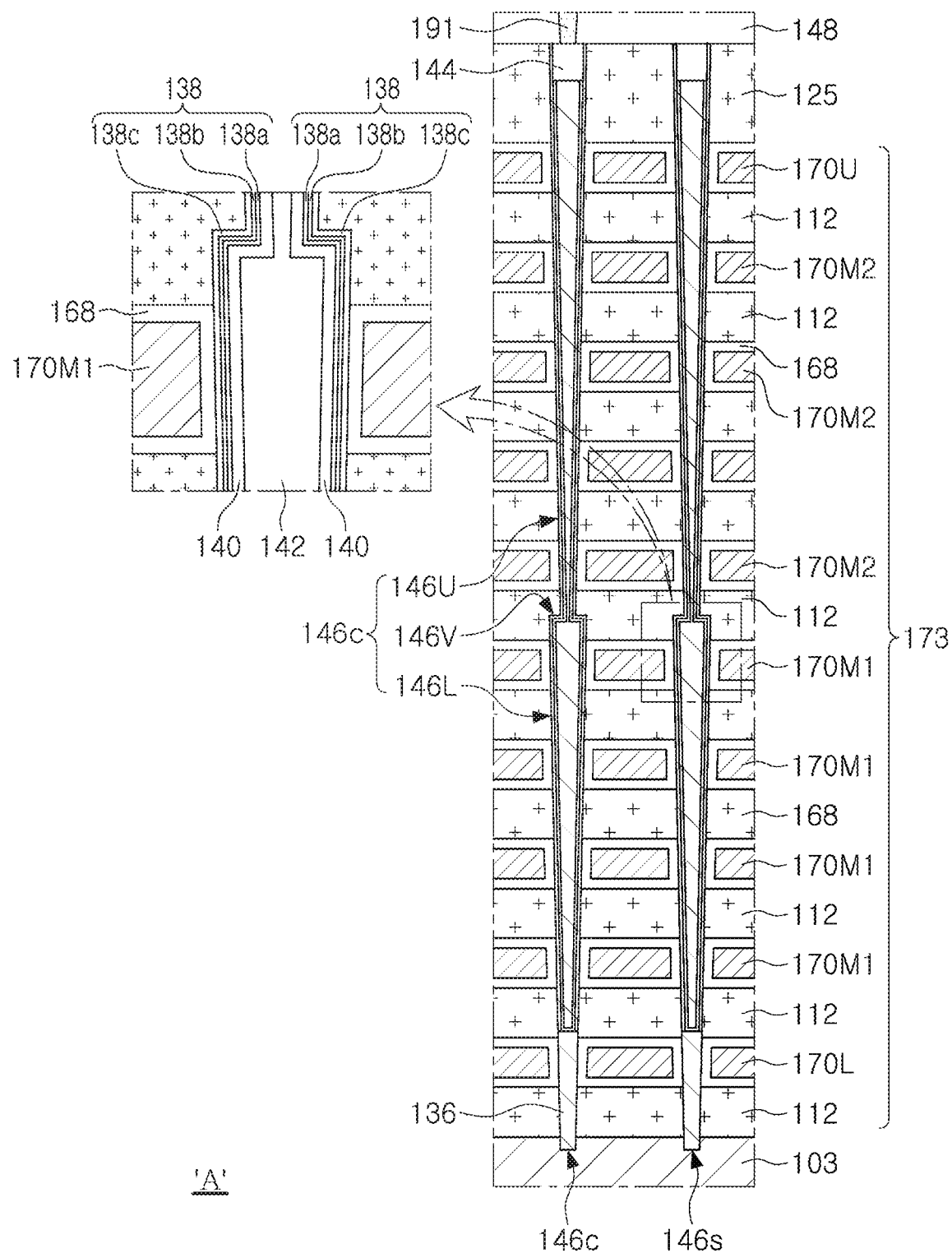
FIG. 4A is a partially enlarged view of portion "A" in FIG. 3C.

Next, an exemplary embodiment of the vertical channel structure 146c will be described with reference to FIG. 4A. FIG. 4A is a partially enlarged view of portion "A" in FIG. 3C.

Referring to FIG. 4A, together with FIGS. 2A to 3D, the vertical channel structure 146c may include a channel semiconductor layer 140, and a gate dielectric structure 138 disposed between the channel semiconductor layer 140 and a stack structure 173.

In an exemplary embodiment, the vertical channel structure 146c may further include a semiconductor pattern 136, a vertical core pattern 142 disposed on the semiconductor pattern 136, and a pad pattern 144 disposed on the vertical core pattern 142.

The channel semiconductor layer 140 may be disposed to contact the semiconductor pattern 136 and surround an outer surface of the vertical core pattern 142. The gate dielectric structure 138 may be disposed to surround an outer surface of the channel semiconductor layer 140. The semiconductor pattern 136 may be an epitaxial material layer that may be formed by a SEG process. The vertical core pattern 142 may be formed of an insulating material, e.g., silicon oxide or the like. The pad pattern 144 may be formed of polysilicon having an N-type conductivity, and may be a drain region. The pad pattern 144 may be disposed on a level higher than the upper gate horizontal pattern 170U. For example, the lower surface of the pad pattern 144 may be at a higher vertical level than the upper surface of the upper gate horizontal pattern 170U. The pad pattern 144 of the vertical channel structure 146c may be electrically connected to the bit line contact plug 191 described above. For example, the upper surface of the pad pattern 144 may contact a lower surface of the bit line contact plug 191.

In an exemplary embodiment, the channel semiconductor layer 140 may pass through the gate horizontal patterns 170L, 170M1, 170M2, and 170U. For example, the gate dielectric structure 138, the channel semiconductor layer 140, and the vertical core pattern 142 may pass through the gate horizontal patterns 170L, 170M1, 170M2, and 170U. When the vertical channel structure 146c further includes a semiconductor pattern 136, the semiconductor pattern 136 may pass through the lower gate horizontal pattern 170L, and the channel semiconductor layer 140 may pass through the intermediate and upper gate horizontal patterns 170M1, 170M2, and 170U. For example, the gate dielectric structure 138, the channel semiconductor layer 140, and the vertical core pattern 142 may pass only through the intermediate and upper gate horizontal patterns 170M1, 170M2, and 170U. The channel semiconductor layer 140 may be formed of a polysilicon layer.

In an exemplary embodiment, the semiconductor pattern 136 may be referred to as a channel semiconductor layer. For example, the semiconductor pattern 136 may be also referred to as a lower channel semiconductor layer located at a relatively lower portion, and the channel semiconductor layer 140 may be also referred to as an upper channel semiconductor layer located at a relatively upper portion.

The gate dielectric structure 138 may include a tunnel dielectric layer 138*a*, a data storage layer 138*b*, and a blocking dielectric layer 138*c*. The data storage layer 138*b* may be disposed between the tunnel dielectric layer 138*a* and the blocking dielectric layer 138*c*. The blocking dielectric layer 138*c* may be disposed between the data storage layer 138*b* and the stack structure 173. The tunnel dielectric layer 138*a* may be disposed between the data storage layer 138*b* and the channel semiconductor layer 140. The tunnel dielectric layer 138*a* may include silicon oxide and/or impurity doped silicon oxide. The blocking dielectric layer 138*c* may include silicon oxide and/or a high dielectric. The data storage layer 138*b* may be formed of a material capable of storing data, for example, silicon nitride.

The data storage layer 138*b* may include regions capable of storing data between the first and second intermediate gate horizontal patterns 170M1 and 170M2, which may be the channel semiconductor layer 140 and the word lines (e.g., word lines WL in FIGS. 1A and 1B). For example, according to operating conditions of a non-volatile memory device such as a flash memory device, an electron injected into the data storage layer 138*b* may be trapped from the channel semiconductor layer 140 through the tunnel dielectric layer 138*a* and may be retained, or the trapped electrons in the data storage layer 138*b* may be erased.

Therefore, as described above, regions of the data storage layer 138*b* disposed between the first and second intermediate gate horizontal patterns 170M1 and 170M2, which may be the word lines (e.g., word lines WL in FIGS. 1A and 1B), and the channel semiconductor layer 140 may be defined as data storage regions, and such data storage regions may constitute the memory cells (e.g., memory cells MCT in FIG. 1B) described in FIG. 1B.

In embodiments, the vertical channel structure 146*c* may further include material layers that are different from the material layers constituting the first vertical support structure 183*a*. For example, the first vertical support structure 183*a* may be formed of a silicon oxide layer, and the vertical channel structure 146*c* may further include the data storage layer 138*b*, the channel semiconductor layer 140, the pad pattern 144, or the semiconductor pattern 136, as described above.

The vertical channel structure 146*c* may include a lower vertical region 146L, an upper vertical region 146U disposed on the lower vertical region 146L, and a width variation region 146V disposed between the lower vertical region 146L and the upper vertical region 146U.

Each of the lower vertical region 146L and the upper vertical region 146U may increase in width, away from the upper surface 103*s* of the upper substrate 103 in the vertical direction Z. Therefore, an upper region of the lower vertical region 146L may have a width greater than a lower region of the upper vertical region 146U and a width less than an upper region of the upper vertical region 146U, and the upper region of the lower vertical region 146L may have a width greater than a lower region of the lower vertical region 146L. In some embodiments, the widths of the upper regions of the upper vertical region 146U and the lower vertical region 146L may be the same, and the widths of the lower regions of the upper vertical region 146U and the lower vertical region 146L may be the same. The width variation region 146V may be a region that varies from a relatively large width in the upper region of the lower vertical region 146L to a relatively small width in the lower region of the upper vertical region 146U.

Figure 4B:
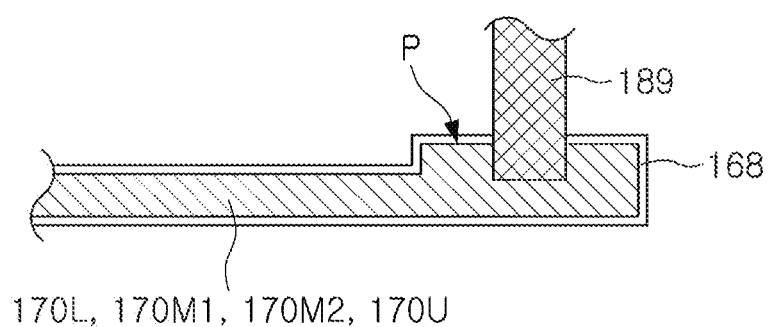
FIG. 4B is a cross-sectional view illustrating some components of a three-dimensional semiconductor device, according to an exemplary embodiment.

Next, an exemplary embodiment of the pad regions P will be described with reference to FIG. 4B. FIG. 4B is a cross-sectional view conceptually illustrating any one pad region P of the gate horizontal patterns 170L, 170M1, 170M2, and 170U described above.

Referring to FIG. 4B, together with FIGS. 2A to 3D, at least a portion of or all the gate horizontal patterns 170L, 170M1, 170M2, and 170U may have a pad region P having an increased thickness. For example, at least a portion of or all the gate horizontal patterns 170L, 170M1, 170M2, and 170U may increase in thickness in the pad region P to a predetermined thickness. The dielectric layer 168 may maintain a constant thickness covering the upper and lower surfaces of the gate horizontal patterns 170L, 170M1, 170M2, and 170U. The increased thickness of the pad region P may prevent penetration of the pad region P by the gate contact plug 189, thereby prevent an occurrence of defects.

Referring again to FIGS. 2A to 3D, the contact spacer 157 and the first vertical support structures 155 may be formed of an insulating material formed at the same time. For example, the first vertical support structures 155 and the contact spacer 157 may be formed of an insulating material, e.g., silicon oxide, having the same compositions and properties of a material.

Figure 4C:
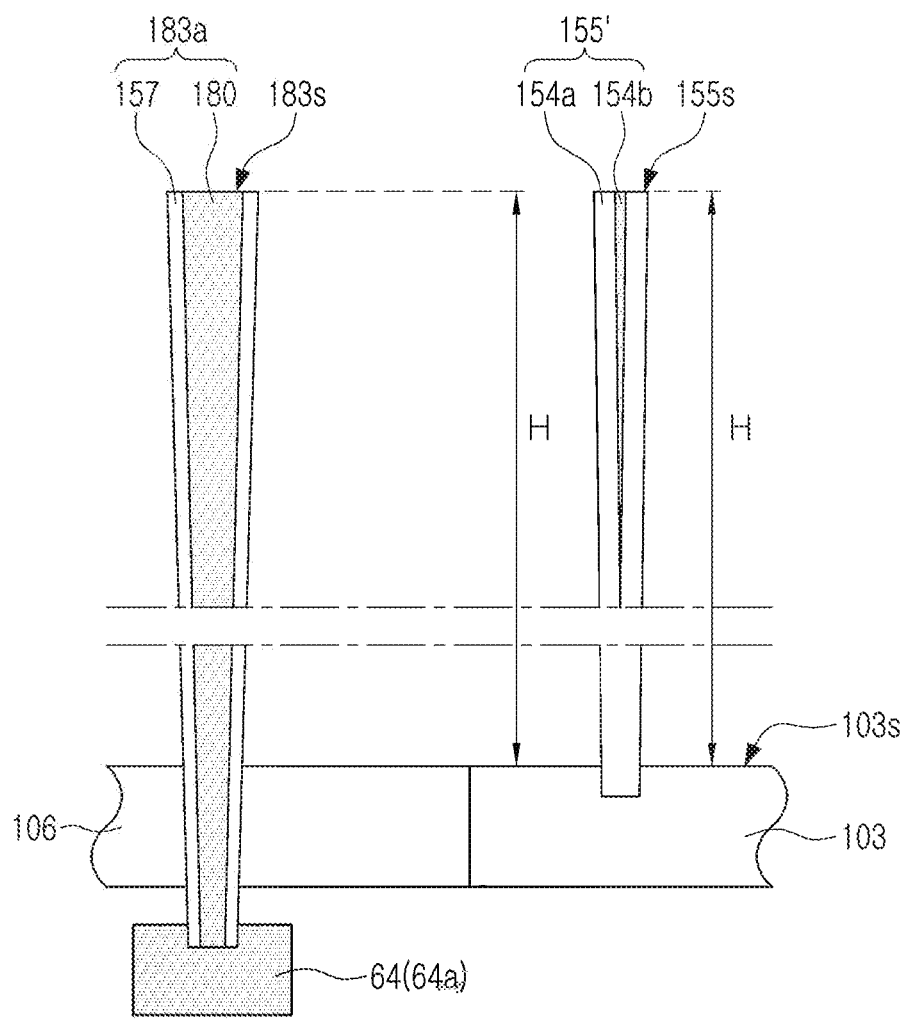
FIG. 4C is a cross-sectional view conceptually illustrating some components of a three-dimensional semiconductor device, according to an exemplary embodiment.

Each of the first vertical support structures 155 may be formed of the same material as a material constituting the contact spacer 157, but the technical concept is not limited thereto. For example, in each of the first vertical support structures 155, an exemplary embodiment of the first vertical support structure 155 in which a portion of the first vertical support structure 155 is formed of the same material as that of the contact spacer 157, and the other portion is formed of a different material from that of the contact spacer 157, will be described with respect to FIG. 4C. FIG. 4C is a cross-sectional view conceptually illustrating a vertical support structure 155' of an exemplary embodiment while conceptually illustrating the upper substrate 103, the first through region 106, the first internal pad portion 64*a*, and the first internal peripheral contact structure 183*a*, as described above.

Referring to FIG. 4C, together with FIGS. 2A to 3D, a first vertical support structure 155' of an exemplary embodiment may include a first portion 154*a* and a second portion 154*b*. In the first vertical support structure 155', the second portion 154*b* may extend lengthwise in a vertical direction from the middle portion of the upper surface of the first portion 154*a* to the upper substrate 103, i.e., in a downward direction, and a vertical length of the second portion 154*b* may be shorter than a vertical length of the first portion 154*a*. In the first vertical support structure 155', the first and second portions 154*a* and 154*b* may have upper surfaces, which are coplanar with each other. In some embodiments, the upper surfaces of the first and second portions 154*a* and 154*b* may be coplanar with the upper surface of the first capping insulating layer 148.

The first internal peripheral contact structure 183*a* may include the conductive pillar 180, and the contact spacer 157 surrounding the side surfaces of the conductive pillar 180, as described above. A height level difference H between an upper surface 155*s* of the first vertical support structure 155' and an upper surface 103*s* of the upper substrate 103 may be the same as a height difference H between an upper surface 183*s* of the first internal peripheral contact structure 183*a* and the upper surface 103*s* of the upper substrate 103.

In an exemplary embodiment, in the first vertical support structure 155', the first portion 154*a* may be formed of a material different from the second portion 154*b*. The first portion 154a may be formed of the same material as the contact spacer 157, and the second portion 154b may be formed of a material different from the contact spacer 157. For example, the first portion 154a may be formed of the same material as the contact spacer 157, for example, silicon oxide, and the second portion 154b may be formed of a material different from the contact spacer 157, for example, un-doped polysilicon, doped polysilicon, metal nitride (e.g., TiN, or the like), or metal (e.g., W, or the like).

Referring to FIGS. 2A to 3D again, the upper surfaces of the separation structures 184 may be formed to be coplanar with the upper surfaces of the first vertical support structures 155, the first internal peripheral contact structures 183a, and the external peripheral contact structures 183b. For example, a distance between the upper surfaces of the separation structures 184 and the upper surface 103s of the upper substrate 103, a distance between the upper surfaces of the first vertical support structures 155 and the upper surface 103s of the substrate 103, and a distance between the upper surface of the first internal peripheral contact structure 183a and the upper surface 103s of the upper substrate 103 may be substantially equal to each other. The technical concept is not limited thereto. A modified embodiment of the separation structures 184 will be described with reference to FIG. 5.

Figure 5:
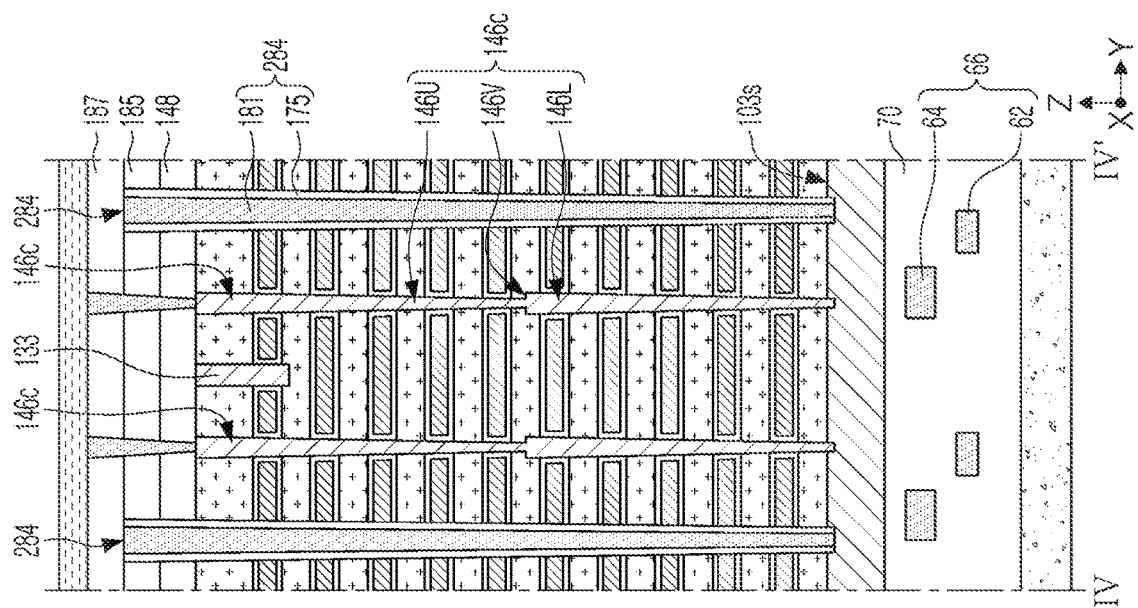
FIG. 5 is a cross-sectional view illustrating a modified embodiment of a three-dimensional semiconductor device, according to an exemplary embodiment.
Figure 5:
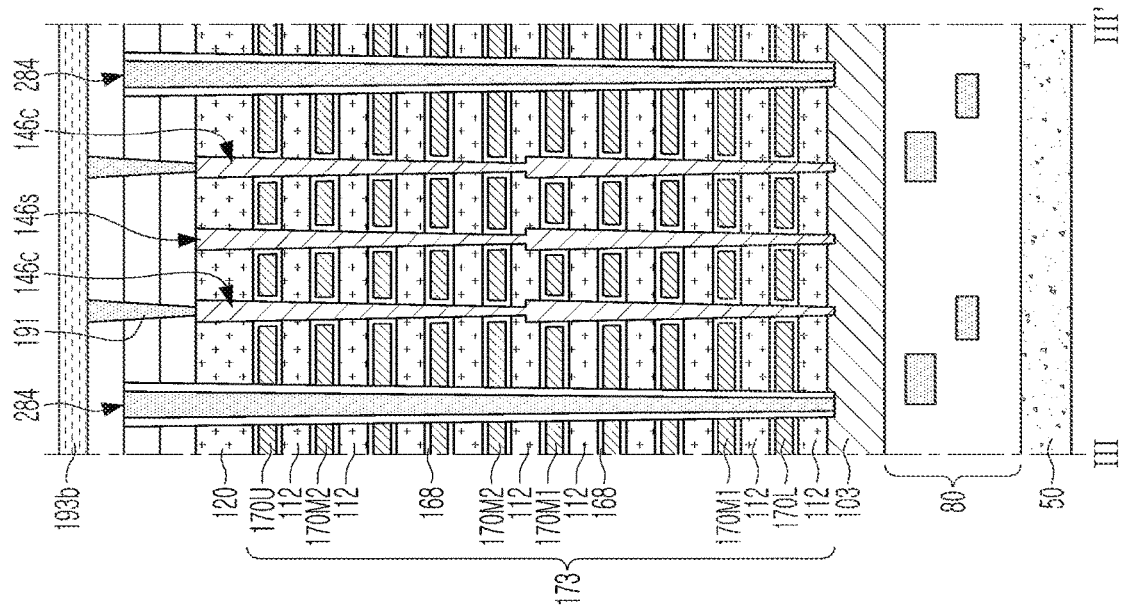

Referring to FIG. 5, separation structures 284 may pass through the stack structure 173 and the first upper insulating layer 125 in the same manner as the separation structures 184 described with reference to FIGS. 2A to 3D, and may extend lengthwise in a vertical direction Z to pass through the first capping insulating layer 148 and a second capping insulating layer 185. Upper surfaces of the separation structures 284 may be disposed on a level higher than the upper surfaces of the first vertical support structures 155, the first internal peripheral contact structures 183a, and the external peripheral contact structures 183b. Upper surfaces of the separation structures 284 may be coplanar with an upper surface of the second capping insulating layer 185.

Hereinafter, various exemplary embodiments or various modified embodiments of the semiconductor devices described above will be described. Semiconductor devices according to various exemplary embodiments or various modified embodiments to be described below can be understood to include the above-described components even if not mentioned separately. Therefore, when the exemplary or modified embodiments to be described below are explained, the elements described in the preceding embodiments may be directly cited without further mention or description, the contents repeated or already mentioned in the preceding embodiments may be omitted, and may be described mainly on the modified portions.

Referring again to FIGS. 2A to 3D, the second through region 127 described above may be formed as a silicon oxide pillar, and may be coplanar with the second upper insulating layer 125. The technical concept is not limited thereto. Modified embodiments of the second through region 127 described above will be described with reference to FIGS. 6 and 7.

Figure 6:
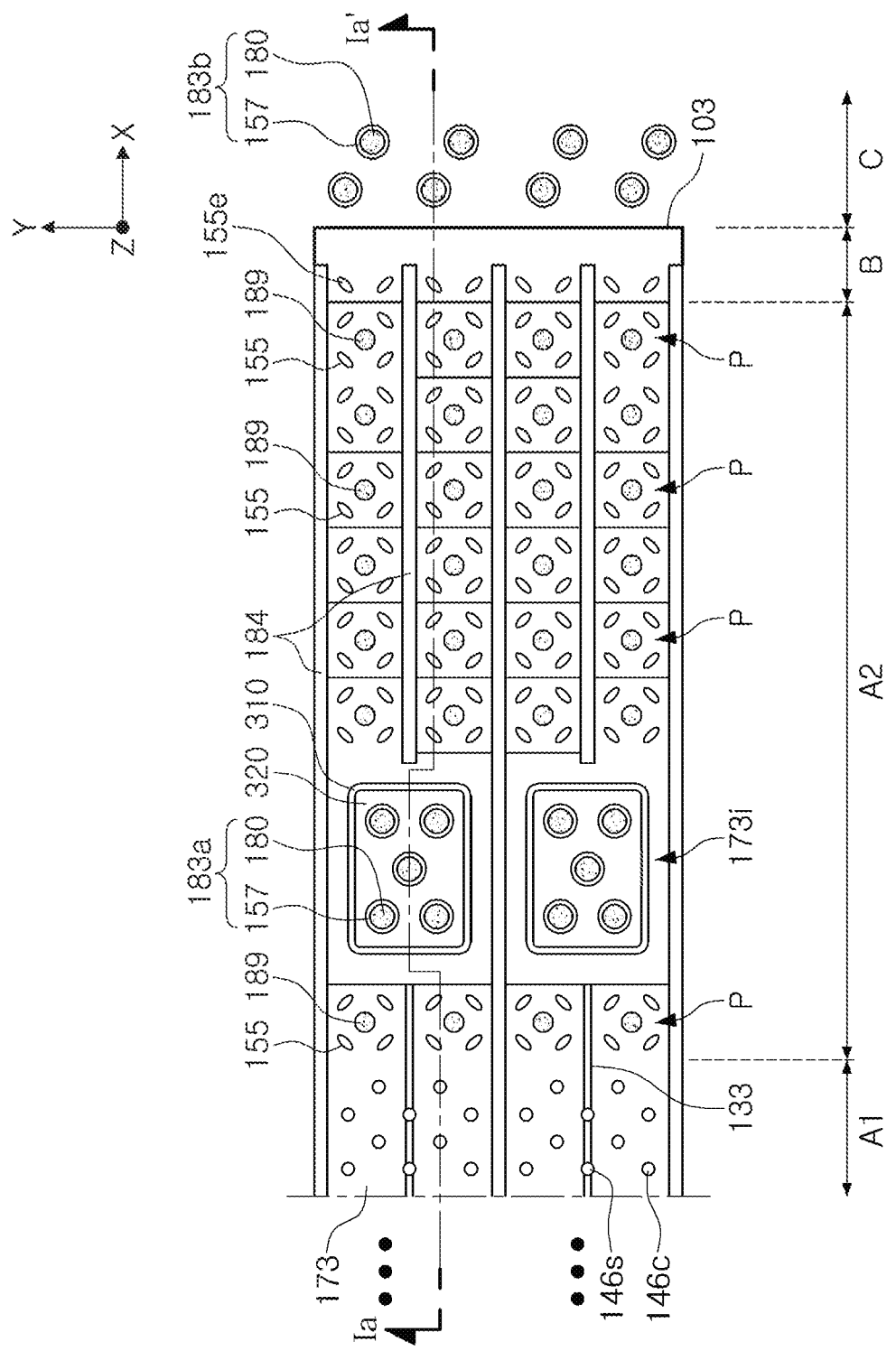
FIGS. 6 and 7 are views illustrating a modified embodiment of a three-dimensional semiconductor device, according to an exemplary embodiment.
Figure 7:
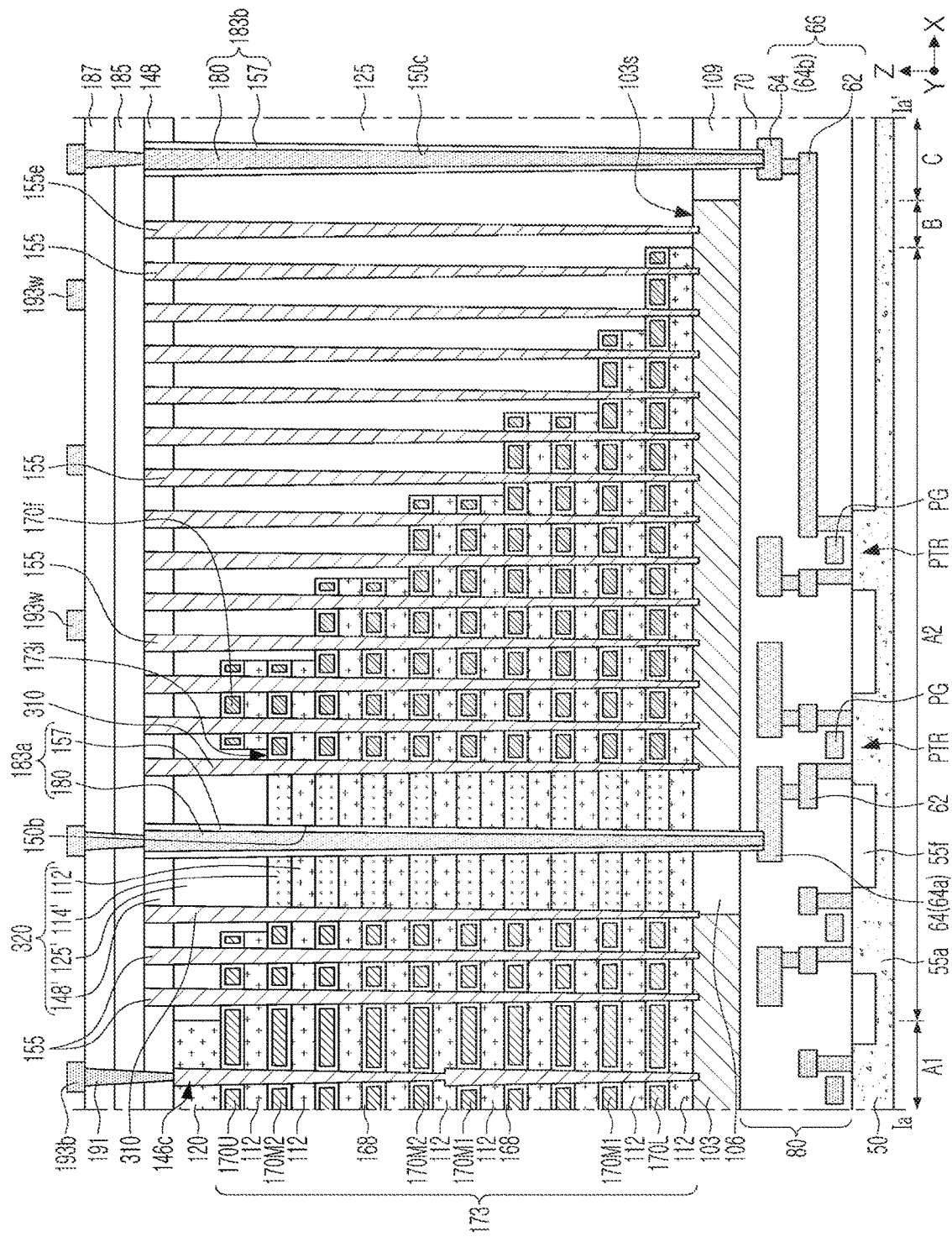

In modified embodiments, referring to FIGS. 6 and 7, a second through region 320 of the modified embodiment may be surrounded by a first dam structure 310. When viewed in a plan view, the first dam structure 310 may be in the form of a ring surrounding the second through region 320. Therefore, the second through region 320 may be defined by the first dam structure 310.

The first dam structure 310 may pass through the above-described first capping insulating layer 148 and the above-described second upper insulating layer 125 in sequence, and may extend lengthwise in a downward direction to pass through the stack structure 173. Therefore, the second through region 320 may include first layers 112' and second layers 114', which pass through the stack structure 173 and are surrounded by the first dam structure 310. The second through region 320 may also include a portion 125' of the second upper insulating layer 125 and a portion 148' of the first capping insulating layer 148, which are surrounded by the first dam structure 310.

In the second through region 320, the first layers 112' and the second layers 114' may be alternately and repeatedly stacked. The first layers 112' may be disposed on the same level as the interlayer insulating layers 112 described above, may be formed of the same material as the interlayer insulating layers 112, and may have the same thickness as the interlayer insulating layers 112. The second layers 114' may be formed of a material having etch selectivity to a material of the first layers 112'. The second layers 114' may be formed of a material different from the gate horizontal patterns 170L, 170M1, 170M2, and 170U. For example, the second layers 114' may be formed of silicon nitride.

The first internal peripheral contact structure 183a may pass through the second through region 320 and the first through region 106 in sequence, and may extend in a downward direction to contact the first internal pad portion 64a of the upper peripheral wiring line 64.

The first dam structure 310 may be formed to have the same height as the first vertical support structures 155 described above. For example, the first dam structure 310 may have an upper surface that is coplanar with the upper surfaces of the first vertical support structures 155. Therefore, the first dam structure 310, the first vertical support structures 155, the first internal peripheral contact structure 183a, and the external peripheral contact structure 183b may have upper surfaces forming a coplanar surface with each other. The first dam structure 320 may be formed above a boundary between the first through region 106 and the upper substrate 103.

In an exemplary embodiment, the first dam structure 310 may include the same material as the first vertical support structures 155. For example, the first dam structure 310 may be formed of a material having the same composition and properties as the first vertical support structures 155, by being formed simultaneously with the first vertical support structures 155.

In an exemplary embodiment, a cross-sectional structure of the first dam structure 310 may be substantially the same as a cross-sectional structure of the first vertical support structures 155. For example, the first dam structure 310 may include the first portion (e.g., first portion 154a in FIG. 4C) and the second portion (e.g., second portion 154b in FIG. 4C) that are identical to the first vertical support structure (e.g., first vertical support structure 155' in FIG. 4C) of the exemplary embodiment illustrated in FIG. 4C.

In the embodiments described with reference to FIGS. 2A to 7, the first through region 106 and the second through regions 127 and 320 may be arranged in the second region A2. A semiconductor device according to an embodiment may include a through region that may be disposed in the first region A1. As described above, the through region that may be disposed in the first region A1 will be described with reference to FIGS. 8 to 13.

Figure 8:
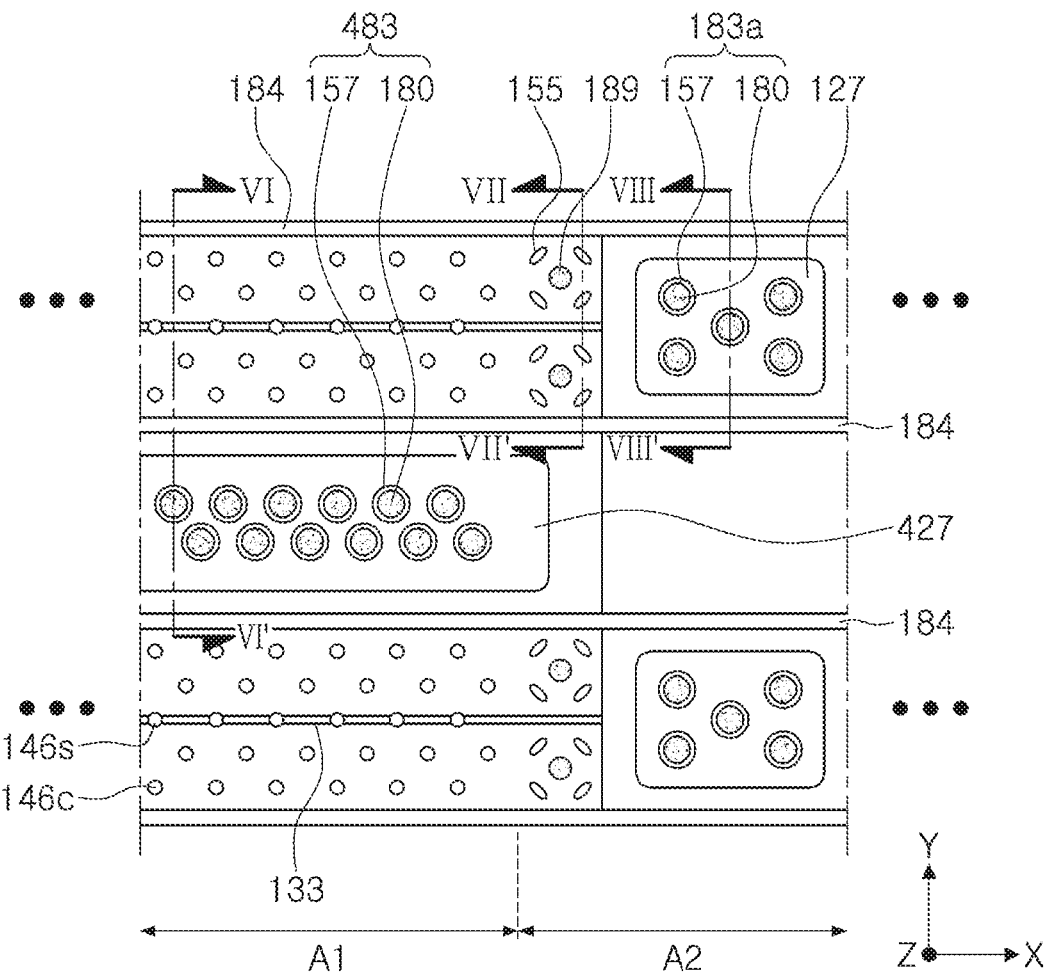

First, referring to FIGS. 8 to 9B, a through region that may be disposed in the first region A1 will be described. In FIGS. 8 to 9B, FIG. 8 is a plan view schematically illustrating a semiconductor device including a through region that may be disposed in the first region A1, FIG. 9A is a cross-sectional view illustrating a region taken along line VI-VI' of FIG. 8, and FIG. 9B is a conceptual cross-sectional view illustrating regions taken along lines VII-VII' and VIII-VIII' of FIG. 8.

Figure 9B:
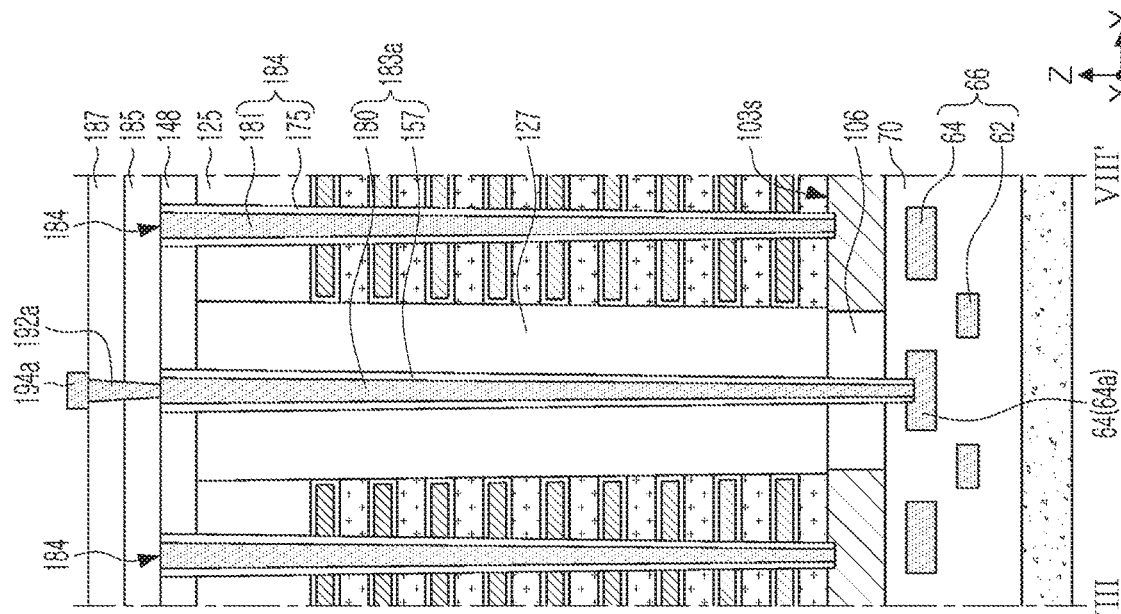
Figure 9B:
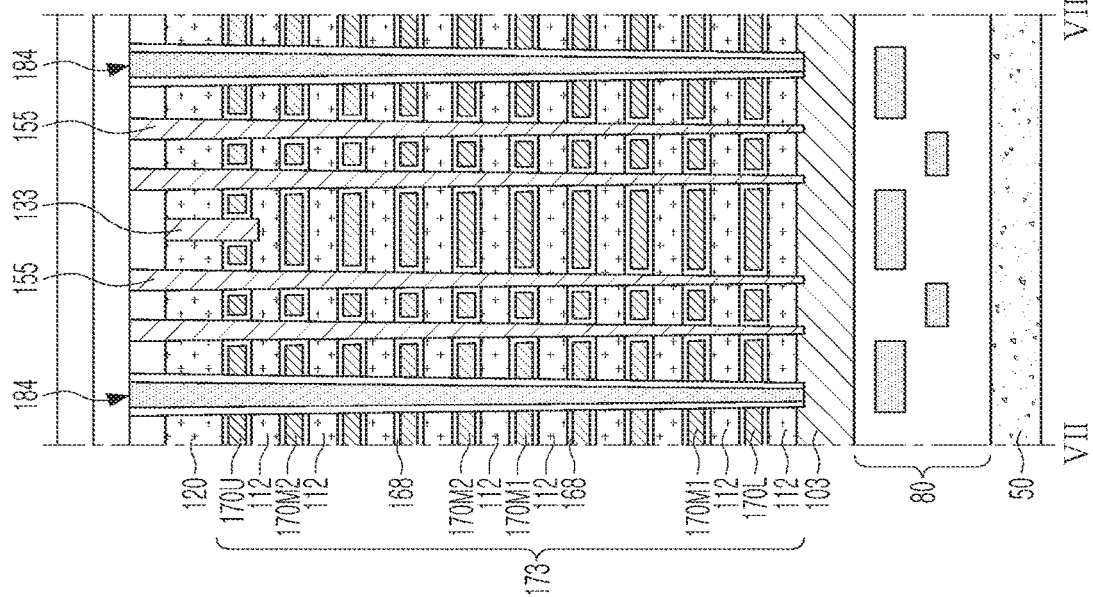

Referring to FIGS. 8 to 9B, the first through region 106 and the second through region 127 are disposed in the second region A2, as described with reference to FIGS. 2A to 3D.

A third through region 406 passing through the upper substrate 103 and a fourth through region 427 disposed on the third through region 406 may be arranged in the first region A1. The third through region 406 may be formed of the same material as the first through region 106, for example, silicon oxide. The fourth through region 427 may pass through the stack structure 173 and may pass through the first upper insulating layer 120, which are located in the first region A1 as described above. The fourth through region 427 may be disposed between the separation structures 184. The fourth through region 427 may have an upper surface coplanar with the upper surface of the second through region 127. The fourth through region 427 may be formed of the same material as the second through region 127, for example, silicon oxide. For example, when the second through region 127 is formed of a silicon oxide pillar, the fourth through region 427 may be also formed of the same silicon oxide pillar as the second through region 127.

The upper peripheral wiring line 64 may include a second internal peripheral pad portion 64c overlapping the third and fourth through regions 406 and 427. A second internal peripheral contact structure 483 may be disposed to pass through the first capping insulating layer 148, the fourth through region 427, and the third through region 406 in sequence, and to extend lengthwise in a downward direction to contact the second internal peripheral pad portion 64c. The second internal peripheral contact structure 483 may have the same material and the same cross-sectional structure as the first internal peripheral contact structure 183a described above with reference to FIGS. 2A to 3D. Therefore, each of the first and second internal peripheral contact structures 183a and 483 may include the conductive pillar 180 described above and the contact spacer 157 surrounding the conductive pillar 180.

The second internal peripheral contact structure 483 may be electrically connected to the bit line 193b. For example, a bit line connection plug 192c passing through the second and third capping insulating layers 185 and 187 may contact the second internal peripheral contact structure 483 and the bit line 193b to electrically connect the second internal peripheral contact structure 483 and the bit line 193b.

Figure 10:
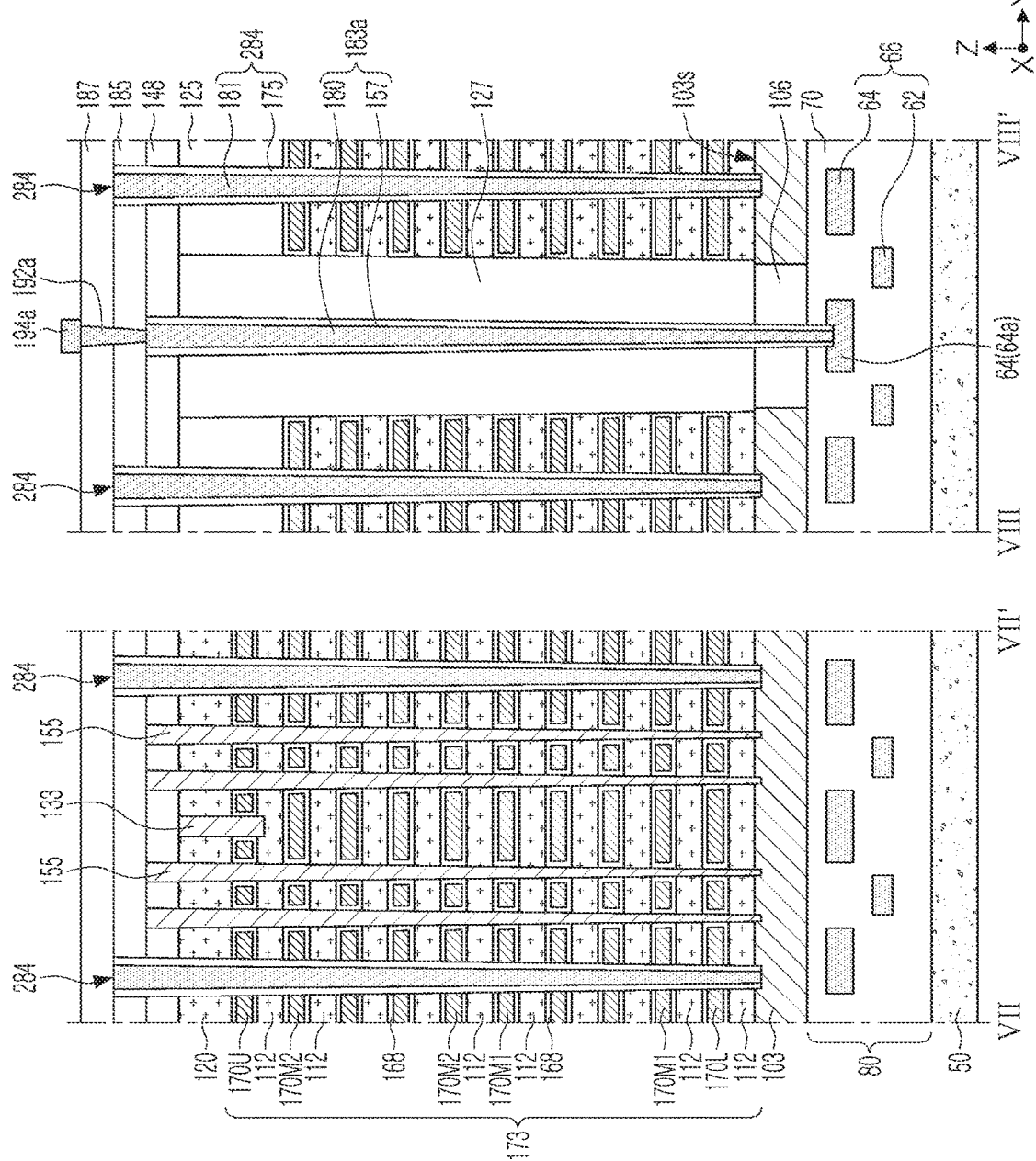
FIG. 10 is a cross-sectional view illustrating a modified embodiment of a three-dimensional semiconductor device, according to an exemplary embodiment.

A height level of the upper surface of the separation structures 184 may be equal to a height level of the upper surfaces of the first and second internal peripheral contact structures 183a and 483 and the first vertical support structures 155. The technical concept is not limited thereto, and may be modified as illustrated in FIG. 10. FIG. 10 is a conceptual cross-sectional view illustrating regions taken along lines VII-VII' and VIII-VIII' of FIG. 8 to illustrate separation structures 284 that may be modified.

In a modified embodiment, referring to FIG. 10, the separation structures 284 may pass through the stack structure 173 and the first upper insulating layer 125, in the same manner as the separation structures 184 described with reference to FIGS. 2A to 3D, and may extend lengthwise in the vertical direction Z to pass through the second capping insulating layer 185. Upper surfaces of the separation structures 284 may be coplanar with the upper surface of the second capping insulating layer 185. For example, upper surfaces of the separation structures 284 may be disposed on a level higher than the upper surfaces of the first vertical support structures 155, the first and second internal peripheral contact structures 183a and 483, and the external peripheral contact structures 183b.

Figure 11:
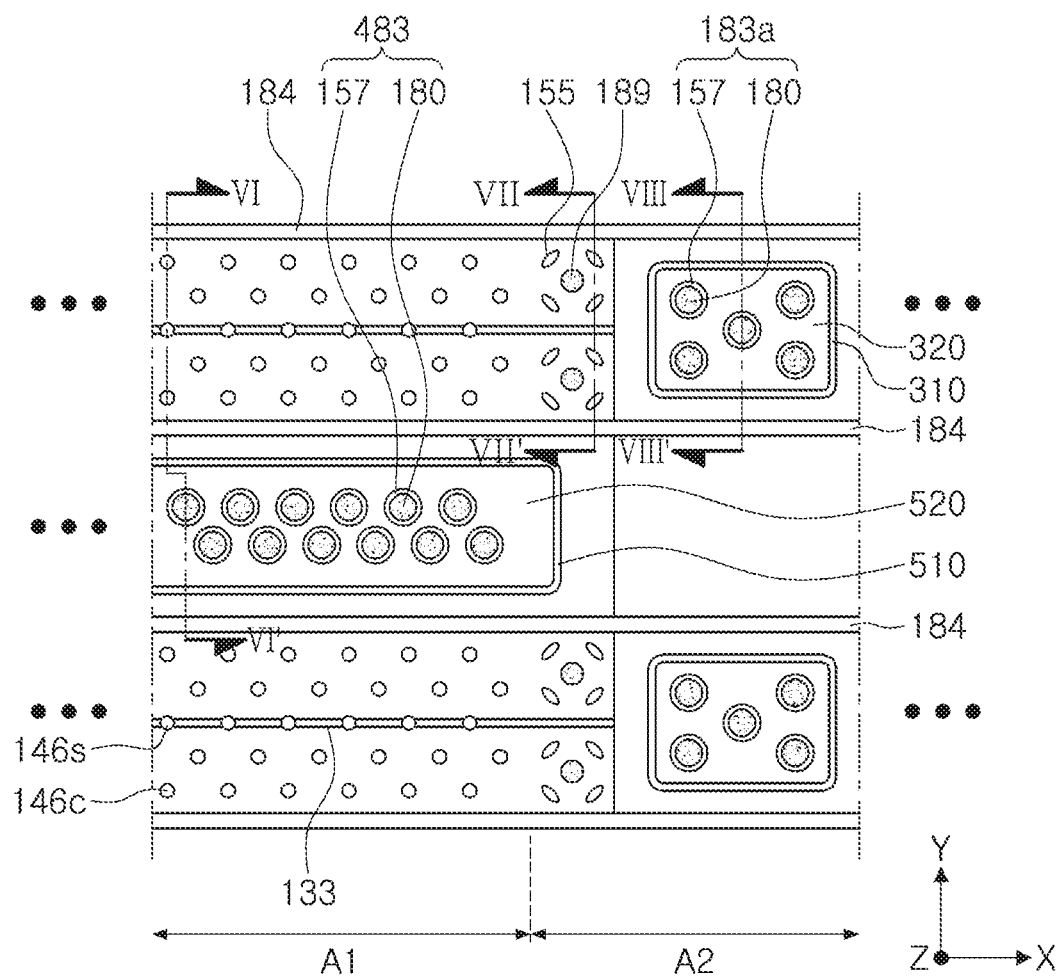
FIGS. 11, and 12A to 12B are views illustrating a modified embodiment of the three-dimensional semiconductor device, according to an exemplary embodiment.
Figure 12A:
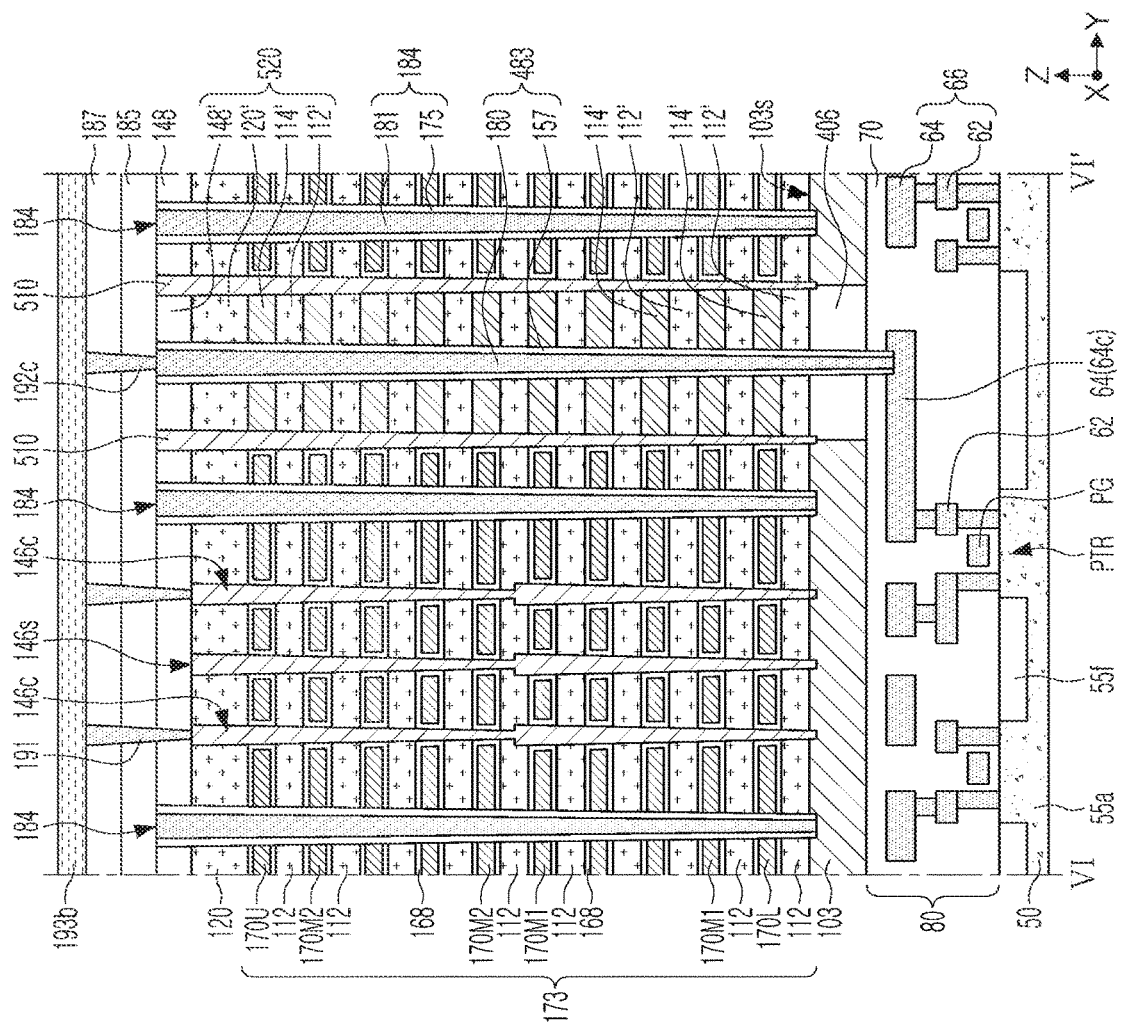
Figure 12B:
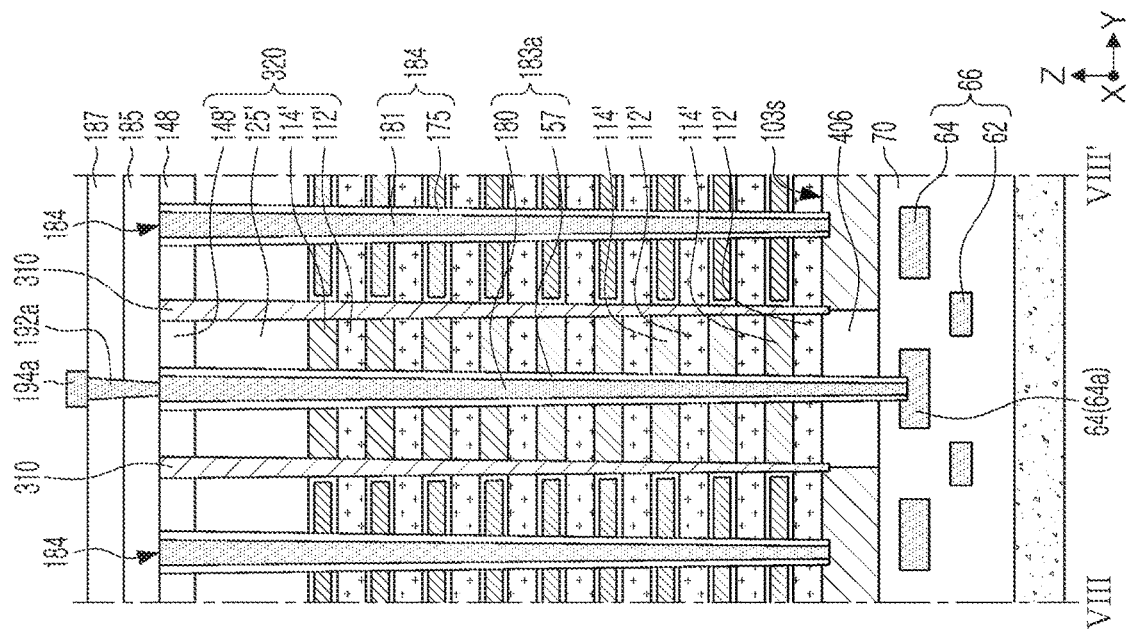
Figure 12B:
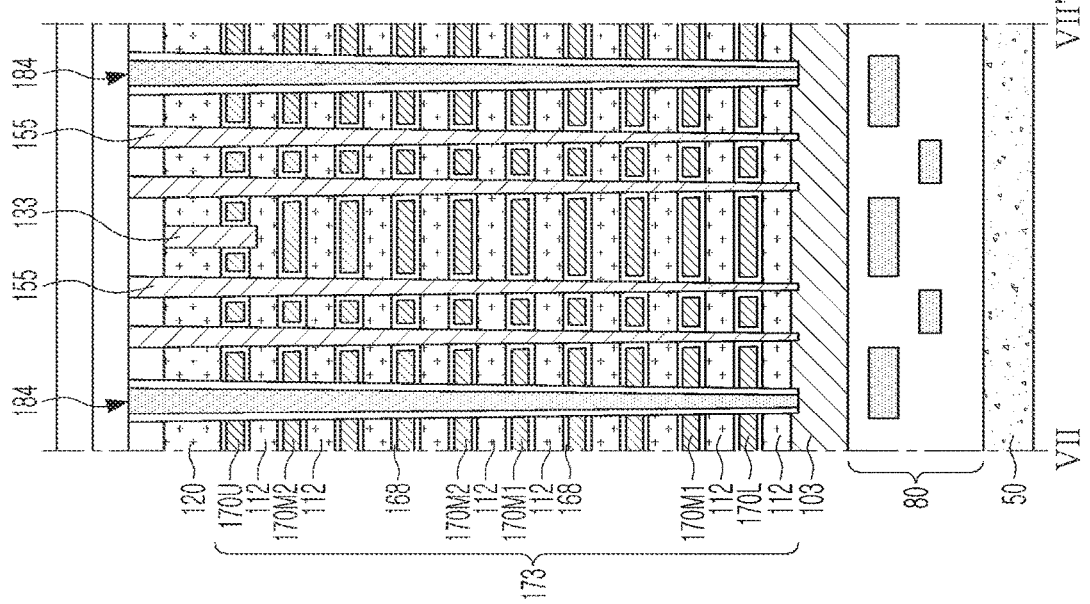

Next, with reference to FIGS. 11 to 12B, a modified embodiment of the through region that may be disposed in the first region A1 will be described. In FIGS. 11 to 12B, FIG. 11 is a plan view conceptually illustrating a semiconductor device including a through region that may be disposed in the first region A1, FIG. 12A is a conceptual cross-sectional view illustrating a region taken along the line VI-VI' in FIG. 11, and FIG. 12B is a conceptual cross-sectional view illustrating regions taken along line VII-VII' and line VIII-VIII' in FIG. 11.

Referring to FIGS. 11 to 12B, the first through region 106, the second through region 320, and the first dam structure 310 may be disposed in the second region A2, as described with reference to FIGS. 6 and 7.

A third through region 406 passing through the upper substrate 103 and a fourth through region 520 disposed on the third through region 406 may be arranged in the first region A1. A second dam structure 510 defining the fourth through region 420 may be disposed.

The second dam structure 510 may have the same material and the same sectional structure as the first dam structure 310. The second dam structure 510 may have an upper surface positioned on the same height level as the upper surface of the first dam structure 310. The second dam structure 510 may pass through the stack structure 173, the first upper insulating layer 120, and the first capping insulating layer 148 in the first region A1.

The fourth through region 520 may include first layers 112' and second layers 114', which pass through the stack structure 173 and are surrounded by the second dam structure 510. The first and second layers 112' and 114' may be the same as the first and second layers 112' and 114' of the second through region 320. Therefore, in the fourth through region 520, the first layers 112' and the second layers 114' may be alternately and repeatedly stacked, and the first layers 112' may be formed of the same material and the same thickness as the interlayer insulating layers 112 of the stack structure 173. The second layers 114' may be formed of a material having etch selectivity to a material of the first layers 112'. The second layers 114' may be formed of a material different from the gate horizontal patterns 170L, 170M1, 170M2, and 170U. For example, the second layers 114' may be formed of silicon nitride. The fourth through region 420 may also include a portion 120' of the first upper insulating layer 120 and a portion 148' of the first capping insulating layer 148, which are surrounded by the second dam structure 510.

As described above, the first internal peripheral contact structure 183a may be disposed to pass through the second through region 320 and the first through region 106 in sequence, and to extend in a downward direction to contact the first internal pad portion 64a of the upper wiring line 64. Likewise, the second internal peripheral contact structure 483 may be disposed to passes through the fourth through region 520 and the third through region 406 in sequence, and to extend in a downward direction to contact the second internal pad portion 64c of the upper wiring line 64. Since the second internal peripheral contact structure 483 may be the same as in FIGS. 11 and 12A, the detailed description thereof will be omitted.

The same separation structures 184 as those described in FIGS. 8 and 9 may be disposed. Such separation structures 184 may have an upper surface located on the same level as the upper surface of the second internal peripheral contact structure 483. The technical concept is not limited thereto.

Figure 13:
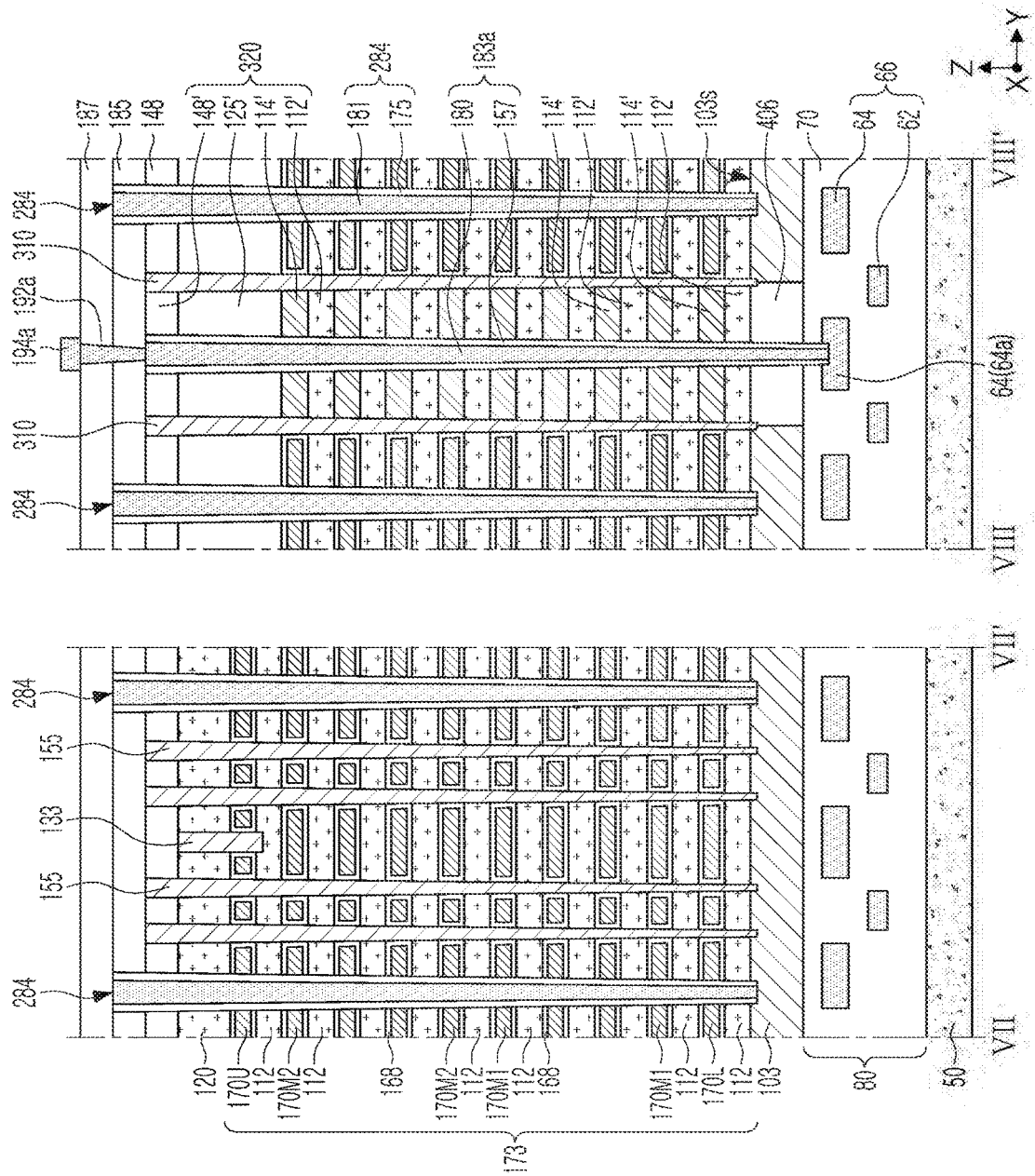
FIG. 13 is a cross-sectional view illustrating a modified embodiment of a three-dimensional semiconductor device, according to an exemplary embodiment.

In a modified embodiment, referring to FIG. 13, separating structures 284 may pass through the stack structure 173, and may extend in an upward direction to pass through the first and second capping insulating layers 148 and 185. Therefore, the upper surfaces of the separation structures 284 may be disposed on a level higher than the upper surfaces of the first vertical support structures 155, the first and second internal peripheral contact structures 183a and 483, and the external peripheral contact structures 183b. FIG. 13 is a conceptual cross-sectional view illustrating regions taken along lines VII-VII' and VIII-VIII' of FIG. 11 to explain a modified embodiment of the separation structures.

Next, an exemplary embodiment of a method of forming a semiconductor device according to an embodiment will be described with reference to FIGS. 2A and 14A to 23B. In FIGS. 14A to 23B, FIGS. 14A, 15, 16A, 17A, 18, 19, 20A, 21A, 22A, and 23A are cross-sectional views illustrating a region taken along line I-I' in FIG. 2, and FIGS. 14B, 16B, 17B, 20B, 21B, 22B, and 23B are cross-sectional views illustrating regions taken along line and line IV-IV in FIG. 2.

Figure 14A:
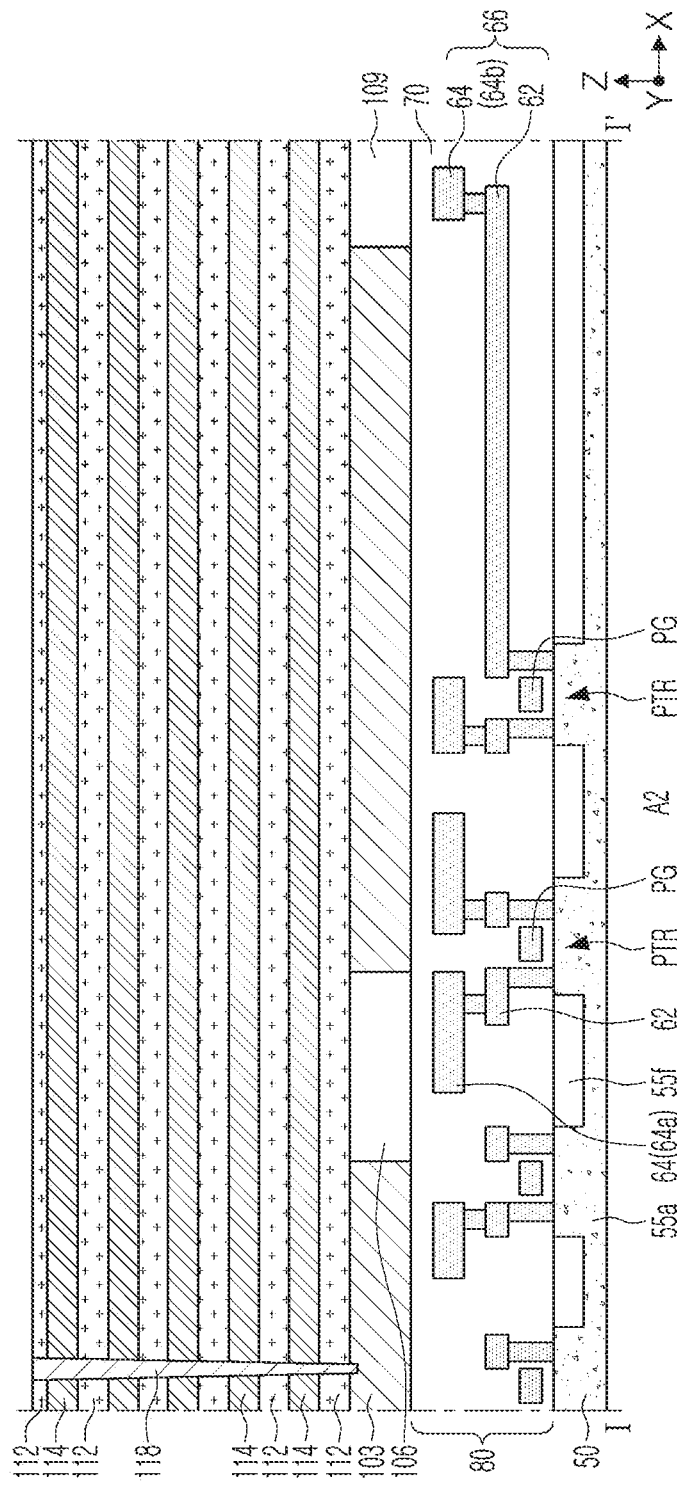
FIGS. 14A to 14B, 15, 16A to 16B, 17A to 17B, 18, 19, 20A to 20B, 21A to 21B, 22A to 22B, and 23A to 23B are cross-sectional views illustrating an exemplary embodiment of a method of forming a three-dimensional semiconductor device, according to an exemplary embodiment.
Figure 14B:
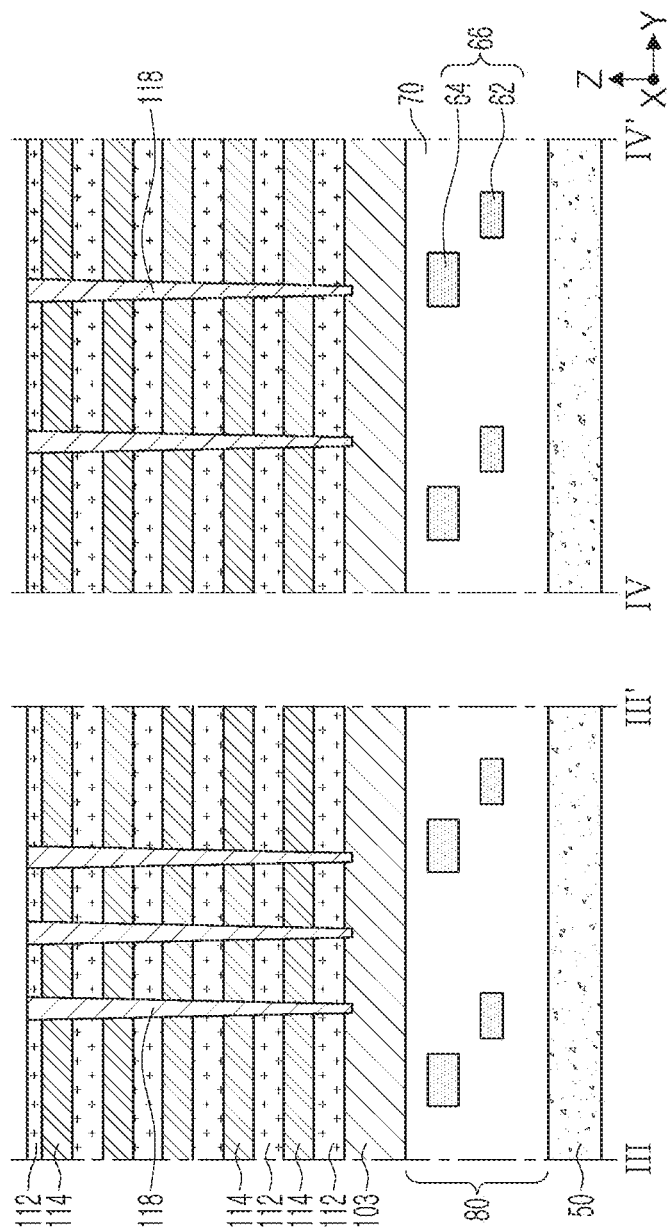

Referring to FIGS. 2, 14A, and 14B, a peripheral circuit structure 80 may be formed on a lower substrate 50. The lower substrate 50 may be a monocrystalline silicon substrate. The peripheral circuit structure 80 may include at least one of the row decoder 3, the page buffer 4, and the column decoder 5, which are described in FIG. 1A. The peripheral circuit structure 80 may include peripheral transistors PTR, a peripheral wiring structure 66 that may be electrically connected to the peripheral transistors PTR, and a lower insulating layer 70 covering the peripheral transistors PTR and the peripheral wiring structure 66.

An upper substrate 103 may be formed on the peripheral circuit structure 80. The upper substrate 103 may be formed of a polysilicon substrate.

The upper substrate 103 may be patterned to form openings, and the openings may be filled with silicon oxide. For example, a first through region 106 passing through the upper substrate 103 and an intermediate insulating layer 109 surrounding an outer surface of the upper substrate 103 may be formed from the silicon oxide-filled openings in the upper substrate 103.

Interlayer insulating layers 112 and mold layers 114 may be formed to be stacked alternately and repeatedly on the upper substrate 103, the first through region 106, and the intermediate insulating layer 109. The mold layers 114 may be referred to as 'gate layers.' The mold layers 114 may be formed of a material having etch selectivity to a material of the interlayer insulating layers 112. For example, the interlayer insulating layers 112 may be formed of silicon oxide, and the mold layers 114 may be formed of silicon nitride. Sacrificial vertical structures 118 passing through the interlayer insulating layers 112 and the mold layers 114 may be formed.

Subsequently, referring to FIGS. 2A and 15, additional interlayer insulating layers 112 and mold layers 114 may be alternately and repeatedly formed. Therefore, a mold structure 122 composed of the interlayer insulating layers 112 and the mold layers 114 may be formed. A first upper insulating layer 120 may be formed on the mold structure 122. The first upper insulating layer 120 and the mold structure 122 may be patterned. As a result, the mold layers 114 of the mold structure 122 may be patterned to form pad regions 114p arranged in a stepped shape. Such pad regions 114p may be formed by carrying out repeatedly the photolithography and etching processes. Pad regions 114pa, a portion of the pad regions 114p, may be formed to have a larger planar area than other portions of the pad regions 114p, and may overlap a first through region 106. A portion of the mold layers 114 may be formed as a floating mold layer 114a.

Next, an insulating material covering the first upper insulating layer 120 and the mold structure 122 may be formed on the upper substrate 103, the first through region 106, and the intermediate insulating layer 109, and a planarization operation may be performed until the first upper insulating layer 120 is exposed. As a result, a second upper insulating layer 125 may be formed to be coplanar with the first upper insulating layer 120, and to cover the pad regions 114p and 114pa of the mold structure 122 and the intermediate insulating layer 109.

Figure 16A:
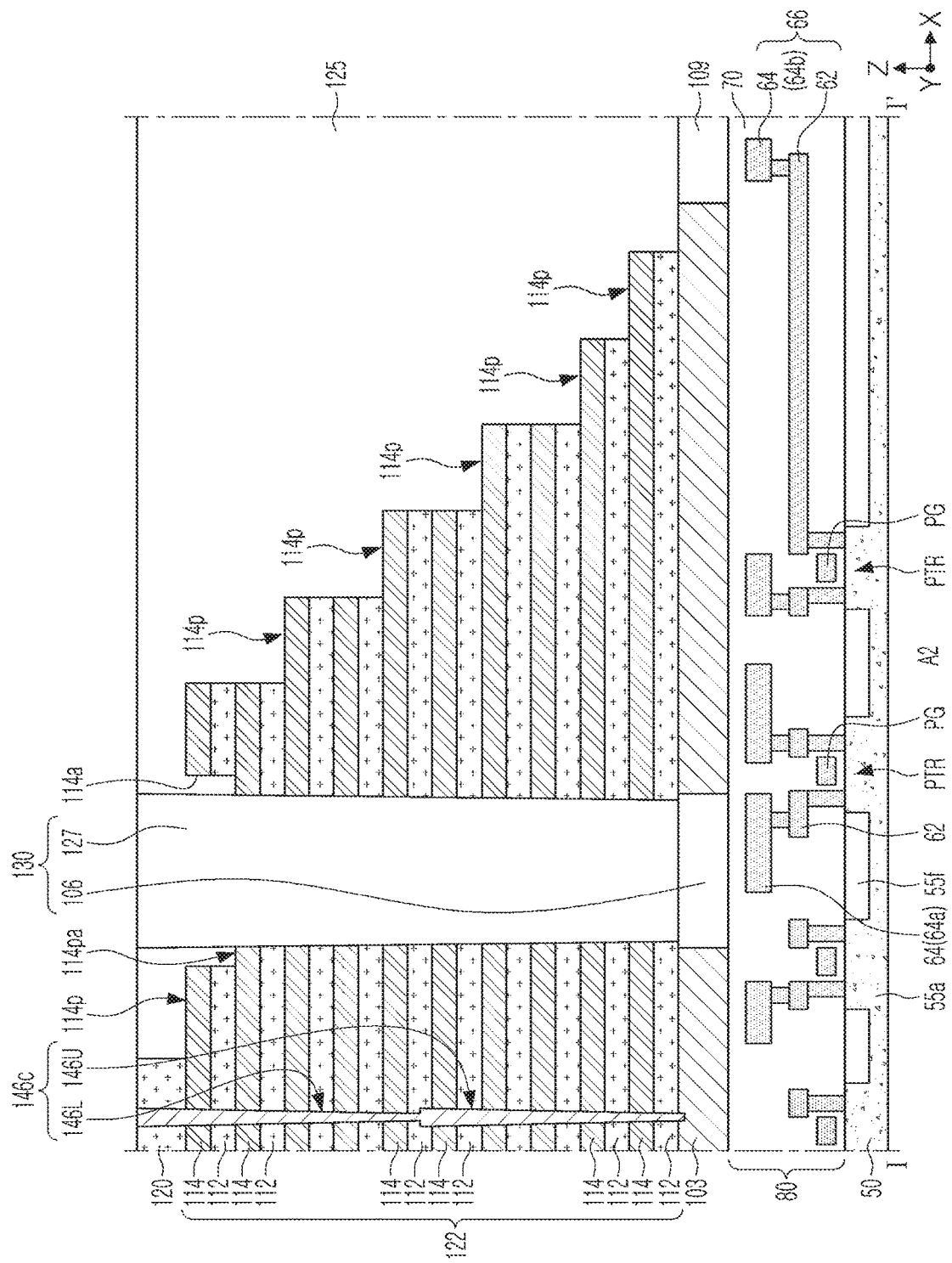
Figure 16B:
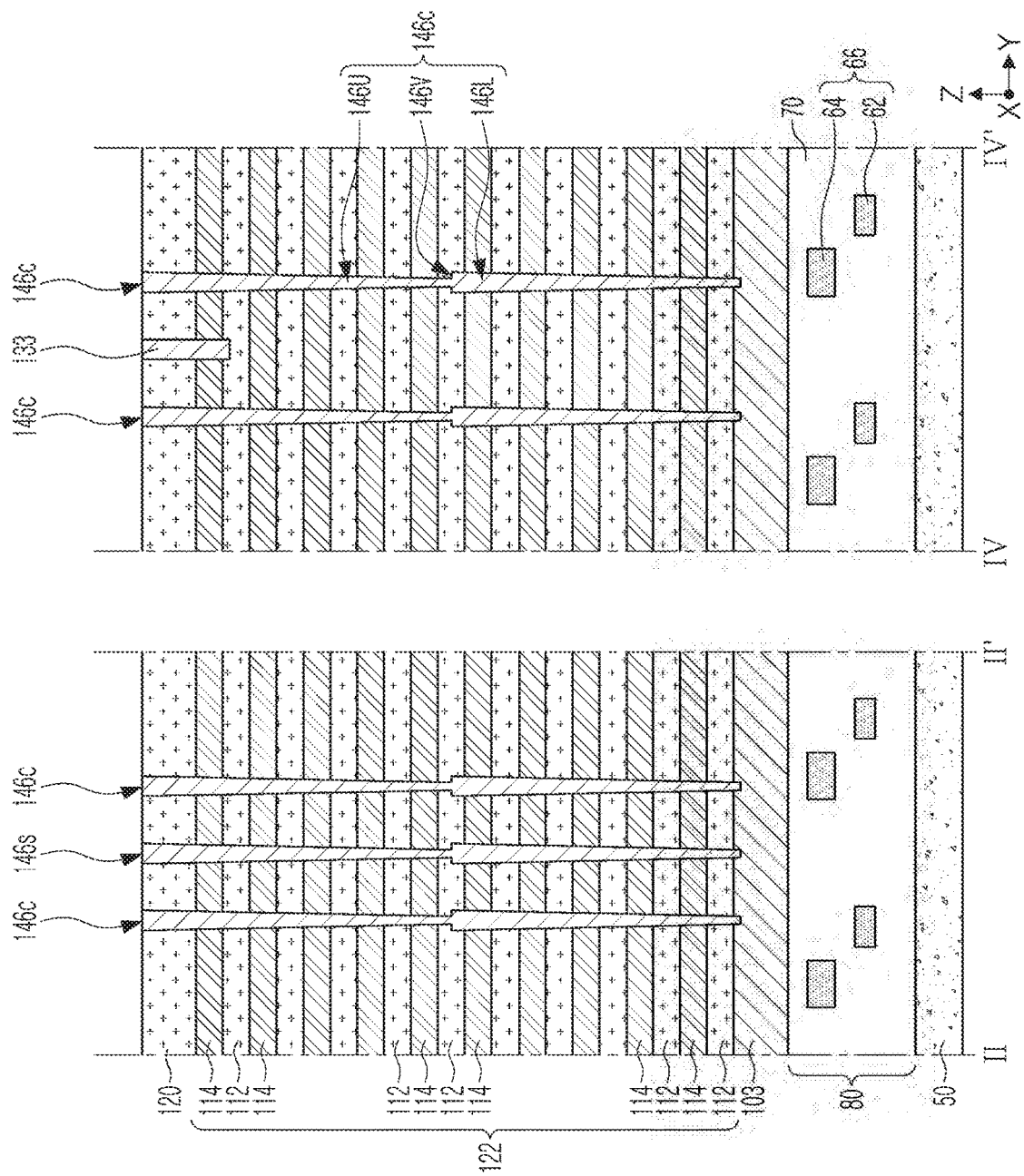

Referring to FIGS. 2, 16A, and 16B, an insulation pattern 133 passing through an uppermost mold layer 114 of the mold structure 122 and the first upper insulating layer 120 may be formed. The insulation pattern 133 may be formed of silicon oxide.

A second through region 127 may be formed to pass through the second upper insulating layer 125 and the mold structure 122. The second through region 127 may overlap the first through region 106. The second through region 127 may be formed of silicon oxide. Hereinafter, for convenience of description, the first and second through regions 103 and 127 will be referred to as a through region 130.

Portions of the first upper insulating layer 120 and the mold structure 122 may be etched to form preliminary channel holes exposing the sacrificial vertical structures 118. The sacrificial vertical structures 118 may be removed through the preliminary channel holes to form channel holes passing through the mold structure 122, and vertical channel structures 146c and second vertical support structures 146s filling the channel holes may be then formed. The vertical channel structures 146c and the second vertical support structures 146s may have the same structure as that described in FIG. 4A. For example, the forming operation of the vertical channel structures 146c and the second vertical support structures 146s may include forming semiconductor patterns (e.g., semiconductor patterns 136 in FIG. 4A) in the lower region of the channel holes, forming gate dielectric structures 138 on the sidewalls of the channel holes on the semiconductor patterns (e.g., semiconductor patterns 136 in FIG. 4A), forming channel semiconductor layers (e.g., semiconductor layers 140 in FIG. 4A) covering the inner walls of the channel holes, forming a vertical core pattern (e.g., vertical core pattern 142 in FIG. 4A) partially filling the channel holes, and forming pad patterns (e.g., pad patterns 144 in FIG. 4A) filling the remaining portion of the channel holes. The forming operation of the gate dielectric structures 138 may include forming a blocking dielectric layer 138c, a data storage layer 138b, and a tunnel dielectric layer 138a in sequence.

In an exemplary embodiment, after forming the second through region 127, the vertical channel structures 146c and the second vertical support structures 146s may be formed. The technical concept is not limited thereto. For example, after forming the vertical channel structures 146c and the second vertical support structures 146s, the second through region 127 may be formed.

Figure 17A:
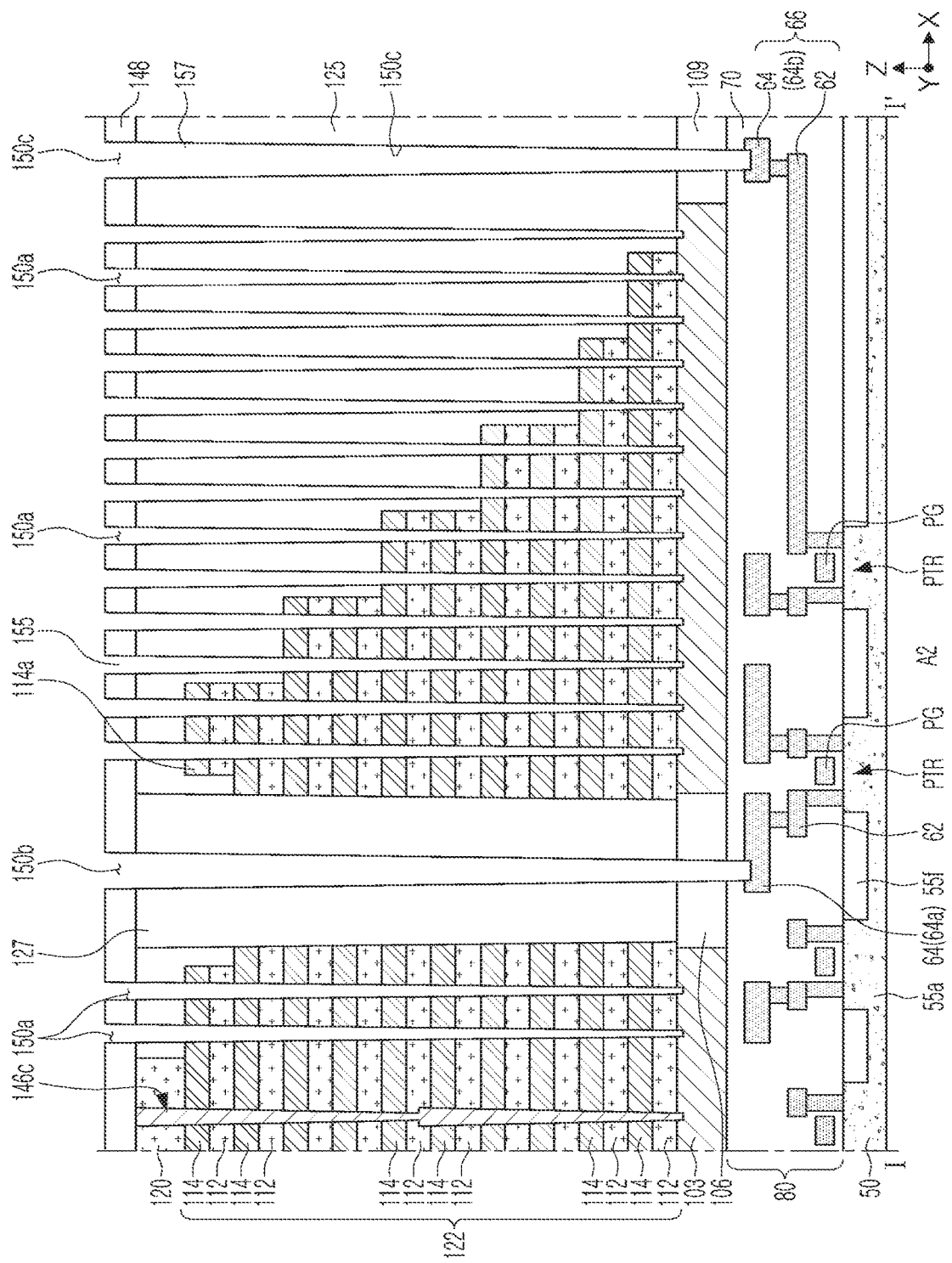
Figure 17B:
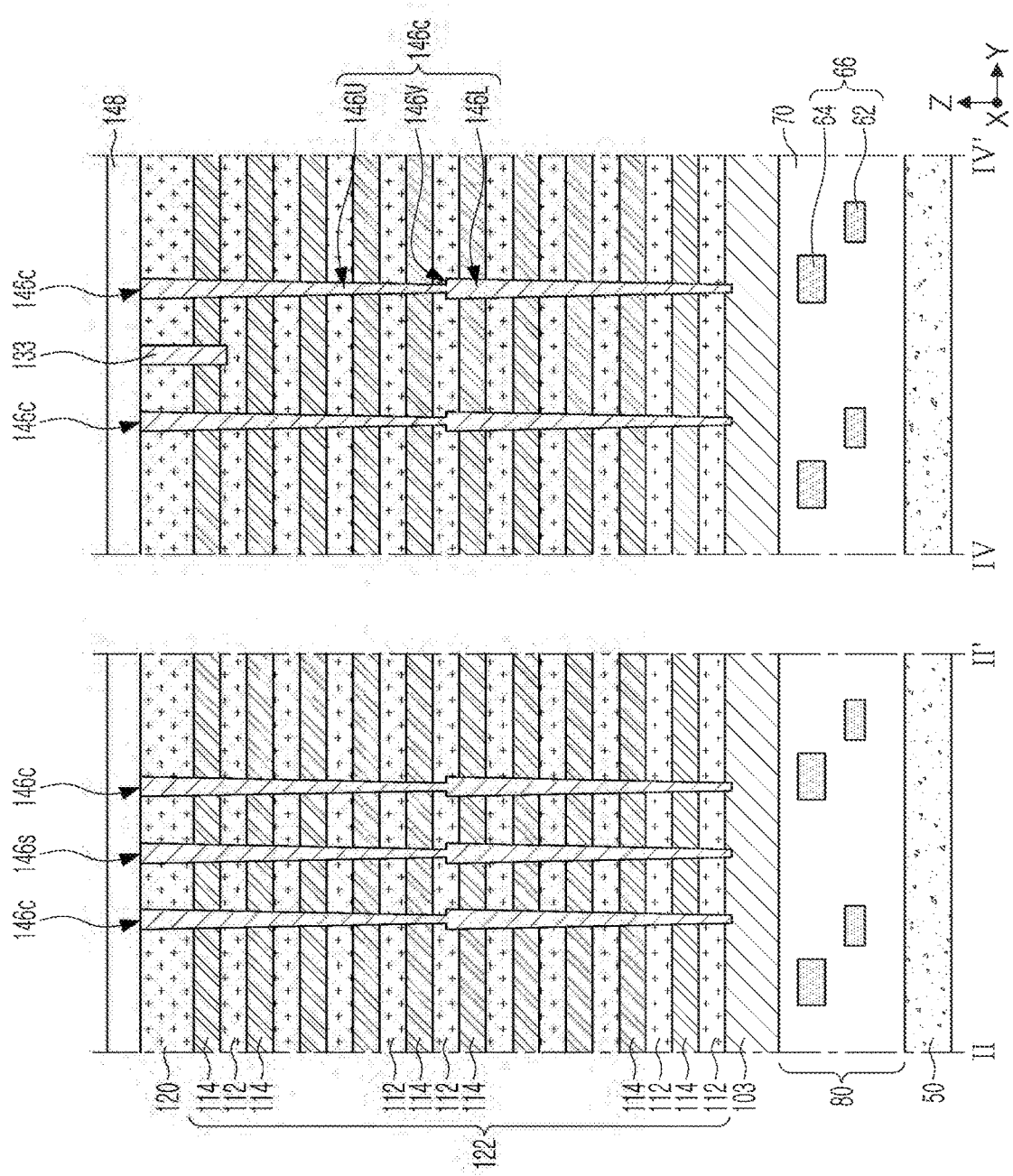

Referring to FIGS. 2, 17A, and 17B, a first capping insulating layer 148 may be formed. Then, support holes 150a, a first internal peripheral contact hole 150b, and an external peripheral contact hole 150c may be simultaneously formed by performing a patterning process. The support holes 150a may pass through the first capping insulating layer 148, the second upper insulating layer 125, and the mold structure 122 in sequence to expose the upper substrate 103. The first internal peripheral contact hole 150b may pass through the first capping insulating layer 148 and the through region 130 in sequence, and may extend into the lower insulating layer 70 to expose the first internal pad portion 64a of the upper peripheral wiring line 64. The external peripheral contact hole 150c may pass through the first capping insulating layer 148, the second upper insulating layer 125, and the intermediate insulating layer 109 in sequence, and may extend into the lower insulating layer 70 to expose the second internal pad portion 64b of the upper peripheral wiring line 64.

Figure 18:
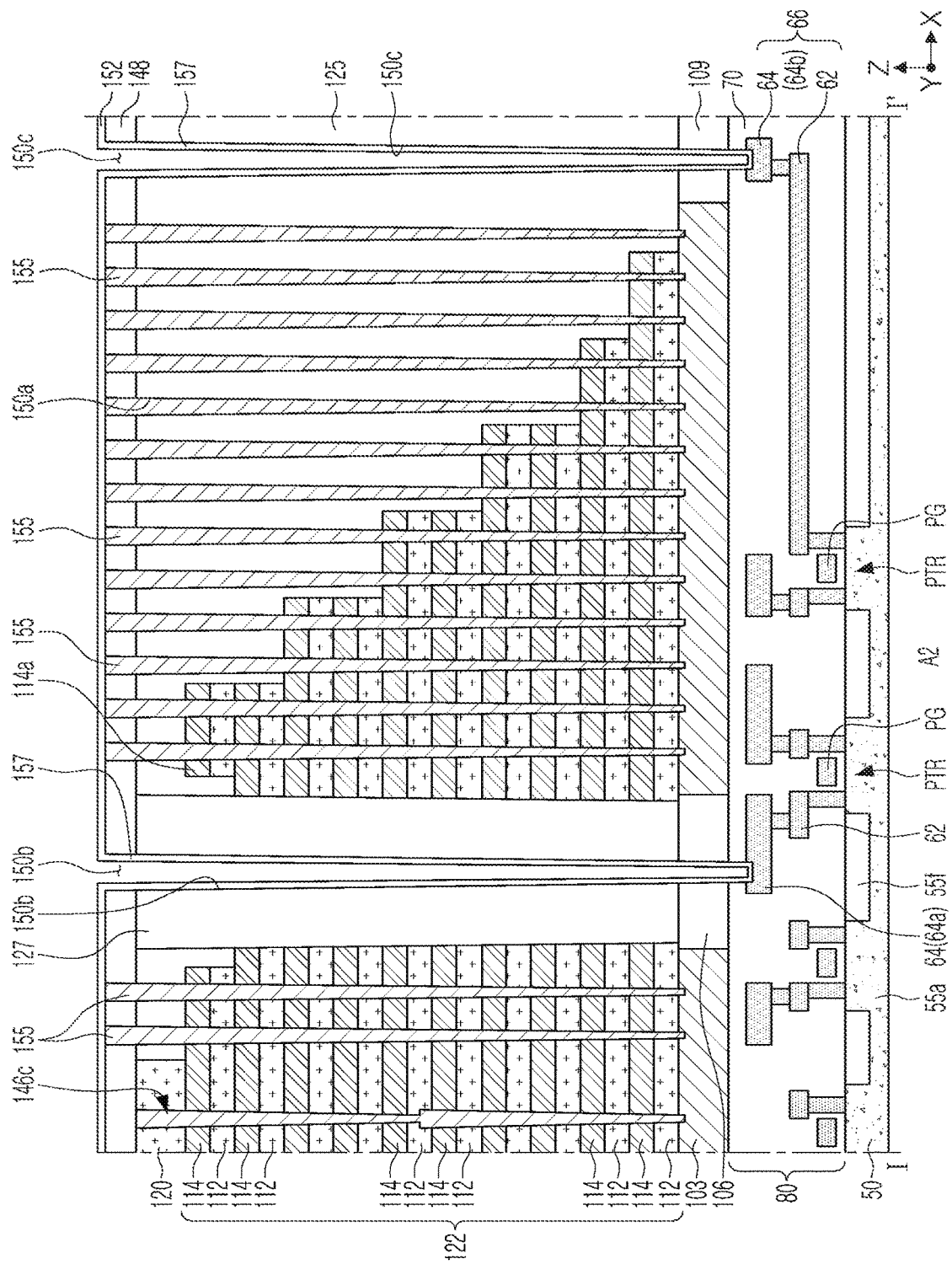

Referring to FIGS. 2A and 18, the deposition process may be performed on the resultant structure. For example, an atomic layer deposition (ALD) process may be performed to fill the support holes 150a, conformally cover inner walls of the first internal peripheral contact hole 150b and the external peripheral contact hole 150c, and form a material layer 152 covering the first capping insulating layer 148.

A material layer 152 filling the support holes 150a may be referred to as first vertical support structures 155. A material layer 152 conformally covering inner walls of the first internal peripheral contact hole 150b and the external peripheral contact hole 150c may be referred to as a contact spacer 157. The first vertical support structures 155 and the contact spacer 157 may be formed of silicon oxide, which is formed by the same semiconductor process, for example, an atomic layer deposition process. Therefore, since the first vertical support structures 155 and the contact spacer 157 are formed simultaneously with a semiconductor process, for example, an atomic layer deposition process, a material of the first vertical support structures 155 and a material of the contact spacers 157 may have the same composition and properties as each other.

Figure 19:
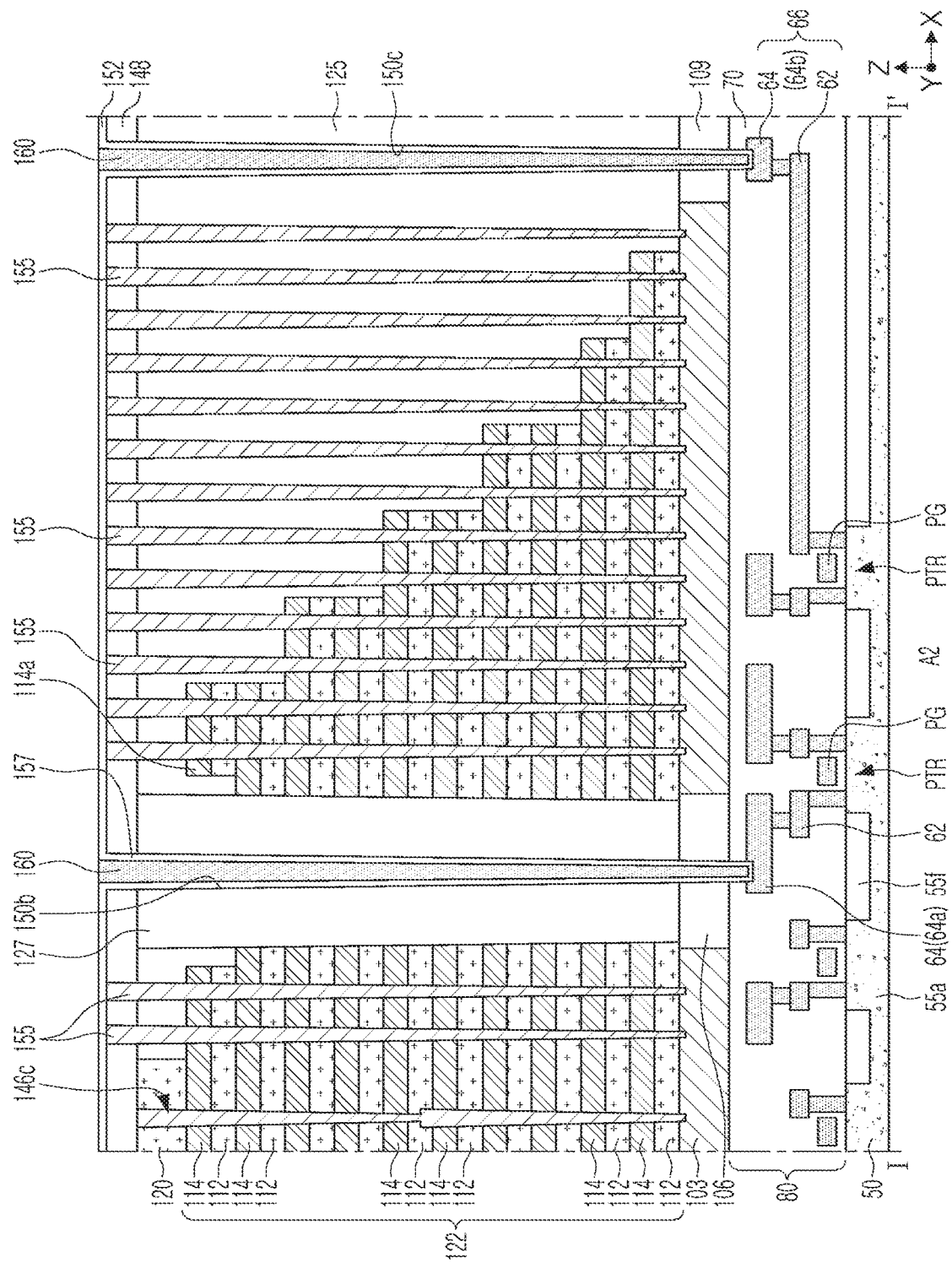

Referring to FIGS. 2A and 19, sacrificial pillars 160 may be formed on the contact spacer 157 to fill remaining portions of the first internal peripheral contact hole 150b and the external peripheral contact hole 150c. The sacrificial pillars 160 may be formed of polysilicon.

Figure 20A:
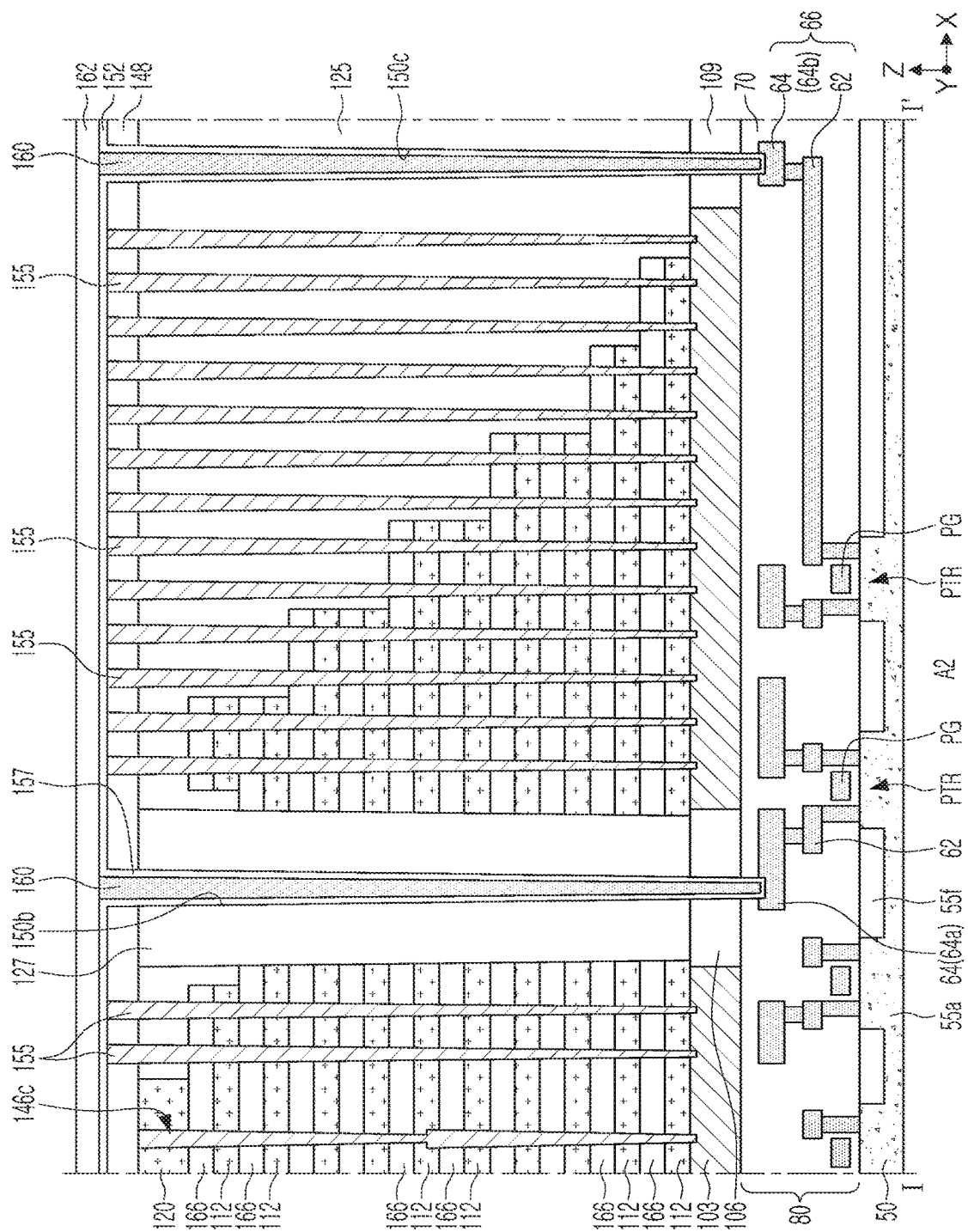
Figure 20B:
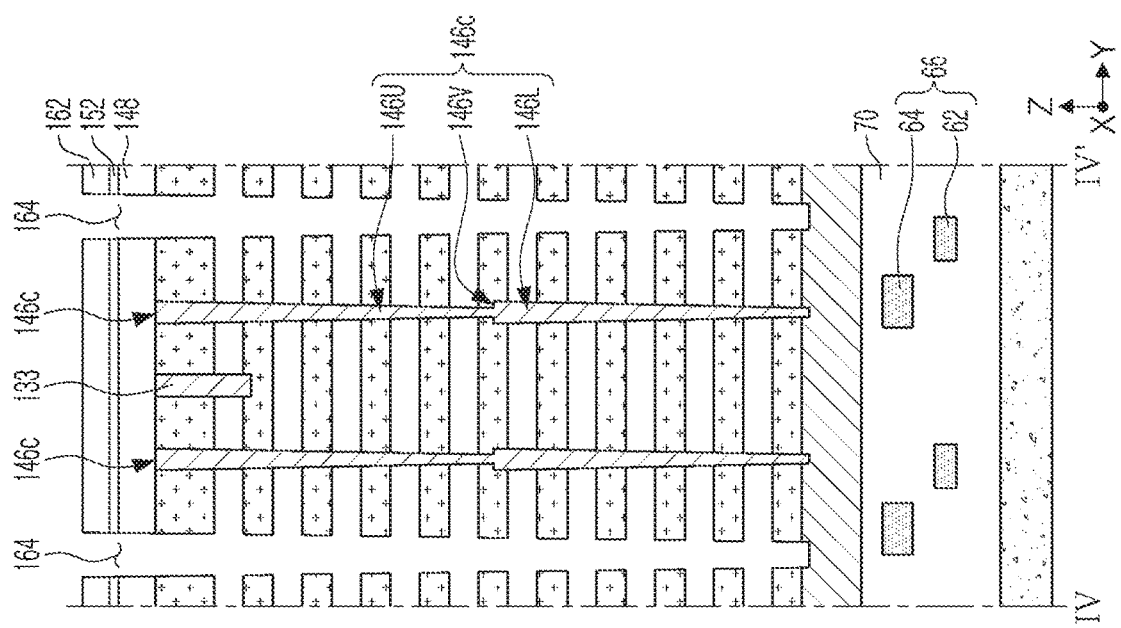

Referring to FIGS. 2, 20A, and 20B, a second capping insulating layer 162 may be formed on the material layer 152, and a patterning process may be performed to form separation trenches 164 exposing the upper substrate 103, and exposing the mold layers (e.g., mold layers 114 in FIG. 19). Then, the mold layers (e.g., mold layers 114 of FIG. 19) exposed by the separation trenches 164 may be removed to form empty spaces 166.

The first vertical support structures 155 may prevent the interlayer insulating layers 112 from being deformed or bent by the empty spaces 166 in the second region A2, and the second vertical support structures 146s, together with the vertical channel structures 146c, may prevent the interlayer insulating layers 112 from being deformed or bent by the empty spaces 166 in the first region A1.

Therefore, since the first vertical support structures 155 and the second vertical support structures 146s prevent the interlayer insulating layers 112 from being deformed or bent by the empty spaces 166, the defect rate of a semiconductor device may be reduced, and the productivity may be improved.

Figure 21A:
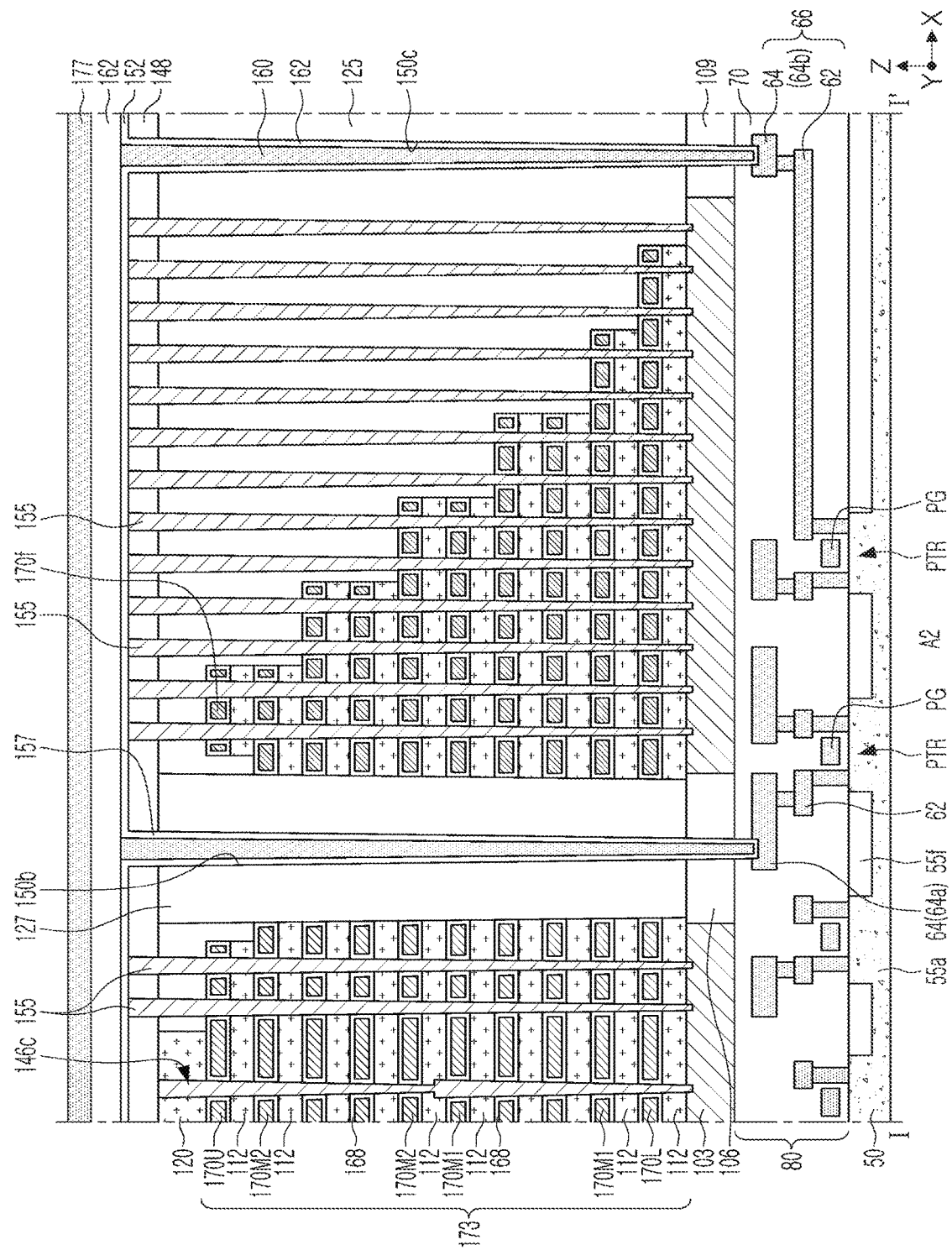
Figure 21B:
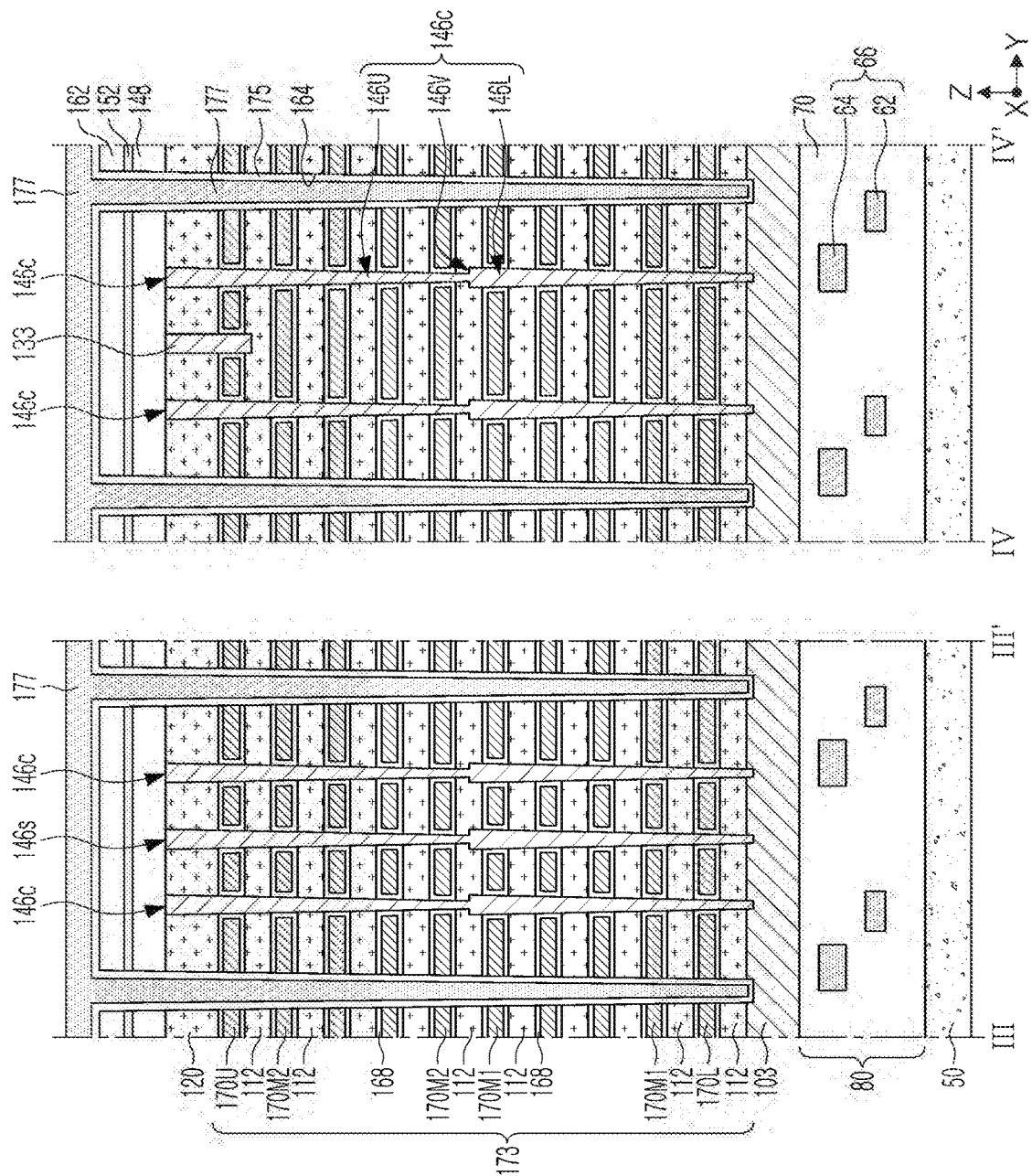

Referring to FIGS. 2, 21A, and 21B, an additional dielectric layer 168 conformally formed in the empty spaces (e.g., empty spaces 166 in FIGS. 20A and 20B) and gate horizontal patterns 170L, 170M1, 170M2, and 170U filling the empty spaces (166 in FIGS. 20A and 20B) may be formed in sequence.

A separation spacer 175 conformally covering the inner walls of the separation trenches 164 and covering the second capping insulating layer 162 may be formed. The separation spacer 175 may be formed of silicon oxide.

A sacrificial layer 177 may then be formed on the separation spacers 175 to fill the separation trenches 164 and cover the second capping insulating layer 162. The sacrificial layer 177 may be formed of the same material as the sacrificial pillars 160 in the first internal peripheral contact hole 150b and the external peripheral contact hole 150c, for example, polysilicon.

Figure 22A:
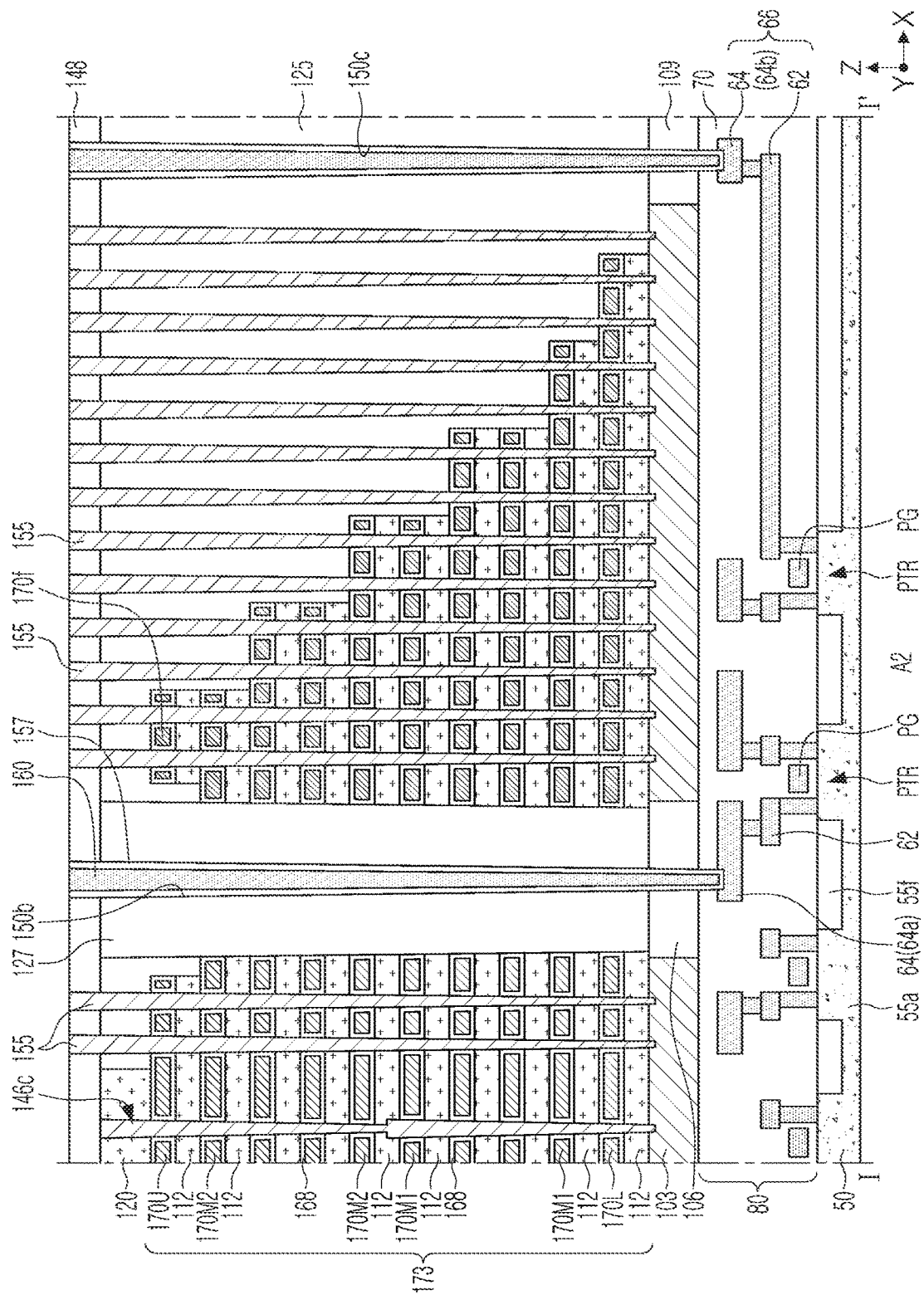
Figure 22B:
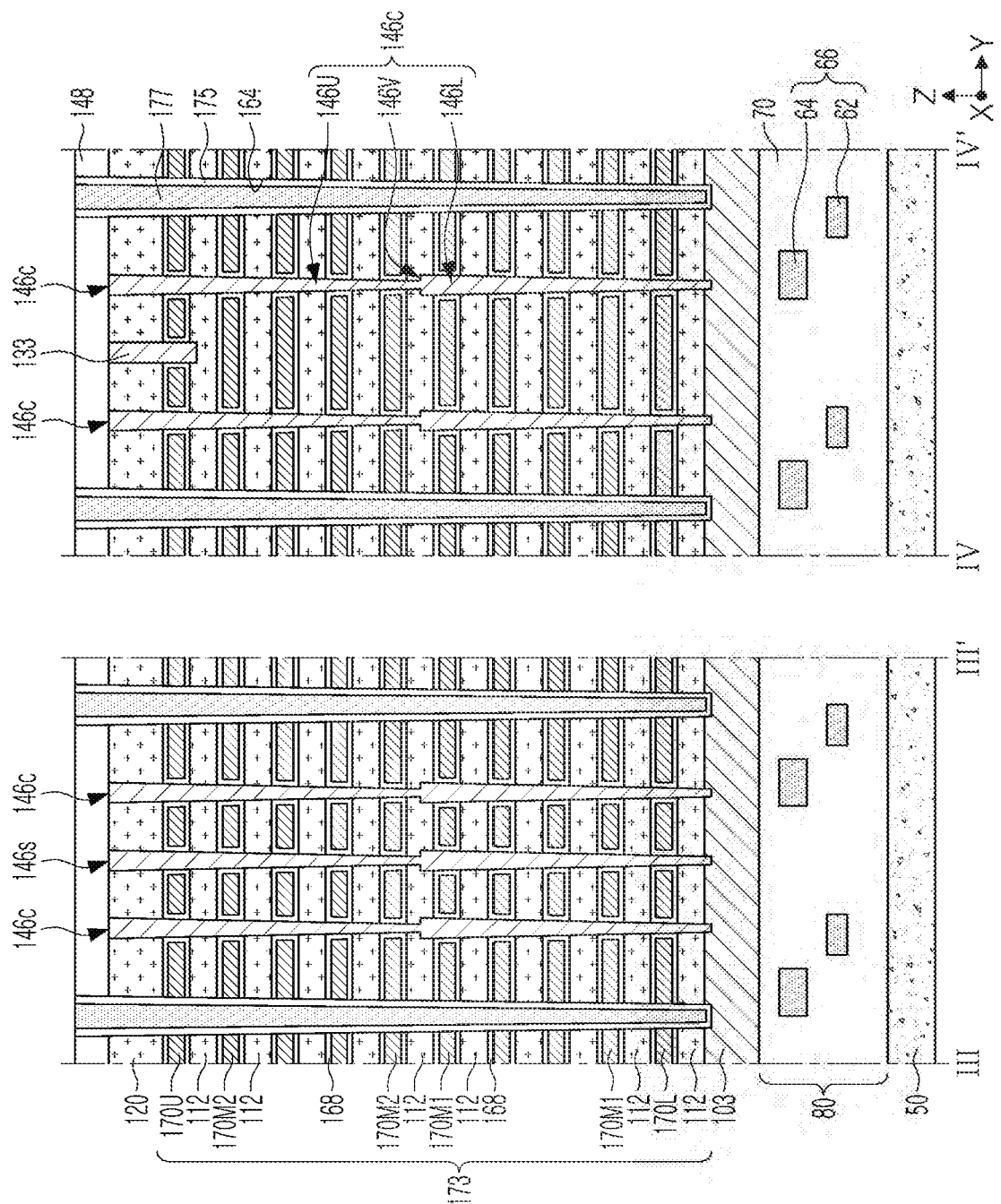

Referring to FIGS. 2, 22A, and 22B, a planarization process (e.g., a chemical mechanical polishing process) may be performed until upper surfaces of the sacrificial layer 177 in the separation trenches 164, as well as upper surfaces of the sacrificial pillars 160 in the first internal peripheral contact hole 150b and the external peripheral contact hole 150c, are simultaneously exposed. For example, the sacrificial layer 177 and the sacrificial pillars 160 may be simultaneously exposed by the planarization process until the first capping insulating layer 148 is exposed.

Figure 23A:
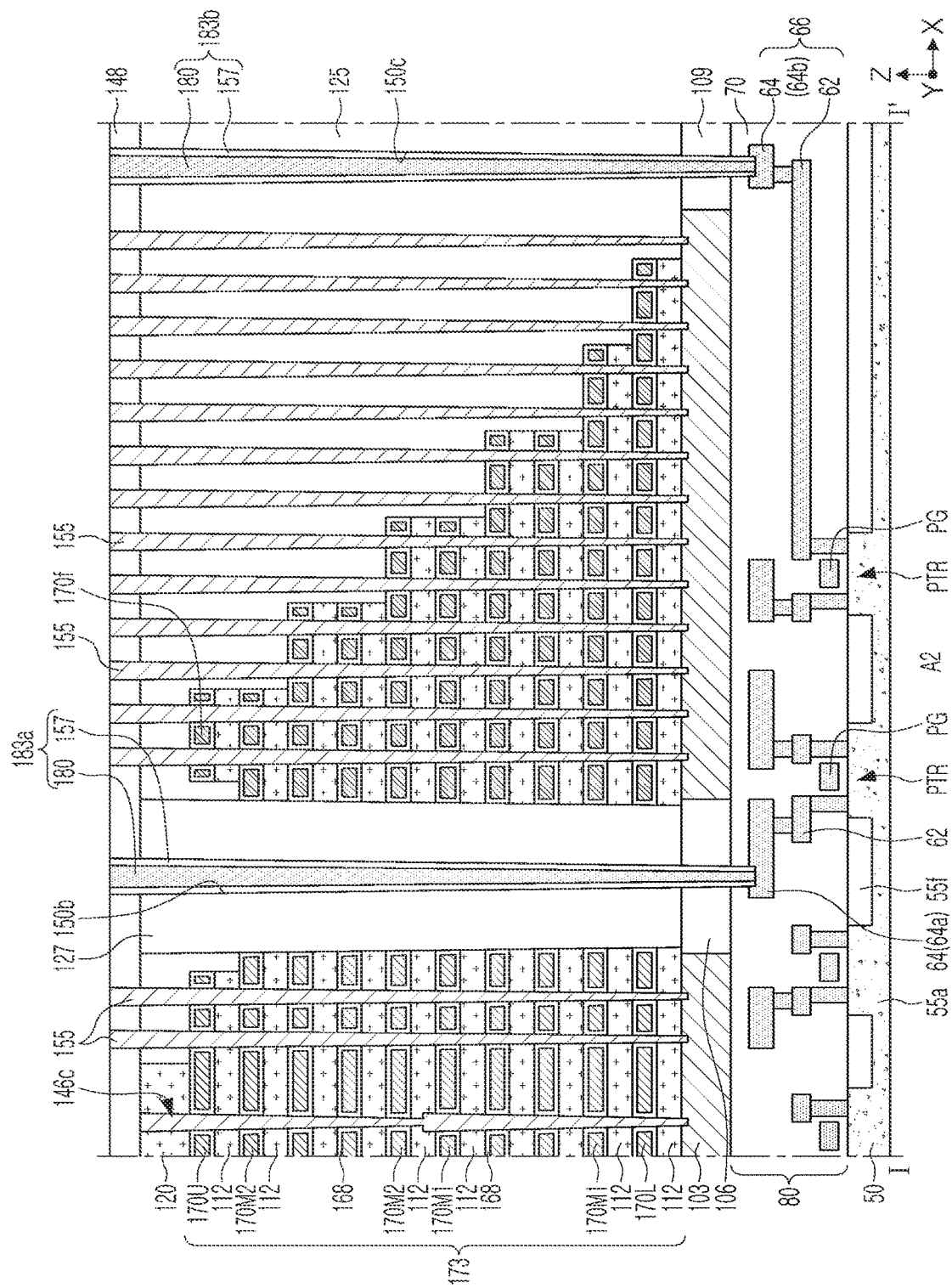
Figure 23B:
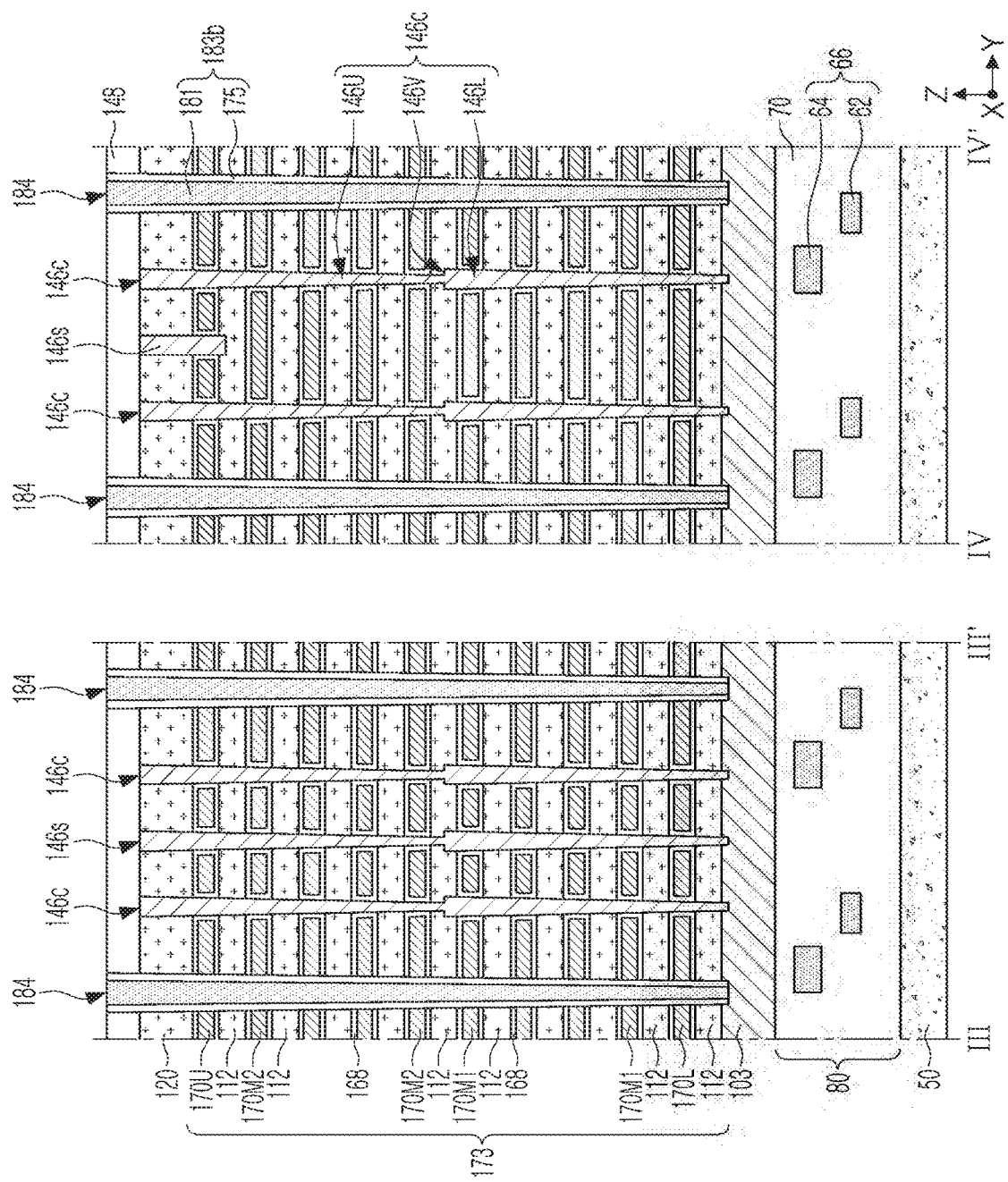

Referring to FIGS. 2, 23A, and 23B, the separation spacer 175 and the contact spacer 157 may be anisotropically etched to expose the upper substrate 103 on a lower portion of the separation trenches 164, and to expose the first internal pad portion 64a on a lower portion of the first internal peripheral contact hole 150b and the external pad portion 64b on a lower portion of the external peripheral contact hole 150c at the same time. Subsequently, operations of depositing a conductive material and planarizing the conductive material may be performed. As a result, the conductive material may remain in the separation trenches 164 to form the separation core pattern 181, and the conductive material may remain in the first internal peripheral contact hole 150b and the external peripheral contact hole 150c to form the conductive pillars 180. Therefore, the separation core pattern 181 and the conductive pillars 180 may be formed of the same material as each other.

Therefore, the separation structures 184 including the separation core pattern 181 and the separation spacers 175 may be formed in the separation trenches 164, and a first internal peripheral contact structure 183a and an external peripheral contact structure 183b including the contact spacer 157 and the conductive pillar 180 may be formed in the first internal peripheral contact hole 150b and the external nal peripheral contact hole 150c.

The separation structures 184, the first internal peripheral contact structure 183a, and the external peripheral contact structures 183b may be formed by planarizing the conductive material. Therefore, the upper surfaces of the separation structures 184, the first internal peripheral contact structure 183a, and the external peripheral contact structure 183b may be coplanar with each other.

In an exemplary embodiment, the first vertical support structures 155 may be formed to have upper surfaces coplanar with the upper surface of the separation structures 184, the first internal peripheral contact structures 183a, and the external peripheral contact structures 183b, while planarizing the conductive material.

Referring again to FIGS. 2A to 3D, a second capping insulating layer 185 and a third capping insulating layer 187 may be sequentially formed on the resultant structure. Next, contact plugs 189 may be formed on the pad regions P of the gate horizontal patterns 170L, 170M1, 170M2, and 170U, and the bit line contact plugs 191 may be formed on the vertical channel structures 146c. A first peripheral contact plug 192a may be formed on the first internal peripheral contact structure 183a, and a second peripheral contact plug 192b may be formed on the external peripheral contact structure 183b. The wiring lines may then be formed on the third capping insulating layer 187. For example, bit lines 193b, a string selection gate connection wiring line 193s, word line connection wire lines 193w, ground selection gate connection wire lines 193g, a first internal peripheral connection wiring line 194a, and an external peripheral connection wiring line 194b may be formed on the third capping insulating layer 187. Therefore, a semiconductor device as described in FIGS. 2A to 3D may be formed.

According to an example of the exemplary method described above, the separation structures 184 may be formed to have upper surfaces coplanar with the upper surfaces of the first internal peripheral contact structure 183a and the external peripheral contact structures 183b. According to some embodiments, as described with reference to FIGS. 5 and 10, a separation structure (e.g., separation structures 284 in FIG. 5 and FIG. 10) may be provided to have an upper surface disposed on a level higher than the upper surfaces of the first internal peripheral contact structure 183a and the external peripheral contact structure 183b. Exemplary embodiments of a method of forming such separation structures (e.g., separation structures 284 in FIGS. 5 and 10) will be described with reference to FIGS. 24 to 26B. In FIGS. 24 to 26B, FIGS. 24, 25A, and 26A are cross-sectional views illustrating a region taken along line I-I' in FIG. 2, and FIGS. 25B and 26B are cross-sectional views illustrating regions taken along line and line IV-IV' in FIG. 2.

Figure 24:
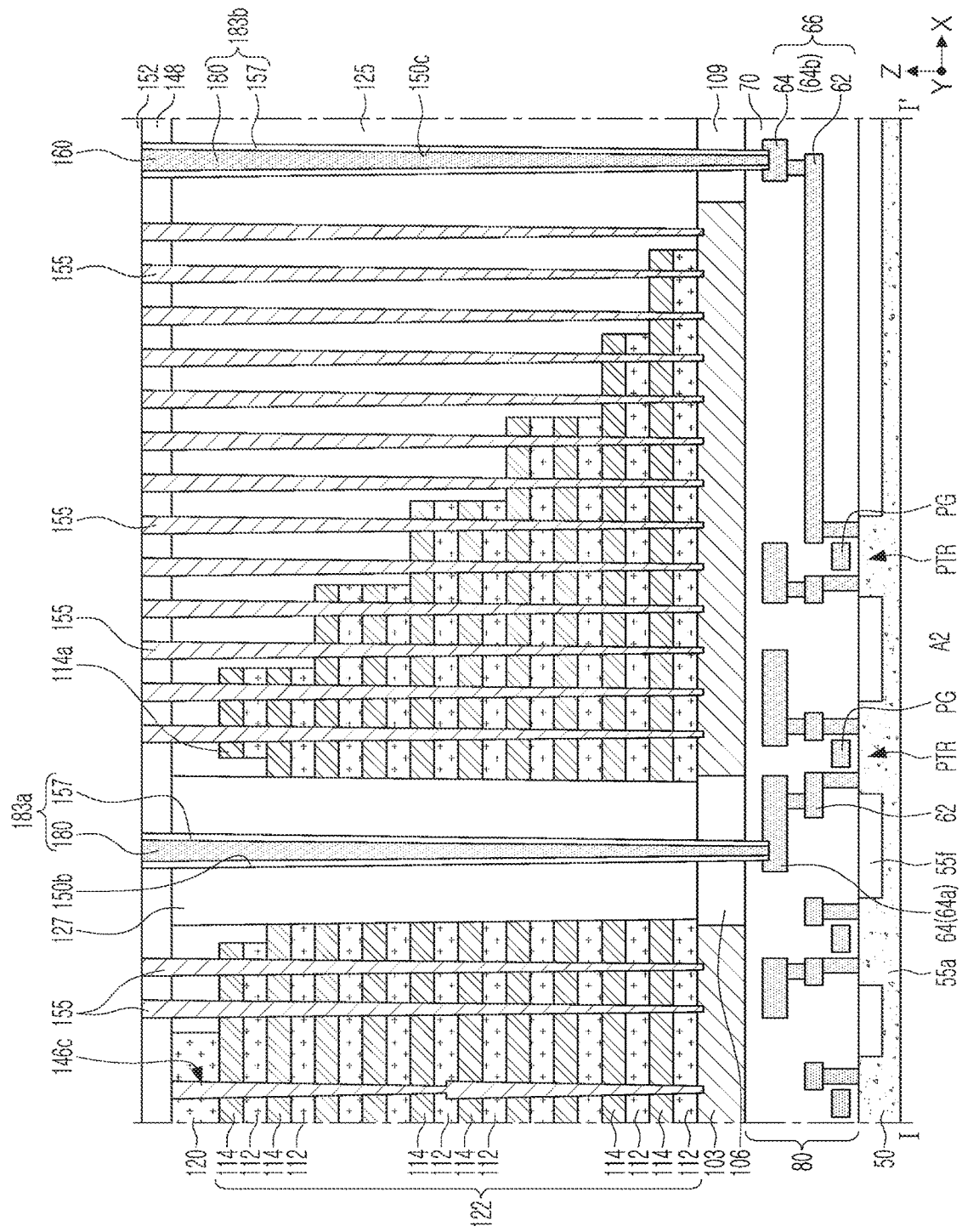
FIGS. 24, 25A to 25B, and 26A to 26B are cross-sectional views illustrating a modified embodiment of a method for forming a three-dimensional semiconductor device, according to an exemplary embodiment.

Referring to FIGS. 2A and 24, the material layer (e.g., material layer 152 in FIG. 18) may be formed by the method explained with reference to FIGS. 14A to 18 described above. Subsequently, the material layer (e.g., material layer 152 in FIG. 18) may be anisotropically etched to expose the first internal pad portion 64a on a lower portion of the first internal peripheral contact hole 150b and the external pad portion 64b on a lower portion of the external peripheral contact hole 150c. The material layer (e.g., material layer 152 in FIG. 18) may be anisotropically etched to form the contact spacer 157 that remains on the sidewalls of the first internal peripheral contact hole 150b and the external peripheral contact hole 150c. When the contact spacer 157 is formed, the same first vertical support structures 155 as described in FIG. 18 may be formed.

Subsequently, a conductive material may be deposited, and a planarization process may be performed to form a conductive pillar 180 in the first internal peripheral contact hole 150b and the external peripheral contact hole 150c. As a result, a first internal peripheral contact structure 183a and an external peripheral contact structure 183b including the contact spacer 157 and the conductive pillar 180 in the first internal peripheral contact hole 150b and the external peripheral contact hole 150c, respectively, may be formed. Upper surfaces of the first internal peripheral contact structure 183a and the external peripheral contact structure 183b may be formed to be coplanar with upper surfaces of the first vertical support structures 155 by the planarization process.

Figure 25A:
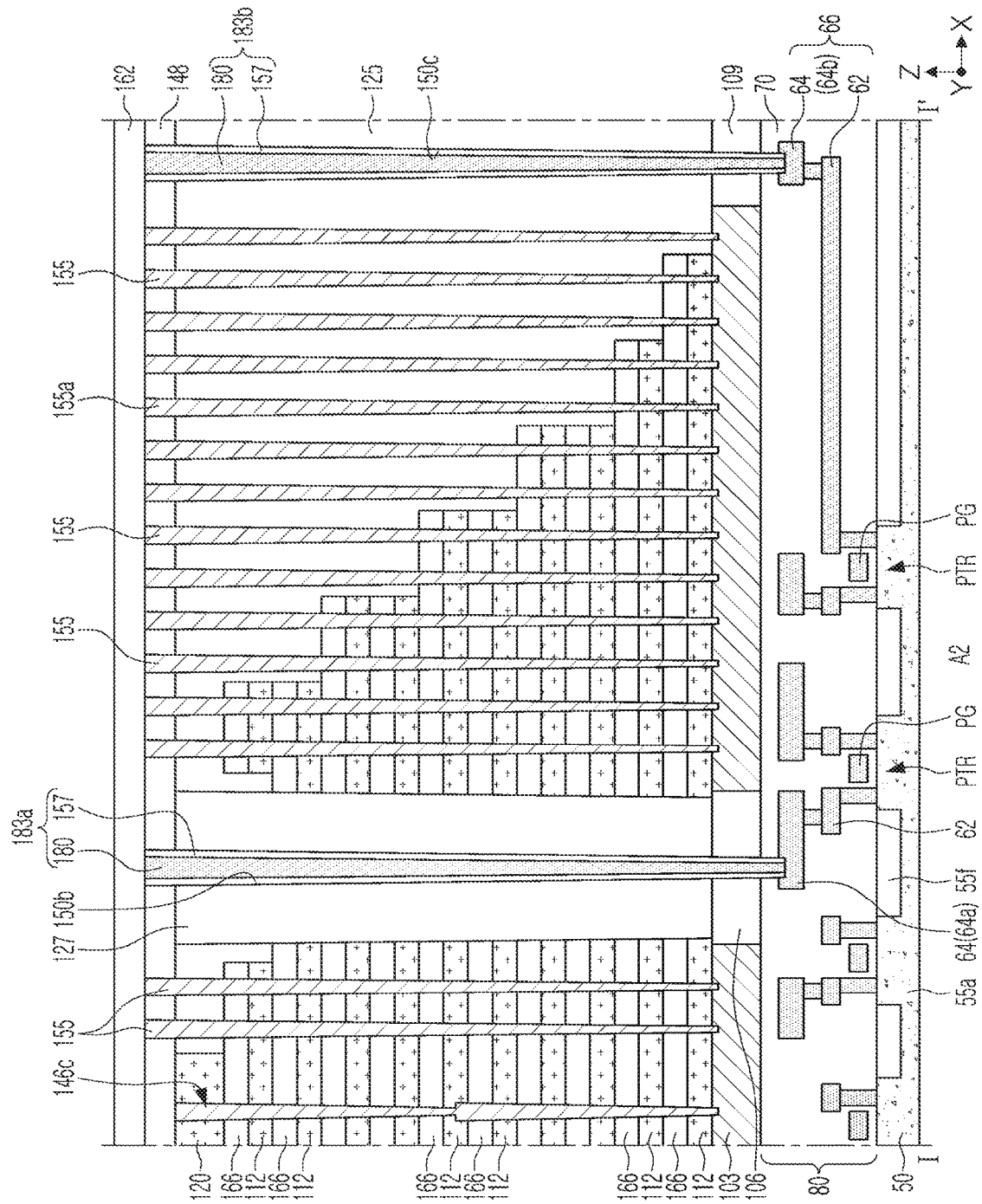
Figure 25B:
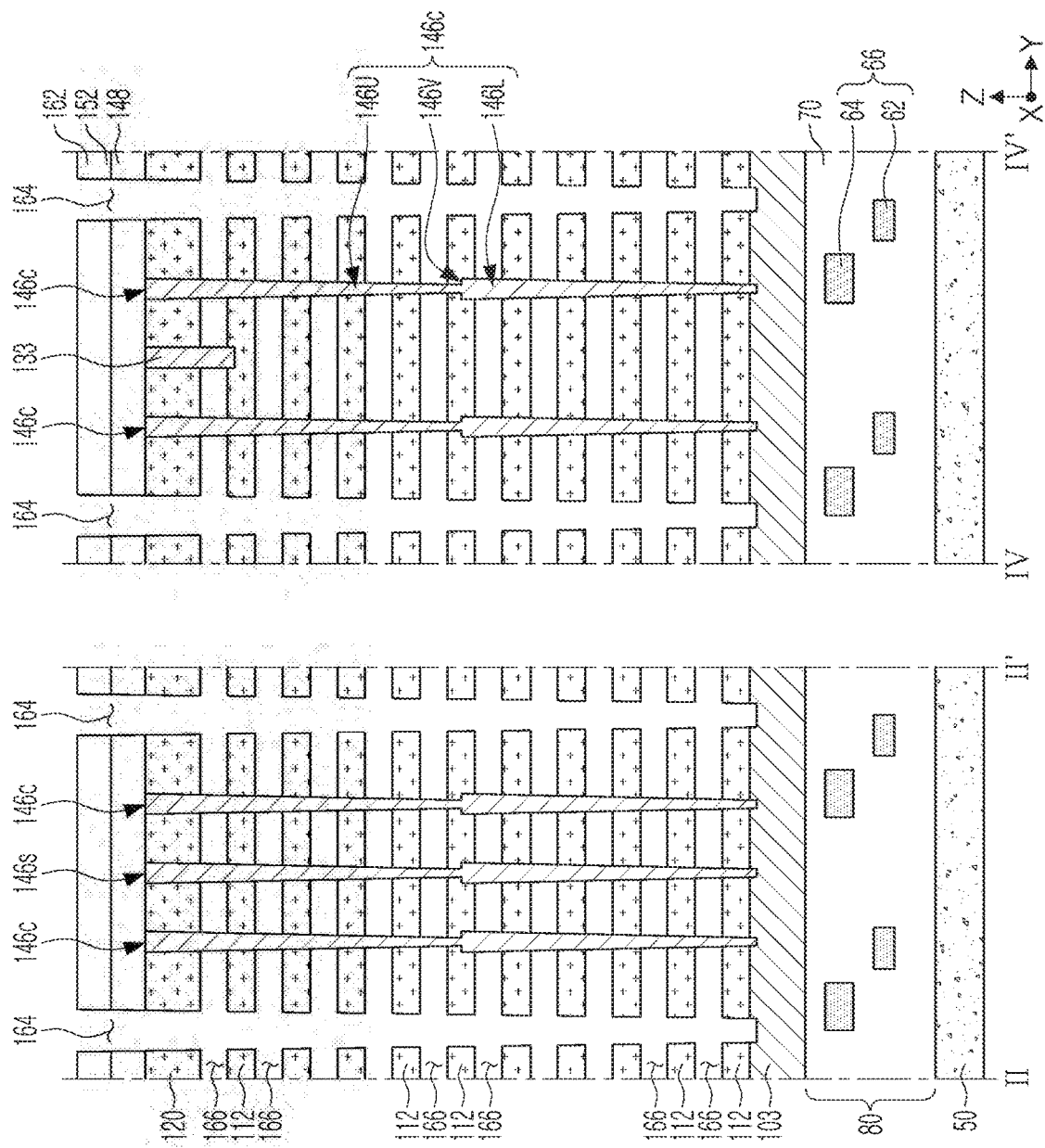

Referring to FIGS. 2, 25A, and 25B, a second capping insulating layer 162 may then be formed, and a patterning process may be performed to form separation trenches 164 exposing the upper substrate 103, and exposing the mold layers (e.g., mold layers 114 in FIG. 19). For example, the separation trenches 164 may extend in a downward direction through the mold structure 122. The mold layers 114 exposed by the separation trenches 164 may be removed to form the empty spaces 166, in the same manner as described in FIGS. 20A and 20B.

Figure 26A:
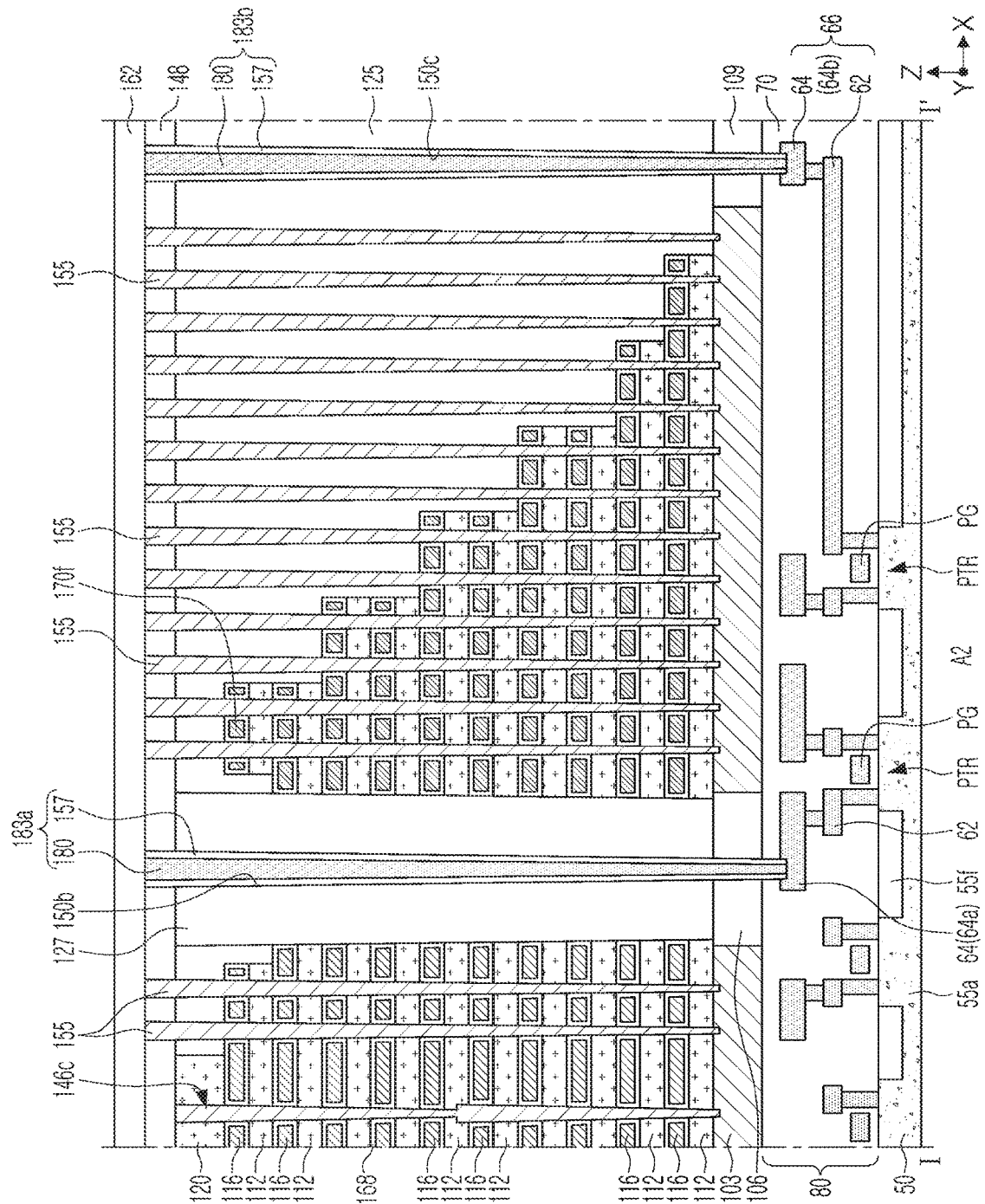
Figure 26B:
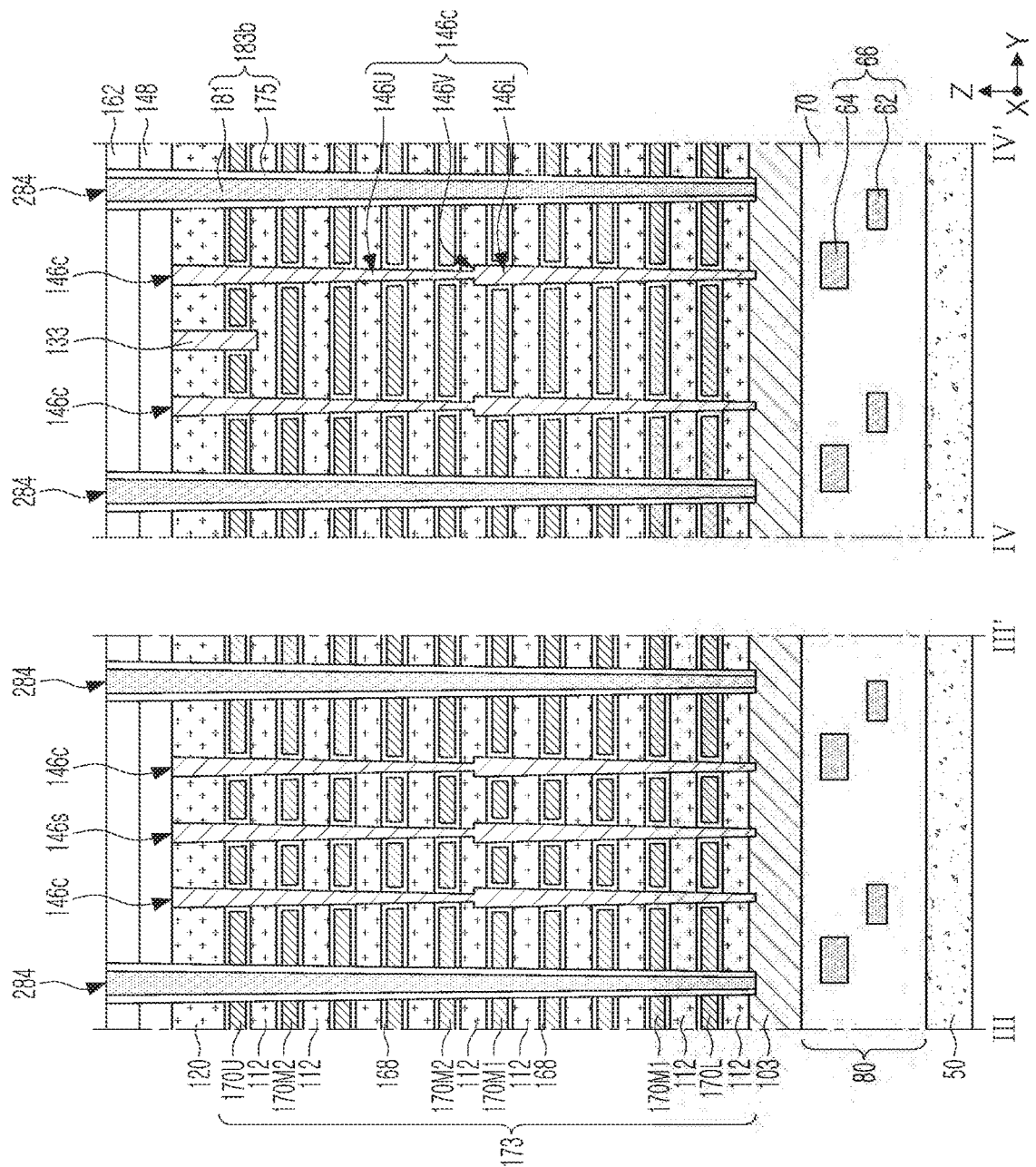

Referring to FIGS. 2, 26A, and 26B, a further dielectric layer 168 conformally formed in the empty spaces (e.g., empty spaces 166 in FIGS. 25A and 25B) and gate horizontal patterns 170L, 170M1, 170M2, and 170U filling the empty spaces (e.g., empty spaces 166 in FIGS. 25A and 25B) may be formed in sequence. Then, a separation spacer 175 may be formed on the sidewalls of the separation trenches 164 to form a material layer that fills the separation trenches 164 and covers the second capping insulating layer 162. The material layer may be planarized until the second capping insulating layer 162 may be exposed to form the remaining material layer, i.e., the separation core pattern 181 in the separation trenches 164. Therefore, separation structures 284 including the separation spacers 175 and the separation core patterns 181 may be formed in the separation trenches 164. Therefore, the separation structures 284 having upper surfaces disposed on a level higher than the upper surfaces of the first internal peripheral contact structure 183a and the external peripheral contact structure 183b may be formed.

Figure 27:
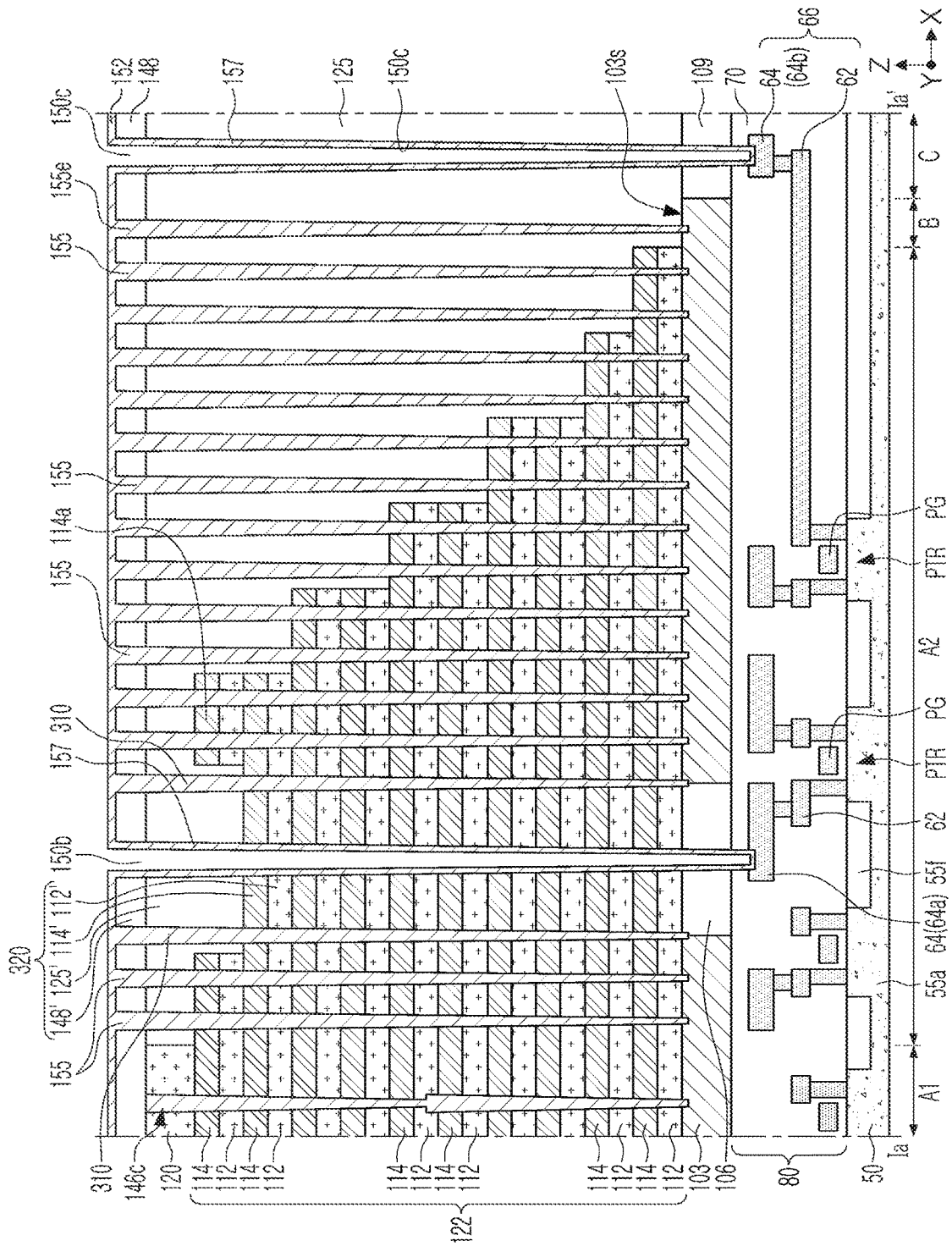
FIG. 27 is a cross-sectional view illustrating a modified embodiment of a method for forming a three-dimensional semiconductor device, according to an exemplary embodiment.

In the embodiments explained in FIGS. 6 and 7 described above, an exemplary embodiment of a method of forming the dam structure 310 and the second through region 320 will be described with reference to FIG. 27. FIG. 27 is a cross-sectional view illustrating a region taken along the line Ia-Ia' in FIG. 6.

Figure 15:
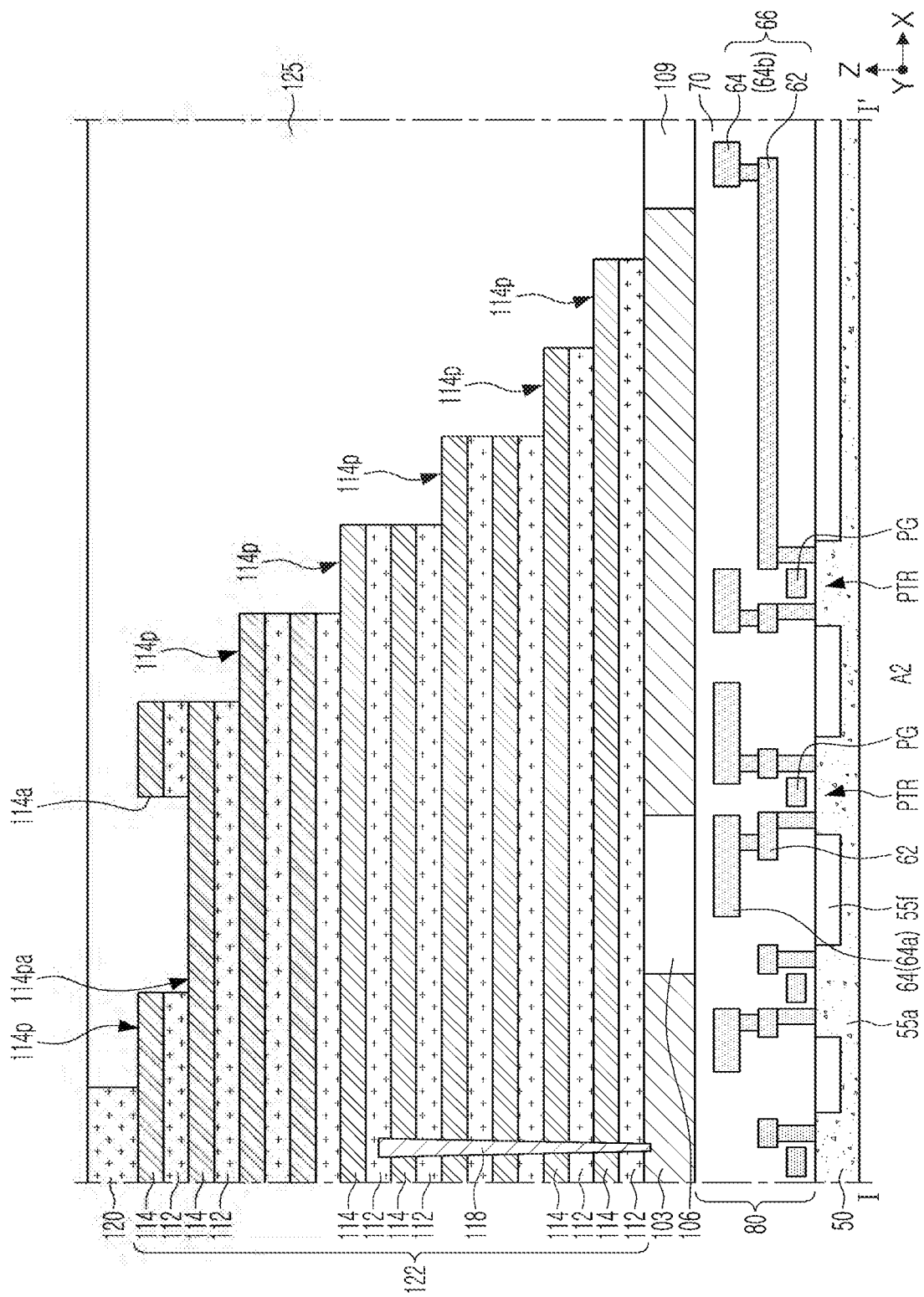

Referring to FIGS. 6 and 27, the second upper insulating layer 125 described in FIG. 15 may be formed by the method described in FIGS. 14A to 15. Subsequently, the operation of forming the second through region 127 described in FIG. 16A may be omitted. Then, the support holes 150a, the first internal peripheral contact holes 150b, and the external peripheral contact hole 150c may be formed, and a groove surrounding the first internal peripheral contact hole 150b may be formed at the same time. For example, the location of the groove may correspond to the location of the dam 310 that is subsequently formed in the groove. The groove may pass through the first capping insulating layer 148, the second upper insulating layer 125, and the mold structure 122 in sequence, in the same manner as the support holes 150a.

Subsequently, the same material layer 152 as described in FIG. 18 may be formed. The material layer 152 may fill the support holes 150a and the groove, may conformally cover the inner walls of the first internal peripheral contact hole 150b and the external peripheral contact hole 150c, and may cover the first capping insulating layer 148.

The material layer 152 filling the support holes 150a may be referred to as first vertical support structures 155, the material layer 152 filling the grooves may be referred to as a dam structure 310, and the material layer 152 conformally covering the inner walls of the first internal peripheral contact hole 150b and the external peripheral contact hole 150c may be referred to as a contact spacer 157.

Figure 20B:
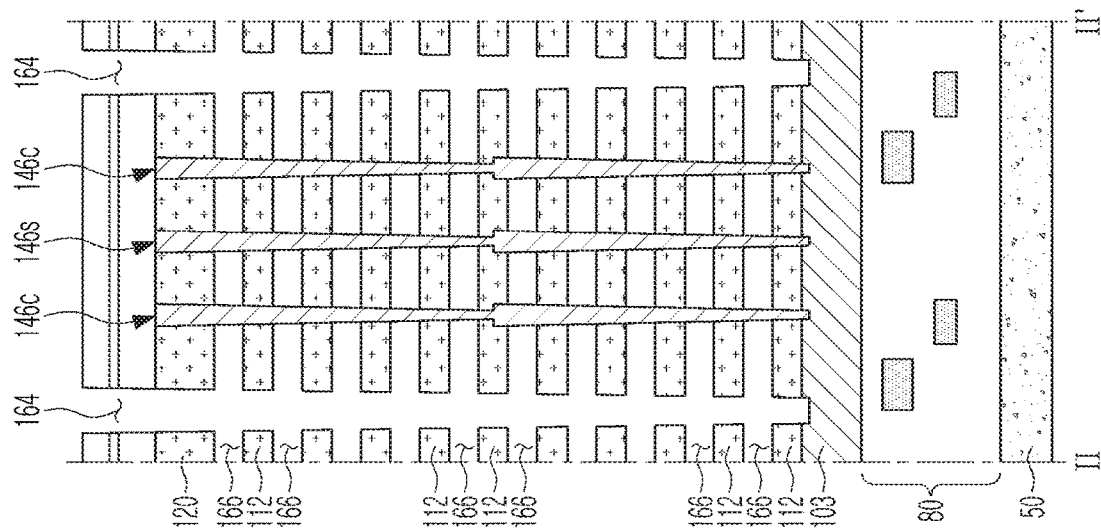

Then, the same operations as those described with reference to FIGS. 19 to 20B may be performed to form empty spaces (e.g., empty spaces 166 in FIGS. 20A and 20B) as described in FIGS. 20A and 20B. In this case, when the mold layers (e.g., mold layers 114 in FIG. 19) as described above in FIGS. 20A and 20B are removed, the mold layers 114 surrounded by the dam structure 310 may be not removed and may remain. Therefore, in the first layers (e.g., first layers 112' in FIG. 7) and the second layers (e.g., second layers 114' in FIG. 7) described in the embodiment described in FIGS. 6 and 7, the first layers (e.g., first layers 112' in FIG. 7) may be formed by surrounding interlayer insulating layers 112 by the dam structure 310, and the second layers (e.g., second layers 114' in FIG. 7) may be formed from the remaining mold layers surrounded by the dam structure 310. Subsequently, the same operations as those described with reference to FIGS. 21A to 23B may be performed to form the semiconductor device described in FIGS. 6 and 7.

According to embodiments, the degree of integration of the three-dimensional semiconductor device may be improved by disposing the peripheral circuit structure 80 between the lower substrate 50 and the upper substrate 103.

According to embodiments, the first vertical support structures 155 may prevent the interlayer insulating layers 112 from being deformed or bent by the empty spaces (e.g., empty spaces 166 in FIGS. 20A and 20B) in the second region A2, and the second vertical support structures 146s, together with the vertical channel structures 145c, may prevent the interlayer insulating layers 112 from being deformed or bent by the empty spaces (e.g., empty spaces 166 in FIGS. 20A and 20B) in the first region A1. The first and second vertical support structures 155 and 146s may prevent the interlayer insulating layers 112 from being deformed or bent by the empty spaces (e.g., empty spaces 166 in FIGS. 20A and 20B).

According to embodiments, the first vertical support structures 155 may be formed by an operation different from that of the vertical channel structures 146c, and may be formed after forming the pad regions (e.g., pad regions 114p in FIG. 16). Therefore, the operation of forming the first vertical support structures 155 may not be interrupted in forming the vertical channel structure 146c and the pad regions (e.g., pad regions 114p in FIG. 16). Therefore, the vertical channel structure 146c and the pad regions (e.g., pad regions 114p in FIG. 16) may be stably formed.

According to embodiments, since the support holes 150a for forming the first vertical support structures 155 and the first internal peripheral contact holes 150b for forming the first internal peripheral contact structures 183a are formed at the same time, the production cost may be reduced, and the productivity may be improved.

According to embodiments, since the first vertical support structures 155 may be formed of the same material in the same process as the contact spacers 157 of the first internal peripheral contact structure 183a, the productivity may be improved.

According to embodiments, since the conductive pillar 180 of the first internal peripheral contact structure 183a and the separation core pattern 181 of the separation structures 184 may be simultaneously formed of the same material, the productivity may be improved.

Due to the presence of the vertical cell vertical structures 146c, the first vertical support structures 155, and the second vertical support structures 146s described above, the gates, i.e., the gate horizontal patterns 170L, 170M1, 170M2, and 170U, may be stably increased. Therefore, the degree of integration of the three-dimensional semiconductor device may be improved.

According to the embodiments, a three-dimensional semiconductor device may increase the number of gates stacked in a vertical direction to improve the degree of integration while increasing the productivity.

While example embodiments have been illustrated and described above, it will be apparent to those skilled in the art that modifications and variations could be made without departing from the scope of the present inventive concept as defined by the appended claims.

What is claimed is:
1. A three-dimensional semiconductor device comprising:
a peripheral circuit structure disposed on a lower substrate, and including an internal peripheral pad portion;
an upper substrate disposed on the peripheral circuit structure;
a stack structure disposed on the upper substrate, and including gate horizontal patterns;
a vertical channel structure passing through the stack structure in a first region on the upper substrate;
a first vertical support structure passing through the stack structure in a second region on the upper substrate, the first vertical support structure being electrically unconnected; and
an internal peripheral contact structure passing through the stack structure and the upper substrate, and electrically connected to the internal peripheral pad portion,
wherein an upper surface of the first vertical support structure is disposed on a different vertical level from an upper surface of the vertical channel structure, and is coplanar with an upper surface of the internal peripheral contact structure.

2. The three-dimensional semiconductor device according to claim 1,
wherein the gate horizontal patterns are stacked in a vertical direction, perpendicular to an upper surface of the upper substrate while being spaced apart from each other in the first region on the upper substrate, extend lengthwise from the first region in a horizontal direction parallel to the upper surface of the upper substrate, and comprise pad regions arranged in a stepped manner in the second region on the upper substrate,
wherein the vertical channel structure passes through the gate horizontal patterns in the first region, and
wherein the first vertical support structure passes through the gate horizontal patterns in the second region.

3. The three-dimensional semiconductor device according to claim 2, wherein the internal peripheral contact structure is disposed in the second region.

4. The three-dimensional semiconductor device according to claim 2, wherein the internal peripheral contact structure is disposed in the first region.

5. The three-dimensional semiconductor device according to claim 1,
wherein the internal peripheral contact structure comprises a conductive pillar, and a contact spacer surrounding a side surface of the conductive pillar, and
wherein the contact spacer and the first vertical support structure comprise the same insulating material.

6. The three-dimensional semiconductor device according to claim 1, wherein a distance between the upper surface of the first vertical support structure and an upper surface of the upper substrate is greater than a distance between the upper surface of the vertical channel structure and the upper surface of the upper substrate.

7. The three-dimensional semiconductor device according to claim 1, further comprising:
a second vertical support structure passing through the stack structure, wherein an upper surface of the second vertical support structure is disposed on a different horizontal level from the upper surface of the first vertical support structure, wherein the second vertical support structure and the vertical channel structure have the same width as each other, and wherein a planar shape of the first vertical support structure is different from a planar shape of the second vertical support structure, when viewed in a plan view.

8. The three-dimensional semiconductor device according to claim 1, wherein the first vertical support structure comprises a first portion, and a second portion extending from a middle portion of an upper surface of the first portion in a downward direction, the second portion is formed of a different material than the first portion.

9. The three-dimensional semiconductor device according to claim 1, further comprising:
a first through region passing through the upper substrate; and
a second through region passing through the stack structure,
wherein the internal peripheral contact structure passes through the first and second through regions, and
wherein the second through region is a silicon oxide pillar.

10. The three-dimensional semiconductor device according to claim 1, further comprising:
a first through region passing through the upper substrate, and
a second through region passing through the stack structure,
wherein the internal peripheral contact structure passes through the first and second through regions,
wherein the stack structure further comprises interlayer insulating layers that are alternately stacked with the gate horizontal patterns,
wherein the second through region comprises first and second layers that are alternately stacked,
wherein each of the first layers has the same thickness as each of the interlayer insulating layers,
wherein the first layers are formed of the same material as the interlayer insulating layers, and
wherein the second layers are formed of a different material from the gate horizontal patterns.

11. The three-dimensional semiconductor device according to claim 10, further comprising:
a dam structure surrounding the second through region,
wherein an upper surface of the dam structure is coplanar with an upper surface of the first vertical support structure.

12. The three-dimensional semiconductor device according to claim 1, further comprising:
an external peripheral contact structure located on a lateral portion of the upper substrate,
wherein the external peripheral contact structure has the same cross-sectional structure as the internal peripheral contact structure, and has an upper surface coplanar with the upper surface of the internal peripheral contact structure.

13. The three-dimensional semiconductor device according to claim 1, further comprising:
a first contact plug on and contacting the upper surface of the vertical channel structure;
a second contact plug on and contacting the upper surface of the internal peripheral contact structure; and
an interlayer insulating layer on and contacting the upper surface of the first vertical support structure, wherein the interlayer insulating layer entirely covers the upper surface of the first vertical support structure and covers at least a portion of a lateral surface of each of the first and second contact plugs, and wherein the first vertical support structure includes an insulating material layer contacting the upper substrate.

14. A three-dimensional semiconductor device comprising:
a peripheral circuit structure disposed on a lower substrate, and including an internal peripheral pad portion;
an upper substrate disposed on the peripheral circuit structure;
a stack structure disposed on the upper substrate, and including gate horizontal patterns;
separation structures disposed on the upper substrate, and passing through the stack structure;
a vertical channel structure disposed on the upper substrate, and passing through the stack structure;
a vertical support structure disposed on the upper substrate, and passing through the stack structure, the vertical support structure being electrically unconnected; and
a peripheral contact structure passing through and extending downwardly from the stack structure and the upper substrate in sequence, and contacting the internal peripheral pad portion,
wherein the vertical channel structure comprises material layers different from a material layer constituting the vertical support structure, and
wherein an upper surface of the peripheral contact structure and an upper surface of the vertical support structure are located on a level higher than an upper surface of the vertical channel structure.

15. The three-dimensional semiconductor device according to claim 14, wherein a distance from the upper surface of the peripheral contact structure and the upper surface of the vertical support structure to an upper surface of the upper substrate is greater than a distance between the upper surface of the vertical channel structure and the upper surface of the upper substrate.

16. The three-dimensional semiconductor device according to claim 14,
wherein each of the separation structures comprises a separation core pattern, and a separation spacer surrounding a side surface of the separation core pattern,
wherein the peripheral contact structure comprises a conductive pillar, and a contact spacer surrounding a side surface of the conductive pillar,
wherein the separation structures have upper surfaces coplanar with the upper surface of the peripheral contact structure, and
wherein the separation core pattern and the conductive pillar are formed of the same material.

17. The three-dimensional semiconductor device according to claim 14, wherein the separation structures have upper surfaces located on a level higher than the upper surface of the peripheral contact structure.

18. The three-dimensional semiconductor device according to claim 14,
wherein the vertical support structure comprises a silicon oxide layer, and
wherein the vertical channel structure further comprises a data storage layer and a channel semiconductor layer, the channel semiconductor layer being different from the silicon oxide layer.

19. The three-dimensional semiconductor device according to claim 14, further comprising:

a first contact plug on and contacting the upper surface of the vertical channel structure;

a second contact plug on and contacting the upper surface of the peripheral contact structure; and an interlayer insulating layer on and contacting the upper surface of the vertical support structure, wherein the interlayer insulating layer entirely covers the upper surface of the vertical support structure and covers at least a portion of a lateral surface of each of the first and second contact plugs, and wherein the vertical support structure includes an insulating material layer contacting the upper substrate.

20. A three-dimensional semiconductor device comprising:

a peripheral circuit structure disposed on a lower substrate, and including an internal peripheral pad portion;

an upper substrate disposed on the peripheral circuit structure;

a stack structure disposed on the upper substrate, and including gate horizontal patterns, wherein the gate horizontal patterns are stacked in a vertical direction, perpendicular to an upper surface of the upper substrate while being spaced apart from each other in a first region on the upper substrate, extend lengthwise from the first region in a horizontal direction parallel to the upper surface of the upper substrate, and comprise pad regions arranged in a stepped manner in a second region on the upper substrate;

separation structures disposed on the upper substrate, traversing the first region and the second region, and passing through the stack structure;

a vertical channel structure disposed in the first region on the upper substrate, and passing through the stack structure, between the separation structures;

a vertical support structure disposed in the second region on the upper substrate, and passing through the stack structure, between the separation structures; and a peripheral contact structure contacting the internal peripheral pad portion, extending upwardly, and sequentially passing through the upper substrate and the stack structure;

a first contact plug on and contacting an upper surface of the vertical channel structure;

a second contact plug on and contacting an upper surface of the peripheral contact structure; and an interlayer insulating layer on and contacting an upper surface of the vertical support structure, wherein the interlayer insulating layer entirely covers the upper surface of the vertical support structure and covers at least a portion of a lateral surface of each of the first and second contact plugs, wherein the vertical support structure includes an insulating material layer contacting the upper substrate, wherein the vertical channel structure includes a lower vertical region, an upper vertical region on the lower vertical region, and a width variation region between the upper vertical region and the lower vertical region, wherein a width of an upper region of the lower vertical region is greater than a width of a lower region of the upper vertical region, and wherein upper surfaces of the separation structures, the peripheral contact structure, and the vertical support structure are located on a level higher than the upper surface of the vertical channel structure.

\* \* \* \* \*